(12) United States Patent
Miyairi

(10) Patent No.: US 8,212,254 B2
(45) Date of Patent: Jul. 3, 2012

(54) THIN FILM TRANSISTOR, MANUFACTURING METHOD THEREOF, AND SEMICONDUCTOR DEVICE

(75) Inventor: Hidekazu Miyairi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 645 days.

(21) Appl. No.: 11/896,005

(22) Filed: Aug. 29, 2007

(65) Prior Publication Data

US 2008/0210945 A1 Sep. 4, 2008

(30) Foreign Application Priority Data

Aug. 31, 2006 (JP) .................. 2006-236105

(51) Int. Cl.
*H01L 29/10* (2006.01)
*H01L 29/76* (2006.01)
*H01L 31/036* (2006.01)
*H01L 31/112* (2006.01)

(52) U.S. Cl. ............ 257/66; 438/486; 438/149; 117/92; 349/141

(58) Field of Classification Search .................. None
See application file for complete search history.

(56) References Cited

U.S. PATENT DOCUMENTS

| | | | |
|---|---|---|---|
| 5,943,593 A | 8/1999 | Noguchi et al. | |
| 6,322,625 B2 | 11/2001 | Im | |
| 6,440,824 B1 * | 8/2002 | Hayashi et al. | ............ 438/486 |
| 6,489,222 B2 | 12/2002 | Yoshimoto | |
| 6,548,370 B1 | 4/2003 | Kasahara et al. | |
| 7,022,183 B2 | 4/2006 | Takeda et al. | |
| 7,078,321 B2 | 7/2006 | Yoshimoto | |
| 7,217,605 B2 | 5/2007 | Kawasaki et al. | |
| 7,662,703 B2 | 2/2010 | Moriwaka et al. | |
| 2004/0060504 A1 * | 4/2004 | Takeda et al. | ............ 117/84 |
| 2004/0106237 A1 * | 6/2004 | Yamazaki | ............ 438/149 |
| 2004/0125305 A1 * | 7/2004 | Nishi et al. | ............ 349/141 |
| 2006/0118036 A1 | 6/2006 | Takeda et al. | |
| 2007/0070319 A1 | 3/2007 | Nakamura et al. | |
| 2007/0148936 A1 | 6/2007 | Ohnuma | |
| 2008/0171410 A1 | 7/2008 | Moriwaka et al. | |
| 2008/0213984 A1 | 9/2008 | Moriwaka | |
| 2009/0046757 A1 | 2/2009 | Miyairi et al. | |

FOREIGN PATENT DOCUMENTS

JP 2004-119919 4/2004

* cited by examiner

*Primary Examiner* — Ha Tran T Nguyen
*Assistant Examiner* — Shantanu C Pathak
(74) *Attorney, Agent, or Firm* — Eric J. Robinson; Robinson Intellectual Property Law Office, P.C.

(57) ABSTRACT

By a laser crystallization method, a crystalline semiconductor film in which grain boundaries are all in one direction is provided as well as a manufacturing method thereof. In crystallizing a semiconductor film formed over a substrate with linear laser light, a phase-shift mask in which trenches are formed in a stripe form is used. The stripe-form trenches formed in the phase-shift mask are formed so as to make a nearly perpendicular angle with a major axis direction of the linear laser light. CW laser light is used as the laser light, and a scanning direction of the laser light is nearly parallel to a direction of the stripe-form trenches (grooves). By changing luminance of the laser light periodically in the major axis direction, a crystal nucleation position in a semiconductor that is completely melted can be controlled.

15 Claims, 32 Drawing Sheets
(1 of 32 Drawing Sheet(s) Filed in Color)

FIG. 1A
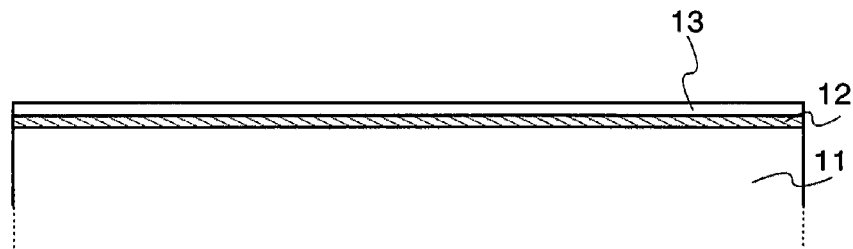
FIG. 1(B-1)
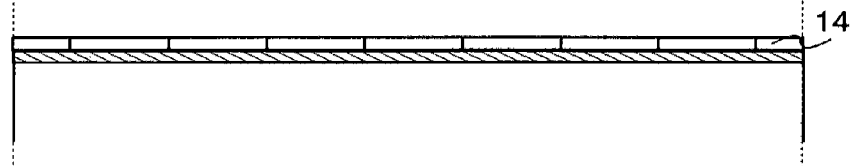
FIG. 1(B-2)
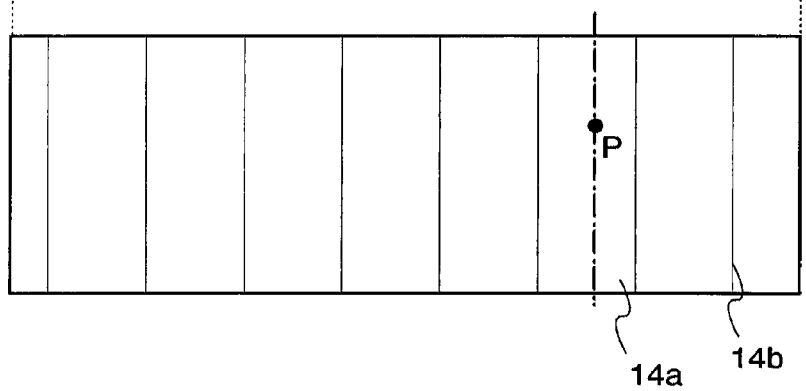

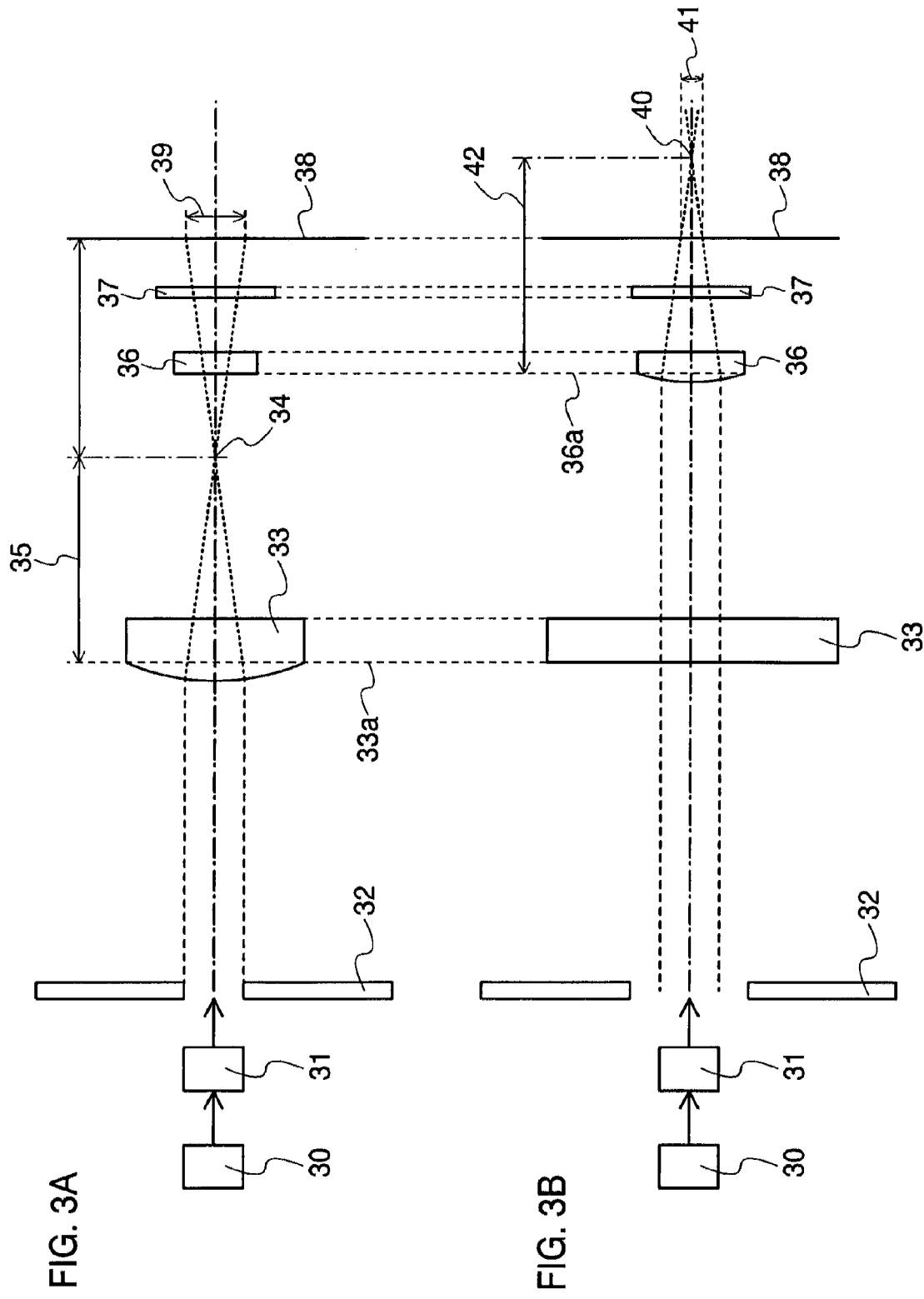

FIG. 5(A-1)
FIG. 5(A-2)
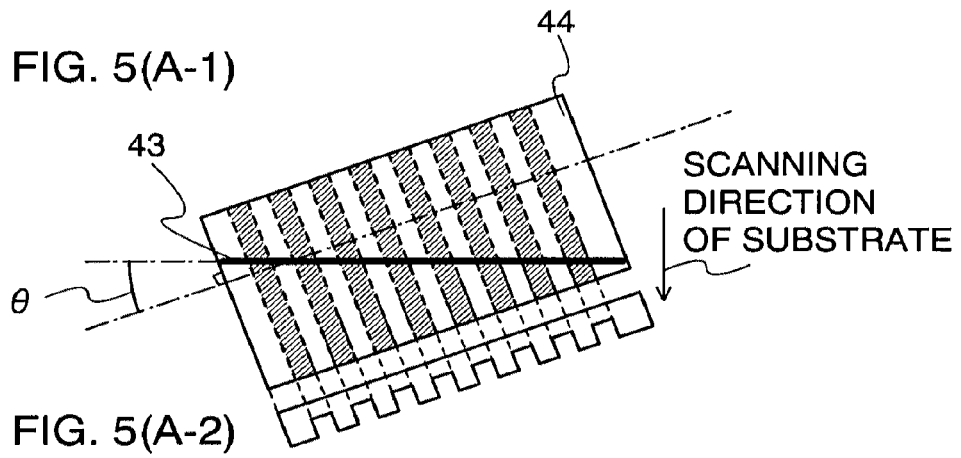
FIG. 5B
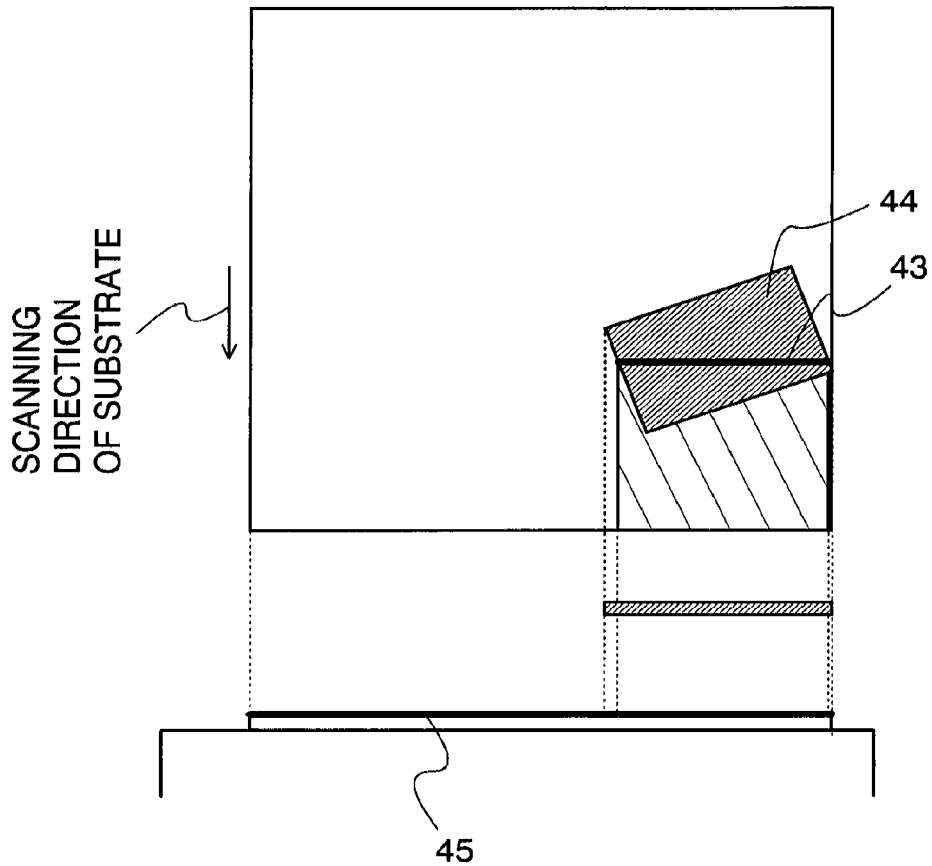

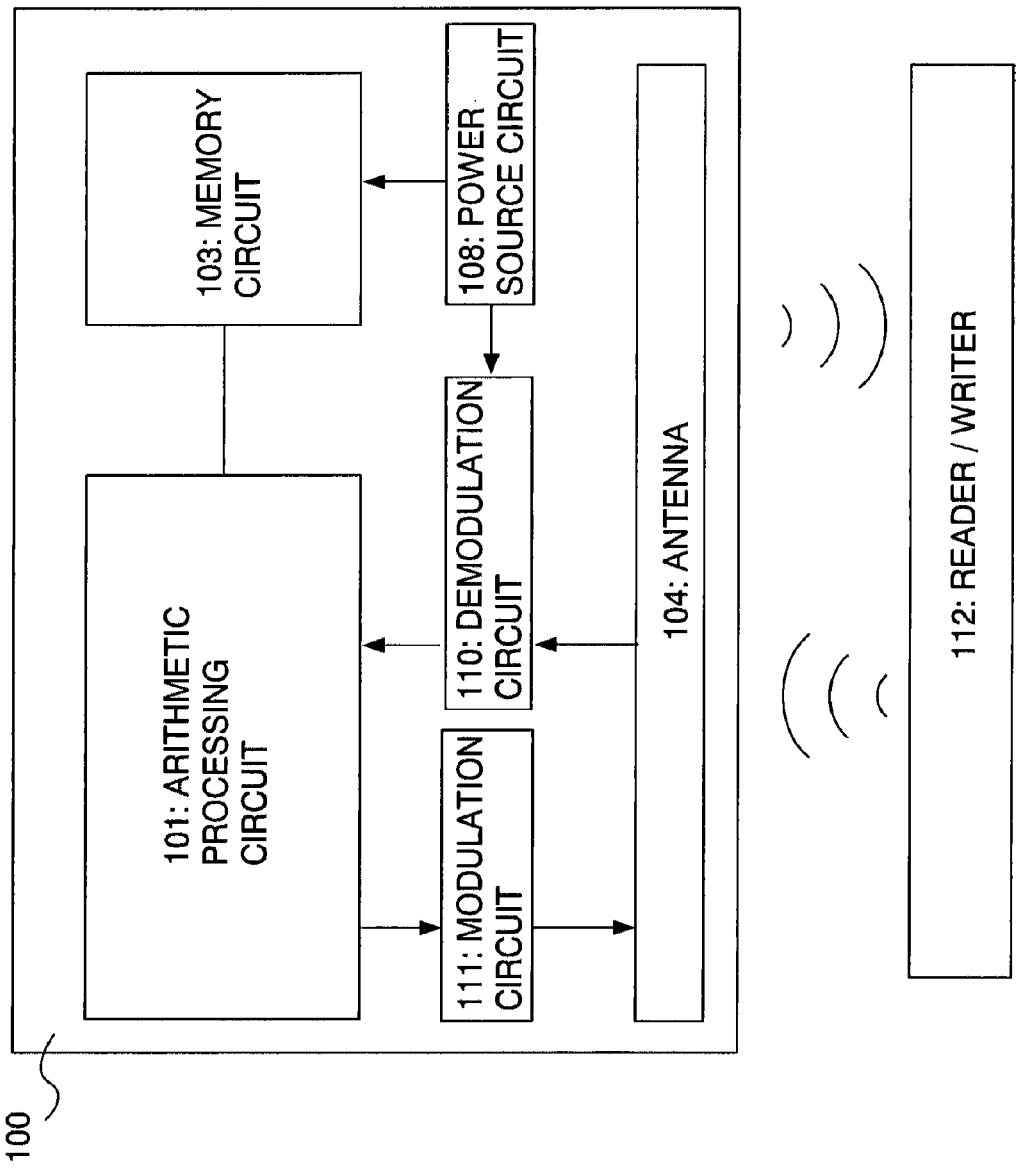

FIG. 27A 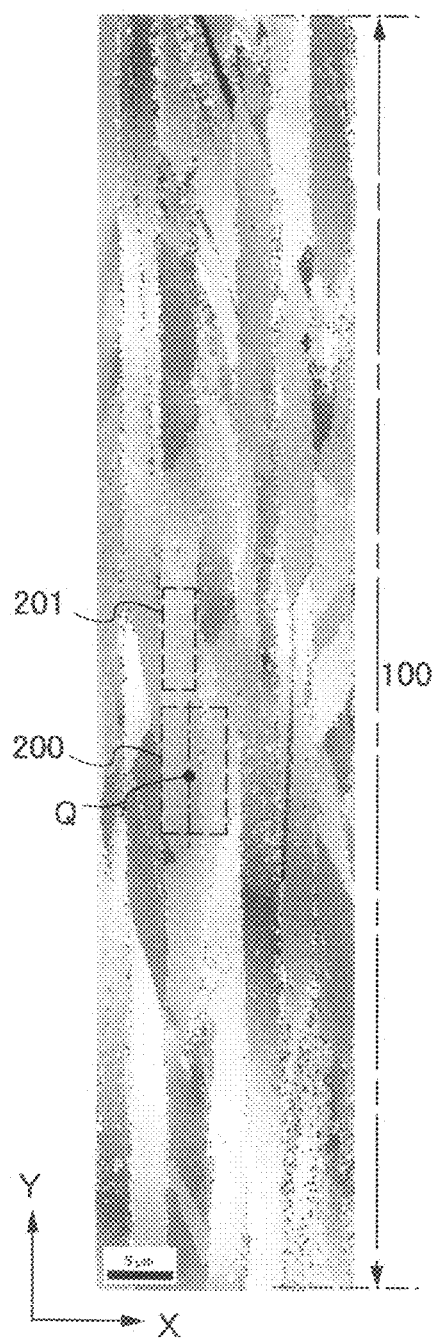 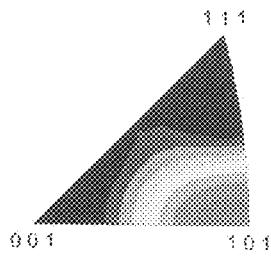
FIG. 27B 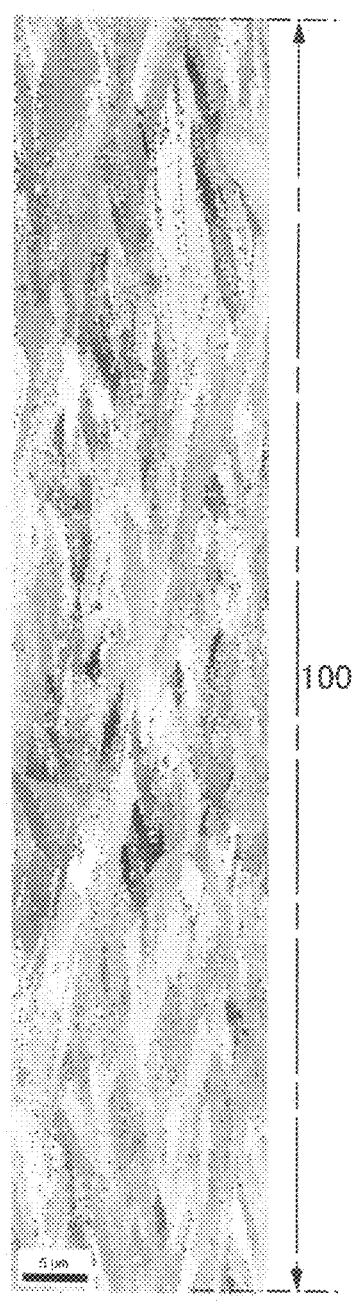 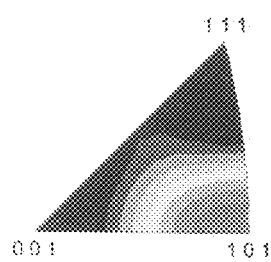

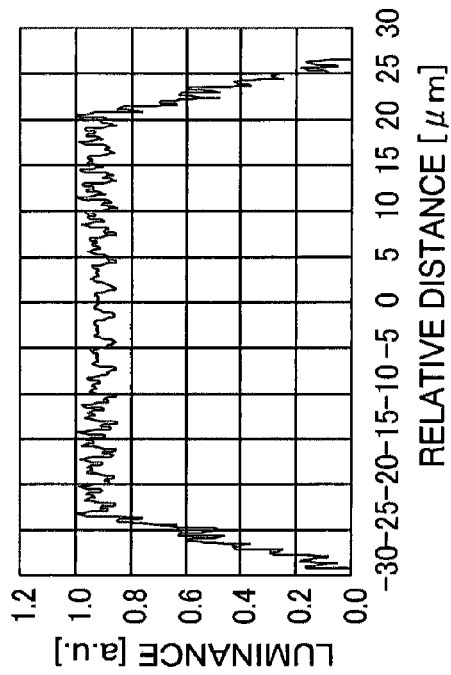
FIG. 28A (d=300 μm)
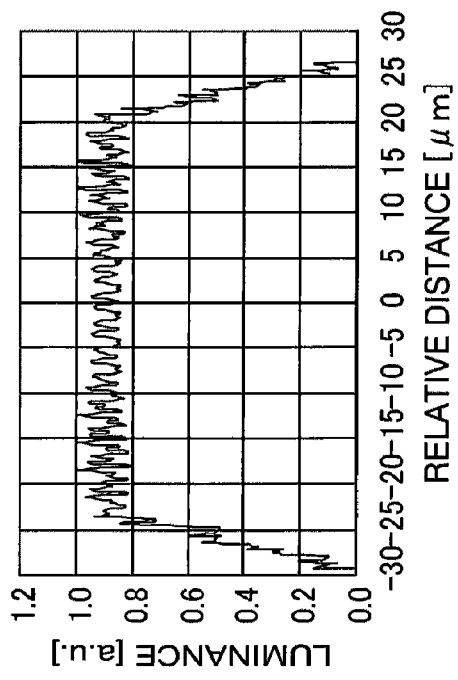
FIG. 28B (d=400 μm)
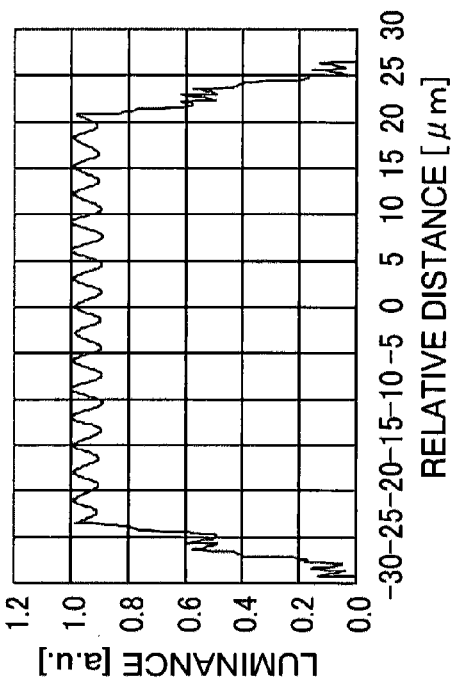
FIG. 28C (d=500 μm)
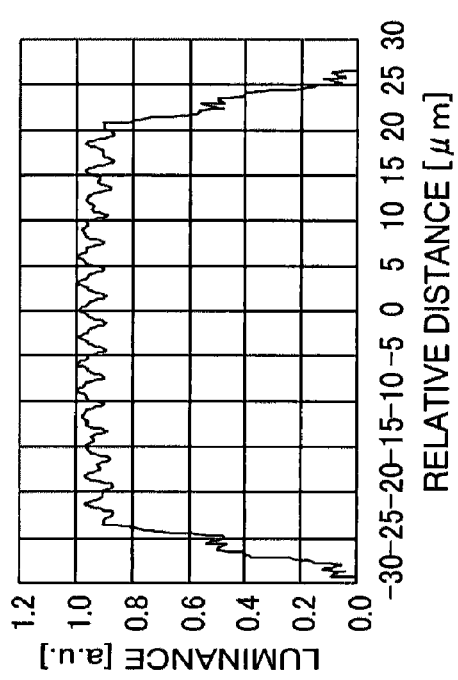
FIG. 28D (d=800 μm)

THIN FILM TRANSISTOR, MANUFACTURING METHOD THEREOF, AND SEMICONDUCTOR DEVICE

BACKGROUND OF THE INVENTION

1. Field of the Invention

The present invention relates to a semiconductor device and a manufacturing method thereof. In particular, the present invention relates to a semiconductor device including a crystalline thin film transistor and a manufacturing method thereof. Further, the present invention relates to a semiconductor device and an electronic appliance mounted with the thin film transistor.

2. Description of the Related Art

In recent years, development of techniques regarding semiconductor devices including thin film transistors (hereinafter referred to as "TFT") has been actively pursued. In particular, application to active matrix type display devices and the like using a glass substrate has been advanced.

Semiconductor films used for TFTs can be largely classified into those with crystalline (polycrystalline) structures and those with amorphous structures. TFTs using semiconductor films of the polycrystalline structure has high electron field-effect mobility and high-speed operation is possible. Accordingly, there are advantages that a TFT of a liquid crystal device can be reduced in size and that an aperture ratio is improved. Note that an aperture ratio (of a black matrix layer) is a ratio of an area of an opening portion with respect to an area of one pixel region. Also, in a polycrystalline structure, since a driver IC (integrated circuit) can be formed over the same substrate as a pixel circuit, the number of parts is reduced, which also makes possible size reduction of the an entire liquid crystal display device. Also, in addition to display devices, by forming a TFT over a glass substrate, a semiconductor device can be manufactured at a lower cost than when a silicon substrate is used.

In general, in forming a polycrystalline semiconductor film, first, an amorphous semiconductor film is formed using a semiconductor source gas such as silane, and then crystallizing the amorphous semiconductor film with heat. As the main crystallization method, a laser crystallization method, a thermal crystallization method, a thermal crystallization method using an element that promotes crystallization such as nickel (Ni), or the like is given. In the case of performing crystallization by a thermal crystallization method, an HTPS (high temperature polysilicon) process is used. Since it is possible to make a TFT element fine by using the HTPS process, a higher definition liquid crystal display device can be manufactured. However, since crystallization is performed by heating a substrate, the temperature of the substrate becomes extremely high (generally, 1000° C. or higher). On the other hand, a point of distortion of a glass substrate is about 600 to 700° C. Accordingly, glass cannot be used for a substrate in the HTPS process. In a thermal crystallization method using an element that promotes crystallization, crystallization of a semiconductor film is possible at a temperature that is about 500 to 600° C. lower than that of the above mentioned thermal crystallization method, as well: as a crystal with a continuous grain boundary can be obtained. However, compared to the other two crystallization methods mentioned above, a process is complex. Therefore, means of applying a necessary amount of heat for crystallizing an amorphous semiconductor film without damaging the glass substrate has been in need.

Taking into consideration the above circumstances, a laser crystallization method is used for crystallization of a semiconductor film over a glass substrate. In a laser crystallization method, since heating is performed locally by a laser for crystallizing the semiconductor film, a temperature of a process is relatively a low temperature (in general, 600° C. or lower). Therefore, a glass substrate can be used, and the process is not complex. By using the laser crystallization method, it has become possible to apply the necessary amount of heat for crystallizing the semiconductor film by laser light irradiation without damaging the glass substrate.

Here, the laser crystallization method is a method of crystallization in which an amount of heat is applied to an amorphous semiconductor film that is higher than or equal to a melting point of the amorphous semiconductor film by a laser, and heating a surface locally for a very short amount of time.

A polycrystalline semiconductor film formed by the laser crystallization method has inferior mobility compared to a monocrystalline semiconductor. This is considered to be due to crystal grain boundaries that are caused along with crystallization. Consequently, for a purpose of reducing crystal grain boundaries that exist in the semiconductor film to obtain crystallinity that is close to a monocrystal, development of techniques for controlling positions of the grain boundaries and enlargement of the crystal itself by controlling a location of nucleation in crystallization has been attempted. As one of such techniques, there is a method of forming a polycrystalline semiconductor film in which a semiconductor material is crystallized by SLG (Super Lateral Growth), by using a phase-shift mask with a stripe pattern and periodically modulating intensity of a linear pulsed laser light that is emitted to a surface of a sample (for example, Patent Document 1: Japanese Published Patent Application No. 2004-119919).

Note that the phase-shift mask is a mask of a quartz substrate with trenches, which is used in a phase-shift method. A phase-shift method is a method of improving resolution by shifting a phase of an adjacent pattern by 180°.

SUMMARY OF THE INVENTION

Lasers are largely classified into two types, pulsed oscillation or continuous oscillation, according to their oscillation methods. Since a pulsed laser has relatively high output energy, productivity can be improved with a size of laser light (a region in a surface of an object to be treated that is actually irradiated with laser light) of several $cm^2$ or larger. In particular, by processing a shape of the irradiation region of the laser light by an optical system to make it linear with a length of 10 cm or longer, laser light irradiation of the substrate can be performed efficiently, and productivity can be improved even more. Consequently, pulsed lasers have been becoming the mainstream in crystallization of semiconductor films.

However, it is found that in crystallizing semiconductor films, the size of crystal grains formed inside a semiconductor film is larger when a continuous wave laser (hereinafter referred to as a "CW laser") is used instead of the pulsed laser. When the size of the crystal grains inside the semiconductor film is large, mobility of a TFT that is formed using the semiconductor film becomes high due to interfaces of the crystal grains (grain boundaries). Consequently, the continuous oscillation laser is receiving a lot of attention.

Also, in crystal growth by SLG, crystal growth occurs in a direction that is nearly perpendicular to a scanning direction of the linear laser, and an appearance cycle of the grain boundaries in a polycrystalline semiconductor film that is formed is short. Therefore, it does not lead to a dramatic improvement in electron field-effect mobility of semiconductor films.

An object of the present invention is to provide a semiconductor device with high carrier mobility and a favorable electrical characteristic, and a manufacturing method thereof.

A semiconductor device of the present invention includes a polycrystalline semiconductor film that has a crystal band in which crystal grains extend in one direction, and has a low occurrence frequency of grain boundaries in the direction that the crystal grains extend or has no existence of grain boundaries in the direction that the crystal grains extend. To form the crystal band in which crystal grains extend in one direction, crystallization is performed using linear laser light. By emitting the laser light through an optical intensity modulator that periodically modulates light intensity of the linear laser light in a major axis direction of the laser light, an amorphous semiconductor film is completely melted from one end to another end of a semiconductor film to be crystallized, so as to be in a melted state therebetween, and a crystal band in which crystal grains grow in a scanning direction of the laser light can be formed. Alternatively, the laser light may be given a periodic profile through the optical intensity modulator that periodically modulates light intensity of the laser light to mold the laser light into a linear form, and then emitted. Further alternatively, the periodic profile may be given to the laser light at the same time as molding the laser light into a linear form.

In the present invention, by completely melting a semiconductor film, which is crystallized through a phase-shift mask with a stripe pattern, from one end to another end so as to be in a melted state therebetween, a polycrystalline semiconductor film is formed in which growth directions of crystals are basically all in one direction, ideally, in which grain boundaries exist only in one direction.

One feature of the present invention is a thin film transistor including a crystalline semiconductor film, of which the crystalline semiconductor film includes one or a plurality of crystal bands in which crystal grains extend in one direction, and at least one of the crystal bands has a source region, a channel region, and a drain region inside the crystal band.

Another feature of the present invention is a thin film transistor including a crystalline semiconductor film, of which the crystalline semiconductor film includes a plurality of crystal bands in which crystal grains extend in one direction, each of the plurality of crystal bands has a boundary line with an adjacent crystal band, and the boundary line is basically parallel to a channel length direction, from a source region to a drain region of the thin film transistor.

Another feature of the present invention is a thin film transistor including a crystalline semiconductor film formed over a substrate having an insulating surface, of which the crystalline semiconductor film has a plurality of crystal bands in which crystal grains extend in one direction, and each of the plurality of crystal bands has a boundary line with an adjacent crystal band and the boundary line is basically parallel to a channel length direction of the thin film transistor, from one side of the crystalline semiconductor film to another side facing the one side.

Yet another feature of the present invention is a thin film transistor including a crystalline semiconductor film formed over a substrate having an insulating surface, of which the crystalline semiconductor film includes a plurality of crystal bands in which crystal grains extend in one direction, and an average appearance interval of grain boundaries in the crystal bands is larger than an interval of the crystal band in a minor axis direction.

In the present invention of the foregoing structure, it is preferable that the major axis direction of the crystal bands basically matches the channel length direction.

In the present invention of the foregoing structure, it is preferable that length of the crystal bands in the minor axis direction are basically constant.

In the present invention of the foregoing structure, it is preferable that the length of the crystal bands in the minor axis direction is less than or equal to about 3 μm, and the length of the crystal bands in the major axis direction is more than or equal to about 3 μm and less than or equal to about 20 μm.

Another feature of the present invention is a thin film transistor including a crystalline semiconductor film formed over a substrate having an insulating surface, of which the crystalline semiconductor film includes a crystal band in which crystal grains extend in one direction, the crystal band has one side that is less than or equal to about 3 μm, and another side next to it that is more than or equal to about 3 μm and less than or equal to about 20 μm. A channel forming region of the crystalline semiconductor film is formed inside the crystal band and in the channel forming region of the crystalline semiconductor film, there is no existence of a grain boundary that crosses the channel length direction.

In the present invention of the foregoing structure, it is preferable that there is a base film between the substrate and the crystalline semiconductor film.

In the present invention of the foregoing structure, it is preferable that the crystalline semiconductor film is a film mainly containing silicon.

In the present invention of the foregoing structure, it is preferable that the substrate is a glass substrate.

Another feature of the present invention is a manufacturing method of a thin film transistor in which an amorphous semiconductor film formed over a substrate having an insulating surface is crystallized by irradiating CW laser light or pseudo CW laser light. In the manufacturing method, a polycrystalline semiconductor film having a crystal band that grows in a direction that basically matches a scanning direction of laser light is formed by forming an amorphous semiconductor film, spatially modulating light intensity of a linear shape laser light with an optical intensity modulator that periodically modulates in a major axis direction of the laser light, and irradiating the amorphous semiconductor film with the laser light to completely melt the amorphous semiconductor film in an entire irradiation region of the laser light.

Still another feature of the present invention is a manufacturing method of a thin film transistor in which an amorphous semiconductor film formed over a substrate having an insulating surface is crystallized by irradiating CW laser light or pseudo CW laser. In the manufacturing method, a thin film transistor is formed by forming an amorphous semiconductor film; spatially modulating light intensity of a laser light molded into a linear shape with an optical intensity modulator that periodically modulates in a major axis direction of the laser light, and irradiating the amorphous semiconductor film with the laser light to completely melt the amorphous semiconductor film in an entire irradiation region of the laser light in order to form a polycrystalline semiconductor film having a crystal band that grows in a direction that basically matches a scanning direction of laser light; and introducing an impurity to a portion of the polycrystalline semiconductor film to form a source region and a drain region. At least one of the crystal bands included in the polycrystalline semiconductor film has a source region, a channel forming region, and a drain region inside the crystal band, and a channel length direction of the channel forming region is basically parallel to a major axis direction of the crystal band, and a line that extends from the source region to the drain region can be drawn without crossing a boundary line of the crystal band.

In the present invention of the foregoing structure, it is preferable that the optical intensity modulator is a phase-shift mask with trenches in a direction that nearly matches the major axis direction of the laser light.

In the present invention of the foregoing structure, it is preferable that: the optical intensity modulator is a phase-shift mask with trenches in a direction that tilts off a direction parallel to a scanning direction of the laser light by a certain angle; a value of the light intensity of the modulated laser light has a maximum value and a minimum value in the major axis direction; and the angle is adjusted so that the minimum value is more than or equal to 80% of the maximum value.

In the present invention of the foregoing structure, it is preferable that the phase-shift mask is a light-transmitting substrate having a stripe pattern in which grooves are formed with a certain interval.

In the present invention of the foregoing structure, it is preferable that the light-transmitting substrate is a quartz substrate.

In the present invention of the foregoing structure, it is preferable that the interval between the grooves has the same width as the grooves.

In the present invention of the foregoing structure, it is preferable that the semiconductor film is made of silicon.

In the present invention of the foregoing structure, it is preferable that the crystallization is performed using an element that promotes the crystallization.

Another feature of the present invention is a semiconductor device having a thin film transistor manufactured according to the present invention of the foregoing structure.

As a semiconductor device according to the present invention of the foregoing structure, a liquid crystal display device or an EL display device can be used. It is particularly preferable that the present invention is applied to a peripheral circuit (such as a driver circuit) thereof.

Note that in the present invention, a crystal band refers to crystal grains that extend in a ribbon form. It is ideal if there is no crystal grain boundary in a major axis direction of the crystal grains.

Note that in the present invention, crystallization of a semiconductor film to be crystallized so that the semiconductor film is in a melted state between one end and another end means that the crystallization of a semiconductor film of the present invention is not SLG. With SLG, since a melted semiconductor film immediately solidifies (a melted period is short), the semiconductor film repeats melting and solidification. In the present invention, for example, when a pulsed laser (includes a pseudo CW laser) is used, crystallization is performed so that a melted state is maintained from when laser light of a pulse is emitted and a semiconductor film is melted to when laser light of the next pulse is emitted to the semiconductor film.

Note that in the present invention, a semiconductor device corresponds to a device including a circuit that contains a semiconductor element (such as a transistor or diode). Also, a semiconductor device may refer to devices in general that can function by utilizing a semiconductor characteristic.

A transistor is an element that includes at least three terminals, including a gate, a drain, and a source. The transistor includes a channel-forming region between a drain region and a source region, and current can be fed through the drain region, the channel-forming region, and the source region. Here, since the source and the drain switch depending on a structure, operating condition, or the like of the transistor, it is difficult to determine which terminal is the source or the drain. Accordingly, in the present invention, each of regions that serves as the source and the drain are not called a source or drain in some cases. In such cases, as one example, they may be called a first terminal and a second terminal. Note that a transistor may be an element including at least three terminals, including a base, an emitter, and a collector. In a similar manner, in this case also, the emitter and the collector are called the first terminal and the second terminal in some cases.

Further, a display device corresponds to a device including a display element (liquid crystal element, EL element, or the like). Note that in a display device in which a peripheral driver circuits are formed over the same substrate, it is preferable to apply the present invention to the peripheral driver circuits.

A light-emitting device corresponds to a display device including a self-light-emitting display element such as an EL element or an element used for an FED in particular. A liquid crystal display device corresponds to a display device including a liquid crystal element.

Note that in this specification, "basically" has the same meaning as "substantially." For example, "basically parallel" allows a displacement of about ±45° (preferably ±30°) from a parallel. Also, a direction "basically matching" allows the direction to be displaced from a certain direction in a range that is reasonable to say that the direction is substantially the same as the certain direction, and includes a displacement of the direction by a range of ±45° (preferably a range of ±30°) from the certain direction. Also, an interval that is "basically constant" means that when an average interval is a, then the interval is more than or equal to a/2 and less than or equal to 3a/2. Also, "about 3 μm" means more than or equal to 2.5 μm and less than or equal to 3.5 μm, and "about 20 μm" means more than or equal to 15 μm and less than or equal to 25 μm.

By the present invention, a crystalline semiconductor film in which a position and direction of grain boundaries are controlled can be obtained.

By the present invention, a direction of crystal growth can be controlled. Therefore, crystal grain boundaries can be reduced. Accordingly, mobility of a polycrystalline semiconductor layer can be spectacularly improved.

By the present invention, because mobility of carriers in a semiconductor layer of a TFT is improved, a TFT having a favorable electrical characteristic can be manufactured.

Since a TFT having a favorable electrical characteristic can be manufactured by the present invention, a circuit element with higher performance than before can be formed. Accordingly, a semiconductor device with more added value than before can be manufactured over a glass substrate.

BRIEF DESCRIPTION OF DRAWINGS

The patent or application file contains at least one drawing executed in color. Copies of this patent or patent application publication with color drawing(s) will be provided by the Office upon request and payment of the necessary fee.

In the accompanying drawings:

FIGS. 1A to 1(B-2) describe a manufacturing method of a semiconductor device of the present invention;

FIGS. 3A and 3B describe an optical system which is able to be applied in manufacturing a semiconductor device of the present invention;

FIGS. 5(A-1) to 5B each describe a manufacturing method of a semiconductor device of the present invention;

FIG. 17 describes a circuit of a semiconductor device to which the present invention is applied;

FIGS. 27A and 27B are each an analysis result of a semiconductor film formed by applying the present invention;

FIGS. 28A to 28D each describe a beam profile which shows changes in the luminance of the laser light;

DETAILED DESCRIPTION OF THE INVENTION

Embodiment Mode

Figure 2A:
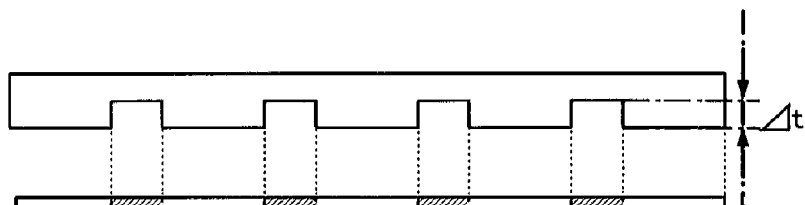
FIGS. 2A and 2B describe a phase-shift mask which is used for manufacturing a semiconductor device of the present invention.

Although the present invention is fully described by way of embodiment modes and embodiments with reference to the accompanying drawings, it is to be understood that various changes and modifications will be apparent to those skilled in the art. Therefore, unless such changes and modifications depart from the spirit and the scope of the present invention, they should be construed as being included therein.

Embodiment Mode 1

In this embodiment mode, a forming process of a semiconductor layer included in a semiconductor device to which the present invention is applied is described with reference to FIGS. 1 to 6. FIG. 1 shows a process up to forming a polycrystalline semiconductor film over a substrate, which is described in this embodiment mode.

For a substrate, a glass substrate 11 is used as an insulating substrate. A material of the glass substrate 11 is not particularly limited, and quartz glass, alkali-free glass such as borosilicate glass, or alumino silicate glass may be used, provided that it has heat resistance, chemical resistance, and the like necessary in a step of forming a thin film thereafter. Note that not only a glass substrate is used, and a material of the substrate is not particularly limited provided that a substrate surface has an insulating property and has the necessary heat resistance. That is, a plastic substrate having enough heat resistance that can withstand a temperature of a step of forming a thin film, a stainless steel substrate provided with an insulating film, or the like can also be used.

Also, borosilicate glass or the like contains a small amount of an impurity such as sodium (Na), potassium (K), or the like, unlike quartz glass. When such an impurity is diffused into a periphery of an active layer, a parasitic channel-forming region is formed at an interface of the active layer and a base film, or at an interface of the active layer and a gate insulating film. This causes an increase in leak currents generated during operation of a TFT. Also, the diffused impurity affects a threshold voltage of a TFT.

Accordingly, when a TFT is manufactured over the glass substrate 11, it is preferable to have a structure in which an insulating film called a base film is interposed between the glass substrate and the TFT. A function of preventing diffusion of the impurity from the glass substrate and a function of improving adhesion of a thin film deposited over this insulating film are demanded of this base film. A material used for the base film is not particularly limited, and a silicon oxide based material or a silicon nitride based material may be used. Note that the silicon oxide based material corresponds to silicon oxide mainly containing oxygen and silicon, or silicon oxynitride which is silicon oxide containing nitrogen in which an amount of oxygen contained is more than that of nitrogen. The silicon nitride based material corresponds to silicon nitride mainly containing nitrogen and silicon, or silicon nitride oxide, which is silicon nitride containing oxygen in which an amount of nitrogen contained is more than that of oxygen. Also, the base film may have a structure in which films made of such materials are stacked. When the base film is formed by stacking, it is preferable that a material that serves as a blocking layer and prevents diffusion of an impurity mainly from the glass substrate is used in a lower layer portion that adheres to the glass substrate 11, and a material that mainly improves adhesion between the base layer and a thin film deposited thereover is used for an upper layer portion. Note that when a crystalline semiconductor film is formed in contact with a silicon nitride based material, a trap level is generated at an interface thereof; therefore, it is preferable that a silicon oxide based material is used for the insulating film that is in contact with the crystalline semiconductor film.

Taking into consideration the foregoing, in this embodiment mode, a base film 12 is formed over the glass substrate 11. Here, silicon oxynitride is stacked and formed over silicon nitride oxide as the base film 12. When an inexpensive Corning glass or the like is used for the substrate and a semiconductor film serving as a thin film transistor is formed thereover adhering to the substrate, a movable ion of sodium or the like from the substrate enters the semiconductor film. Therefore, the silicon nitride film is formed as a blocking layer. The base film 12 can be formed by a CVD method, a plasma CVD method, a sputtering method, a spin coating method, or the like. The base film is not formed when it is not particularly necessary.

Next, an amorphous semiconductor film 13 is formed (see FIG. 1A). Here, the amorphous semiconductor film 13 is formed of silicon. The amorphous semiconductor film 13 is formed by an LPCVD (Low Pressure CVD) method, a plasma CVD method, a vapor phase growth method, or a sputtering method using a semiconductor source gas such as silane ($SiH_4$).

Then, before the amorphous semiconductor film 13 is crystallized, a dehydrogenation step is performed as necessary. For example, when formation of the amorphous semiconductor film 13 is performed by a regular CVD method using silane ($SiH_4$), hydrogen remains in the film. When the amorphous semiconductor film is irradiated with laser light in such a state where hydrogen remains in the film, a portion of the film is lost by laser light with an energy value that is about half of that which is most suited for crystallization. Accordingly, by heating for example in a $N_2$ atmosphere, hydrogen remaining in the film can be removed. When the amorphous semiconductor film 13 is formed by an LPCVD method or a sputtering method, the dehydrogenation step is not always necessary.

Also, channel doping may be performed as necessary. Channel doping is a process of adding an impurity of a predetermined concentration to a semiconductor layer to intentionally shift a threshold voltage of a TFT, and control the threshold of the TFT to a desired value. For example, when the threshold voltage is shifted to a negative side, a p-type impurity element is added as a dopant, and when the threshold voltage is shifted to a positive side, an n-type impurity is added as the dopant. Here, phosphorus (P) or arsenic (As) is given as the p-type impurity element, and boron (B), aluminum (Al), or the like is given as the n-type impurity element.

Note that, here, an oxide film formed on a surface of the amorphous semiconductor film 13 is removed as necessary. By removing the oxide film formed over/on the surface, an impurity that exists in the oxide film or on the oxide film entering and diffusing into the semiconductor film by crystallization can be prevented.

Then, crystallization of the amorphous semiconductor film 13 is performed. In the present invention, laser light is used for the crystallization of the amorphous semiconductor film 13. By laser light irradiation, an amount of heat necessary for crystallization is supplied to the amorphous semiconductor film. By using laser light, local heating of the amorphous semiconductor film is possible, and the amorphous semiconductor film can be crystallized so that a temperature of the substrate becomes at or lower than a point of distortion of glass.

A laser includes a laser medium, an excitation source, and a resonator. Lasers are classified into a gas laser, a liquid laser, and a solid laser according to the medium, and are classified into a free electron laser, a semiconductor laser, and an X-ray laser according to the type of oscillation. Any type of laser may be used in the present invention. Note that a gas laser or a solid laser is preferably used and a solid laser is more preferably used.

The gas laser includes a helium-neon laser, a carbon dioxide gas laser, an excimer laser, and an argon ion laser. The excimer laser includes a rare gas excimer laser and a rare gas halide excimer laser. The rare gas excimer laser oscillates by three kinds of excited molecules: argon krypton, and xenon. The argon ion laser includes a rare gas ion laser and a metal vapor ion laser.

The liquid laser includes an inorganic liquid laser, an organic chelate laser, and a dye laser. The inorganic liquid laser and the organic chelate laser use rare earth ions such as neodymium, which are utilized for a solid laser as a laser medium.

A laser medium used in the solid laser is a solid base doped with active species which can cause laser action. The solid base is a crystal or glass. The crystal is YAG (yttrium aluminum garnet crystal), YLF, $YVO_4$, $YAlO_3$, sapphire, ruby, or alexandrite. In addition, the active species which can cause laser action are, for example, trivalent ions such as $Cr^{3+}$, $Nd^{3+}$, $Yb^{3+}$, $Tm^{3+}$, $Ho^{3+}$, $Er^{3+}$, and $Ti^{3+}$.

As a laser used in the present invention, a fiber laser can also be used. Here, a fiber laser that can be used in the present invention is described in detail with reference to FIG. 30.

Figure 30:
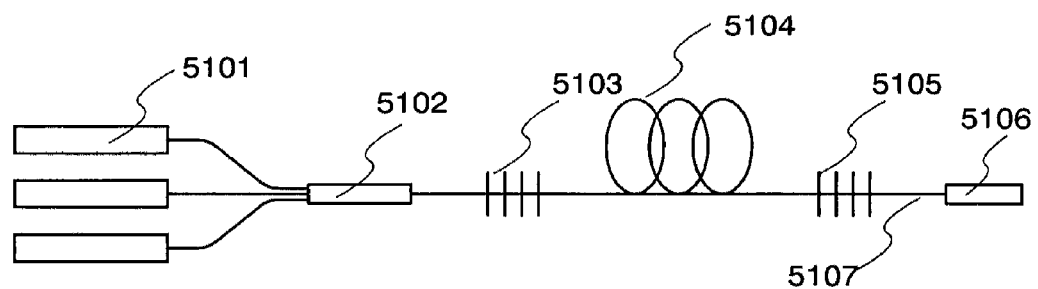
FIG. 30 describes a fiber laser which is used for manufacturing a semiconductor device of the present invention.

A fiber laser uses a light guide (fiber optics) as an oscillator. One structure of an oscillator of a fiber laser is shown in FIG. 30. The fiber laser includes laser diodes 5101 for excitation (LD), an excited light combiner 5102, a fiber Bragg grating 5103, a fiber Bragg grating 5105, an active gain fiber 5104 which is a light fiber of which a core is doped with a laser medium, and an output port 5106. Also, such appliances are connected to each other through a fiber cable 5107. Note that the fiber laser is capable of both continuous oscillation and pulsed oscillation. In the present invention, continuous oscillation or pseudo continuous oscillation is used.

The excited light combiner 5102 combines excited light that is output from a plurality of laser diodes 5101, and this combined light is input to the fiber Bragg grating 5103. Note that the structure of the oscillator shown in FIG. 30 includes the excited light combiner 5102, and the excited light combiner 5102 does not have to be included. That is, it may be a structure in which a single laser diode 5101 and the fiber Bragg grating 5103 are directly connected through the fiber cable 5107, and excited light output from the single laser diode 5101 is directly input to the fiber Bragg grating 5103.

The fiber Bragg grating 5103 serves as a total reflection mirror of a laser oscillator and the fiber Bragg grating 5105 serves as an output mirror. Unlike a resonator mirror of a solid laser like a YAG laser, the fiber Bragg grating 5103 and the fiber Bragg grating 5105 do not need to have regular cleaning or alignment adjustment. Accordingly, compared to when a solid laser is used, they are strong against heat change and mechanical shock, and are easy to maintain and highly mobile. Laser light output from the fiber Bragg grating 5105 is output (emitted) to the outside of the fiber optics through the output port 5106. Here, a beam spot of laser light output from the fiber Bragg grating 5105 has a circular shape, and a diameter thereof is several tens of μm (typically, 10 to 30 μm). Note that the beam spot of the laser beam is not limited to being circular, and may be elliptical or rectangular.

Figure 31:
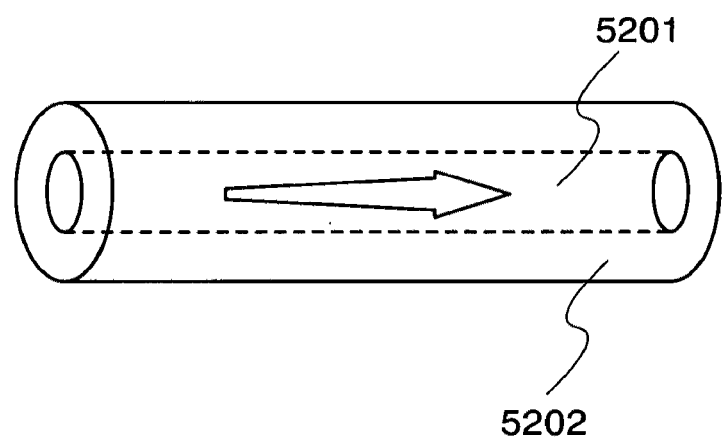
FIG. 31 describes an active gain fiber which is used for manufacturing a semiconductor device of the present invention.

The active gain fiber 5104 includes a core 5201 that is cylindrical doped with a rare-earth element such as erbium (Er) or ytterbium (Yb), and a clad 5202 that has a pipe shape (FIG. 31). A diameter of the core 5201 is several tens of μm (typically, 10 to 30 μm). When excited light is input from the fiber Bragg grating 5103, laser is oscillated in the active gain fiber 5104. Here, the active gain fiber 5104 has a role similar to that of a light transducer, which converts wavelength, beam quality, or the like of light input from the laser diode 5101.

The clad 5202 may have a single layer structure or a two layer structure. In a case of a two layer structure, for example, the two layer structure may be of an inner clad made of silica and an outer clad made of a polymer. Also, a cross-sectional form of the clad 5202 may be any of circular, rectangular, or polygonal.

The fiber cable 5107 has a two layer structure including a cylindrical core with a high refractive index, and a pipe-shaped clad with a low refractive index that covers an outer circumference of the core. The clad has a role of keeping light that is put into the fiber optics. An external diameter of the clad is 100 to 150 μm. The refractive index of the core is higher than the refractive index of the clad that is covering the core; accordingly, light that is input to the fiber optics is transmitted to the outside by being carried through a core portion.

Patterns (modes) in which light signals are carried thorough the inside of the fiber optics differ depending on usage, and there are largely classified into three types: a multimode step type, a multimode graded type, and a single mode type. Any mode can be used in the present invention; however, the single mode type may preferably be used.

Also, it is preferable that a nonlinear optical element is provided between the fiber Bragg grating 5105 and the output port 5106. By providing the nonlinear optical element, laser light of a fundamental harmonic that is output from the laser diode 5101 can be converted to a higher harmonic (such as a second harmonic or a third harmonic).

By using laser light emitted from a fiber laser in the present invention, productivity improvement and cost reduction in a semiconductor device can be realized compared to when crystallization is performed with a solid laser.

Also, it is acceptable as long as laser light used in the present invention is laser light that is oscillated from a CW laser of a wavelength that is absorbed in the amorphous semiconductor film 13. Also, laser light that is oscillated from a pseudo CW laser may be used. In this embodiment mode, silicon is used for the amorphous semiconductor film 13. Accordingly, wavelength of laser light that is used is to be shorter than or equal to 800 nm which is absorbed in silicon, preferably about 200 to 500 nm, and more preferably, about 350 to 550 nm.

Here, the pseudo CW laser refers to a pulsed laser, and a laser that can be handled substantially in the same manner as a CW laser since it has a high oscillation frequency. It is assumed that in the present invention, an irradiation surface is completely melted from one end to another end of a semiconductor film to be crystallized, so as to be in a melted state therebetween. Therefore, a pulsed laser is used that can continuously move a solid-liquid interface of the irradiation surface along with scanning of the laser, by oscillating a subsequent pulsed laser to melt the irradiation surface before the irradiation surface that is melted by oscillation of a pulsed laser is solidified and crystallized.

Figure 2B:
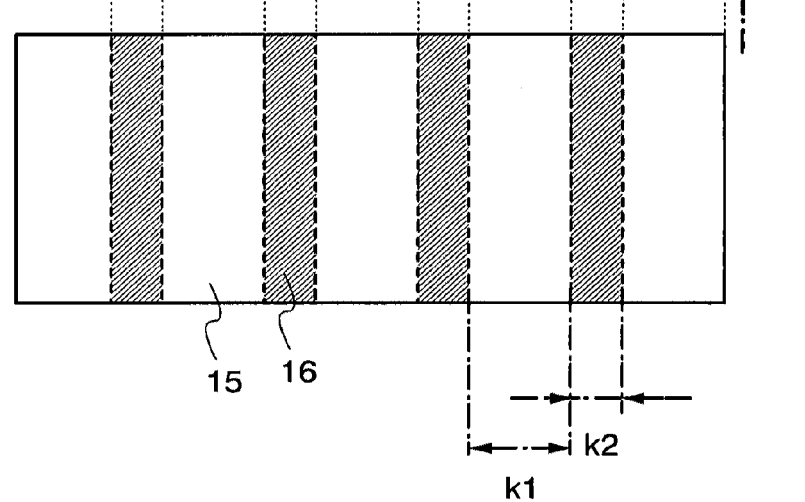

Further, in the present invention, means by which light intensity of laser light is periodically modulated spatially in a major axis direction of the laser light is included. As such means, a phase-shift mask is used. That is, laser light irradiation is performed through a phase-shift mask with a stripe pattern. FIGS. 2A and 2B are schematic views of a phase-shift mask used in the present invention. FIG. 2A is a side surface view of the phase-shift mask and FIG. 2B is a top view of the phase-shift mask. The phase-shift mask used in the present invention is provided with a periodic stripe pattern, including convex portions 15 and concave portions 16. Such a phase-shift mask is manufactured by treating with laser light a light-transmitting substrate with high degree of smoothness.

As the light-transmitting substrate, a quartz substrate is used, for example. When laser light passes through the phase-shift mask in which trenches are formed in this manner, a phase of the laser light that passes through the convex portion is not inverted, and a phase of only the laser light that passes through the concave portion is inverted by 180°. Consequently, laser light with intensity distribution that reflects an interval between the concave portion and the convex portion of the phase-shift mask can be obtained.

A step Δt is provided between a surface of the concave portion and the convex portion. Δt is calculated by the mathematical formula below, from a wavelength λ of a laser light that is used; a refractive index n1 of light in quartz that is a material of the phase-shift mask; and a refractive index n0 of light in the air.

$$\Delta t = \frac{\lambda}{2(n_1 - n_0)}$$

Here, if refractive index n1=1.486, refractive index n0=1.000, and wavelength λ=532 nm, the step Δt=547 nm. Accordingly, a quartz substrate is treated so that Δt=547 nm.

FIGS. 3A and 3B each show a schematic view of a positional relationship of an optical system apparatus for laser light irradiation. Laser light that is oscillated from a laser oscillator 30 is first adjusted in an attenuator 31. The attenuator 31 adjusts light intensity of laser light that is oscillated. Laser light that passes through the attenuator 31 is emitted from a slit 32 and passes through a cylindrical lens 33. Laser light that passes through the cylindrical lens 33 and a cylindrical lens 36 is focused in a rear side focal point in each of a major axis direction and a minor axis direction, and formed into a shape of a beam to be emitted. In the present invention, a linear beam is formed. Hereinafter, the major axis direction (FIG. 3A) and the short axis direction (FIG. 3B) are separately described.

By passing through the cylindrical lens 33, laser light is focused at a rear side focal point 34 in terms of the major axis direction. The rear side focal point 34 is determined by a refractive index of the cylindrical lens 33. In accordance with a rear side focal point distance 35 which is a distance from a cylindrical lens surface 33a to the rear side focal point, a length 39 in the major axis direction of the linear laser light emitted to an irradiation surface 38 is determined. Therefore, a distance from the cylindrical lens 33 to the irradiation surface 38 is determined so that the length 39 in the major axis direction of the linear laser light is a desired length. Note that in this embodiment mode, the irradiation surface 38 is a surface of the amorphous semiconductor film 13 shown in FIG. 1. Although the laser light passes through the cylindrical lens 36 thereafter, the laser light is not affected in the major axis direction even if it passes through the cylindrical lens 36.

Regarding the minor axis direction of laser light, the laser light passes though the cylindrical lens 33 without changing, and the laser light is focused at a rear side focal point 40 of the cylindrical lens 36 by the cylindrical lens 36 provided between the cylindrical lens 33 and the irradiation surface 38. The rear side focal point 40 is determined by a refractive index of the cylindrical lens 36. According to a rear side focal point distance 42 which is a distance from a cylindrical lens surface 36a to the rear side focal point 40, a length 41 in the minor axis direction of the linear laser light emitted to the irradiation surface 38 is determined. Therefore, a distance from the cylindrical lens 36 and the irradiation surface 38 is determined so that the length 41 in the minor axis direction of the linear laser light is a desired length. Note that in this embodiment mode, the irradiation surface 38 is the surface of the amorphous semiconductor film 13. Here, in FIG. 3B, although the rear side focal point 40 exists behind the irradiation surface, the rear side focal point 40 may be in front of the irradiation surface. Note that the laser light is also refracted by the phase-shift mask, and this point is also taken into consideration.

In this embodiment mode, laser light is emitted to the surface of the amorphous semiconductor film through a phase-shift mask 37 with a stripe pattern. By being emitted through the phase-shift mask 37, the laser light comes to have an intensity distribution that reflects the stripe pattern of the phase-shift mask 37, in the major axis direction.

Here, an interval of trenches of the stripe pattern formed in the phase-shift mask 37 may be determined depending on laser light to be used. The interval of the trenches of the stripe pattern may be determined according to size of crystal grains that is obtained when laser crystallization is performed with the laser light without using the phase-shift mask. For example, if the size of the crystal grains is about 3 µm average when crystallization is performed without using the phase-shift mask 37, when laser light that is intensity modulated is emitted to the irradiation surface, the interval may be adjusted so that half of the period of intensity modulation is shorter than or equal to 3 µm. Accordingly, a position of nucleation of a crystal can be controlled. Here, the interval of the trenches is set to be 6 µm. Accordingly, a crystal band included in a semiconductor film that is crystallized has an interval (width) of 3 µm.

As described above, FIGS. 4A to 4C each show a calculation result of forming a beam profile of laser light that is repeated with an interval of 6 µm, by interfering with the phase-shift mask. A horizontal axis represents relative distance and a vertical axis represents standardized luminance. The calculation result was obtained by numerically integrating a Fresnel-Kirchhoff diffraction integral. Note that Mathematica was used for the calculation.

Figure 4A:
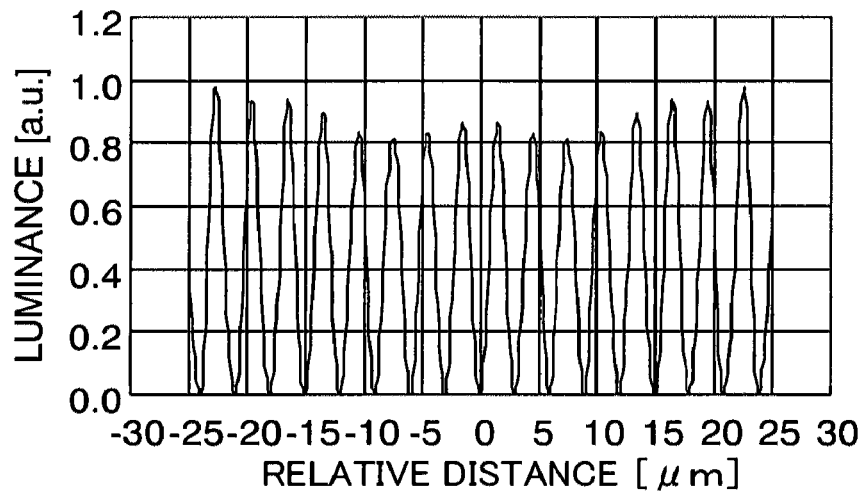
FIGS. 4A to 4C each describe a beam profile of the laser light which passed through a phase-shift mask shown in FIGS. 2A and 2B.
Figure 4B:
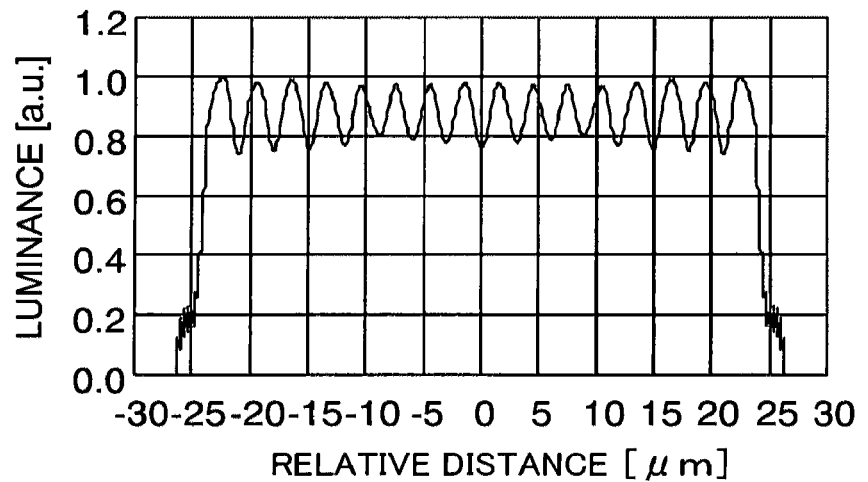
Figure 4C:
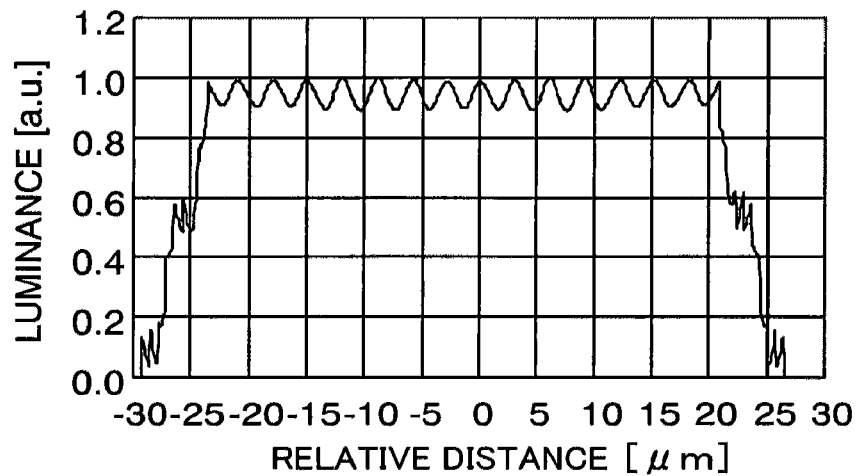

FIG. 4A shows luminance distribution when a scanning direction of laser light and a stripe pattern of a phase-shift mask are parallel to each other. Note that the scanning direction of the laser light is a direction parallel to grooves that form trenches provided in the phase-shift mask. As shown in FIG. 4A, luminance of the laser light that is emitted is nearly 0 every 3 µm (half of the interval of a beam profile of the laser light). In a position where the luminance of the laser light that is emitted is nearly 0 in this manner, sufficient amount of heat to completely melt an amorphous semiconductor film is not provided, and crystallization is not performed in some cases. Therefore, it is preferable to tilt the scanning direction of the linear beam by an angle θ (see FIG. 5(A-1)) instead of making it parallel to the grooves forming the trenches provided in the phase-shift mask. Note that FIGS. 5(A-1) and 5(A-2) show a top view of a phase-shift mask 44 and a side surface view of the phase-shift mask, respectively, and FIG. 5B shows an irradiation surface 45 being irradiated with a linear laser light 43 through the phase-shift mask 44. Accordingly, at the minimum value of the luminance of the laser light which exists periodically, enough laser light intensity with which the amorphous semiconductor film melts completely can be secured. FIG. 4B shows a case when the angle θ is 11.5° and FIG. 4C shows a case when the angle θ is 30.9°. In one interval of laser light intensity in FIG. 4C, maximum and minimum luminance values of light intensity are adjusted to be within a certain condition.

Figure 6:
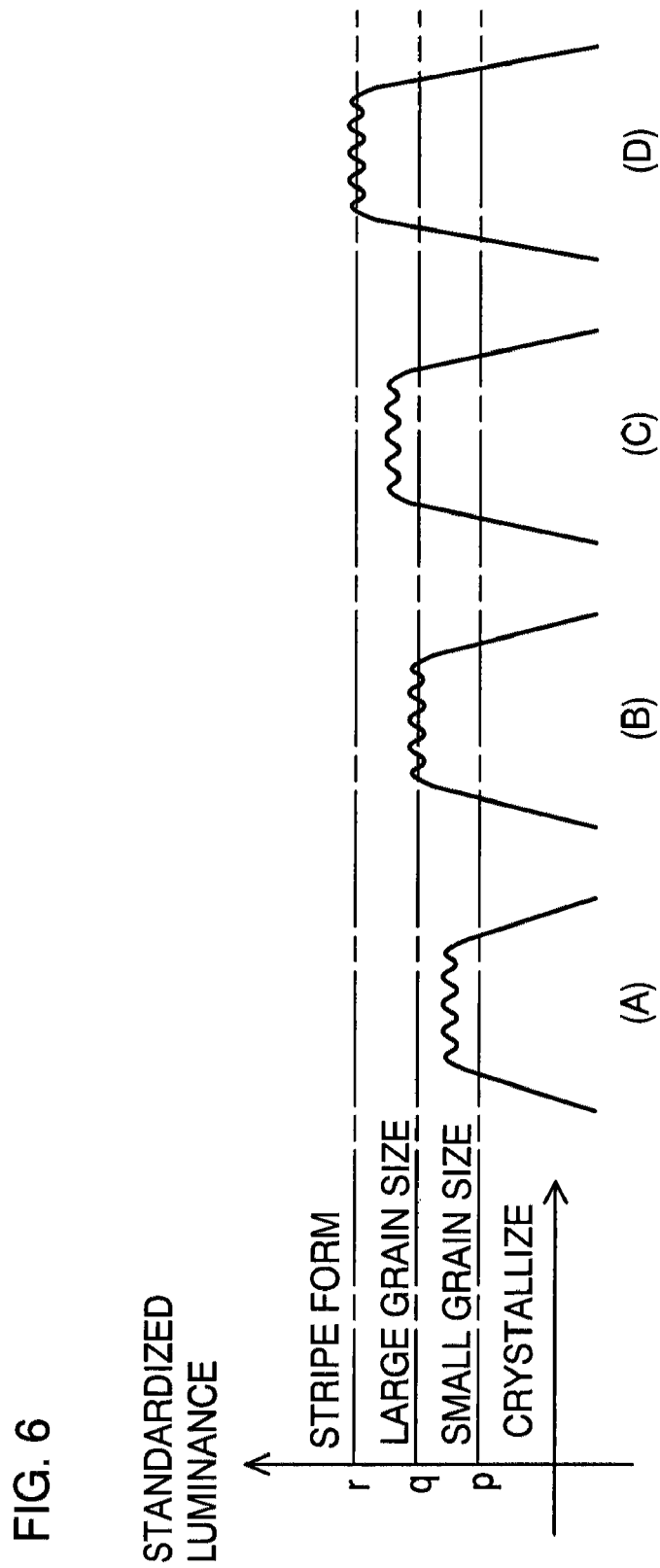
FIG. 6 describes a laser irradiation method in manufacturing a semiconductor device of the present invention.

Here, the certain condition for the maximum value and minimum value of light intensity is described. FIG. 6 shows a relationship between luminance of laser light that is emitted and a mode of a semiconductor film formed by emitting the laser light.

When the luminance of the laser light that is emitted is smaller than a p-value in FIG. 6, the amorphous semiconductor film is not crystallized and remains amorphous.

When the minimum value of the luminance of the laser light that is emitted is larger than the p-value in FIG. 6 and the maximum value of the luminance is smaller than a q-value (see FIG. 6(A)), an entire surface of the amorphous semiconductor film is crystallized.

When the maximum value of the luminance of the laser light that is emitted is larger than the q-value and smaller than an r-value in FIG. 6 and the minimum value of the luminance of the laser light that is emitted is larger than the p-value and smaller than the q-value in FIG. 6 (see FIG. 6 (B)), the amorphous semiconductor film is crystallized, and a mix of crystals with a large crystal grain size and crystals with small grain boundaries exist in a crystalline semiconductor layer.

When the maximum value and the minimum value of the luminance of the laser light that is emitted is larger than the q-value and smaller than the r-value in FIG. 6 (see FIG. 6(C)), the amorphous semiconductor film is crystallized, and crystals with a large crystal grain size are formed in the semiconductor film.

When the maximum value of the luminance of the laser light that is emitted is larger than the r-value in FIG. 6 and the minimum value of the luminance of the laser light that is emitted is larger than the q-value and smaller than the r-value in FIG. 6 (see FIG. 6(D)), the semiconductor film is left only in a region where the luminance of the laser light that is emitted is weak, and the semiconductor film in a region where the luminance is intense is lost; therefore, the semiconductor film comes to have a stripe form.

In the above manner, size or the like of crystal grains that are formed changes depending on the luminance of the laser light that is emitted. Since a crystal with a large size is formed in the present invention, the luminance of the laser light is adjusted as shown in FIG. 6(C). From experience, it is known that the q-value in FIG. 6 is about 80% of the r-value.

For the foregoing reason, it is necessary to adjust the angle θ and distance d between the phase-shift mask and the amorphous semiconductor film to have optimal values. Changes in the luminance when the angle θ is kept constant at 30.9° and distance d is changed are shown in FIGS. 28A to 28D. FIGS. 28A to 28D show the luminance of the laser light that is emitted when d is 300 µm, 400 µm, 500 µm, and 800 µm, respectively. The luminance changes periodically in FIG. 28D, and there is little noise. Accordingly, here, the angle θ and distance d may be adjusted to be 30.9 and 800 µm, respectively. Such a relationship between the linear laser light 43, the phase-shift mask 44, and the irradiation surface 45 is shown in FIGS. 5(A-1) to B. FIG. 5(A-1) is a top view of the linear laser light 43 and the phase-shift mask 44, and FIG. 5(A-2) is a side surface view of (A-1). FIG. 5B is a side surface view of the irradiation surface, the phase-shift mask, and the linear laser light shown in FIGS. 5(A-1) and 5(A-2) during linear laser light irradiation. Note that since a substrate is moved during laser irradiation, a movement direction of the substrate is shown in the figure.

Figure 32:
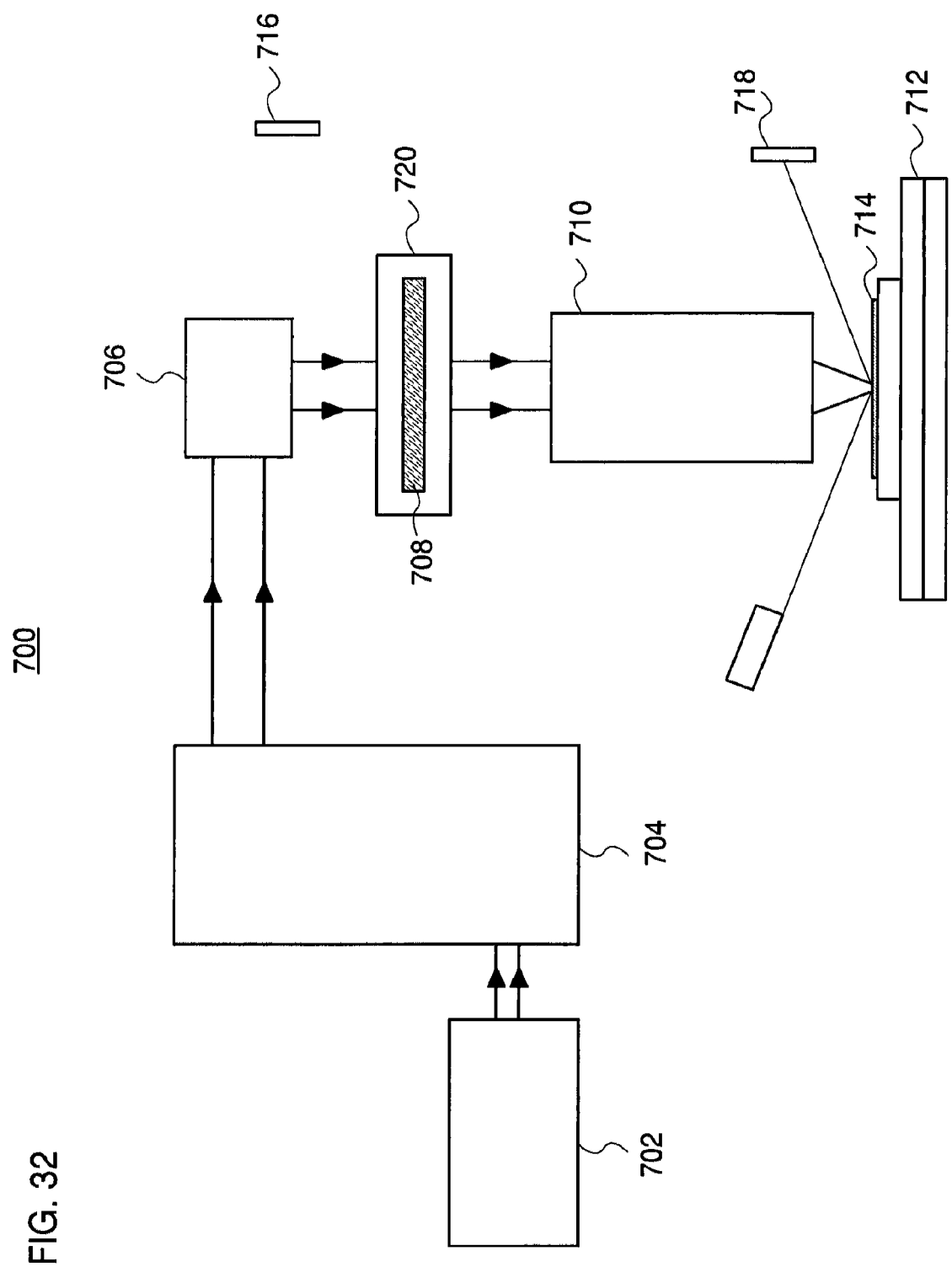
FIG. 32 describes an optical system which is able to be applied in manufacturing a semiconductor device of the present invention.

Alternatively, in addition to the foregoing described in this embodiment mode, a projection lens can be used. FIG. 32 is a schematic diagram of an optical system when a projection lens is used. A laser irradiation apparatus 700 includes a laser oscillation device 702; a first optical system 704, which shapes laser light; a second optical system 706, which homogenizes laser light; a mask holder 720; a third optical system 710; and a stage 712. A photomask 708 is provided in the mask holder 720. A substrate 714 is provided on the stage 712. The substrate 714 corresponds to, for example, the glass substrate 11 in which an amorphous semiconductor film is formed.

A laser light obtained by being emitted from an oscillator of the laser oscillation device 702 is shaped by passing through the first optical system 704. The shaped laser light is homogenized by passing through the second optical system 706. Then, the shaped and homogenized laser light passes through the photomask 708, it is reduced in size to a desired magnification in the third optical system 710, and an image of a pattern is formed on the substrate 714 held on the stage 712.

The laser oscillation device 702 includes a laser oscillator with high output. For example, an excimer laser oscillator, a gas laser oscillator, a solid state laser oscillator, a semiconductor laser oscillator, or the like is included. A laser oscillator which can produce a continuous wave laser light or a pulsed laser light can be appropriately used. Specifically, the laser oscillator exemplified in Embodiment Mode 1 or the like can be used.

The first optical system 704 is an optical system for shaping laser light obtained from the laser oscillation device 702 into a desired shape. Specifically, a cross-sectional shape of the laser light is formed into a planar shape such as a circular shape, an elliptic shape, or a rectangular shape; a linear shape (in a strict sense, a narrow rectangular shape); or the like. For example, the light diameter of the laser light is preferably adjusted using an expander or the like for the first optical system 704. Further, a polarizer, which aligns a polarization direction of a laser light; an attenuator, which adjusts energy of a laser light; a spectrometer; or the like may be used. The attenuator adjusts light intensity of laser light that is oscillated. When the laser oscillation device 702 has a function of adjusting output of laser light, the attenuator does not have to be provided.

The second optical system 706 is an optical system for homogenizing energy distributions of the laser light shaped by the first optical system 704. Specifically, the second optical system 706 homogenizes energy distributions of the laser light, with which the mask 708 is irradiated. For example, using a homogenizer or the like, energy distributions of the laser light may be homogenized. Further, in order to efficiently irradiate the mask 708 with the laser light, a field lens or the like may be provided between a homogenizer and the mask 708 so that the laser light may be condensed.

Note that, the mask 708 corresponds to a phase-shift mask, a light-blocking mask, a phase-shift mask with a light-blocking region, or the like. For the light-blocking region, a material which is favorable in light-blocking property and resistant to energy of the laser light used for irradiation is used.

The third optical system 710 is an optical system for reducing the laser light in size, which is patterned by passing through the mask 708. The laser light that passes through the mask 708 corresponds to a pattern formed by the mask 708. The third optical system 710 is an optical system that reduces the laser light formed by the mask 708 in size while maintaining the pattern shape and intensity distribution of the laser light and forms an image on the substrate 714. For example, a reducing glass, which reduces laser light to a size of ⅕, 1/10, or the like of the original size is used.

The substrate 714 is held by the stage 712, and the substrate 714 can move in an XYZθ direction.

The laser irradiation apparatus in FIG. 32 may be provided with a light-receiving element 716 for surveiling and controlling so that the mask 708 is evenly irradiated with laser light. In addition, the substrate 714 may be provided with a light-receiving element 718 as an autofocus mechanism for focusing laser light. A CCD camera or the like may be used for each of the light-receiving elements 716 and 718.

Also, the laser irradiation apparatus in FIG. 32 may be appropriately provided with a mirror or the like to control direction of movement of laser light.

By using a projection lens as described above, intensity distribution of the laser light that is emitted, in the major axis direction, is not restrained by an interval of a pattern of the mask 708. Accordingly, a crystalline semiconductor film having a crystal band with a different interval from that of the mask 708 can be formed.

In the manner described above, by applying the present invention, a polycrystalline semiconductor layer 14 that is formed of large-sized crystal grains of which location of nucleation is controlled and grain boundaries extend in one direction as shown in FIGS. 1(B-1) and 1(B-2) can be obtained. Note that in the polycrystalline semiconductor layer 14 in FIG. 1(B-1), as shown in FIG. 1(B-2), there exists a boundary line 14b of a crystal band, which extends only in one direction, and a region that is partitioned by the boundary line 14b is a crystal band 14a. Note that although the crystal band 14a includes one or a plurality of crystal grains, it is preferable that it includes one crystal grain. By making the crystal band 14a a crystal band include one crystal grain, a polycrystal semiconductor in which a grain boundary does not exist, similarly to a monocrystal, can be formed.

When an arbitrary single point (in FIG. 1(B-2), point P) is chosen in the crystal band 14a and a line is drawn from the arbitrary single point so as to be parallel to the boundary line 14b of the crystal band, the line does not cross the boundary line 14b of the crystal band. Also, according to this embodiment mode, since a crystal grain boundary that crosses the boundary line 14b of the crystal band is not formed, by providing a TFT so that a channel length direction of the TFT is nearly parallel to the boundary line 14b of the crystal band, a TFT with high mobility and a favorable electrical characteristic can be manufactured.

Also, in this embodiment mode, in crystallizing the amorphous semiconductor film with laser light, the laser light is shaped into a linear form. As means of periodically modulating intensity of the linear laser light in a major axis direction, a phase-shift mask in which grooves are formed with a certain interval is used. Therefore, widths of crystal bands to be formed are uniform. By the widths of the crystal bands being uniform, a TFT with a favorable electrical characteristic can be manufactured.

Further, in crystallization, a metal element that promotes crystallization can also be used. When crystallization of an amorphous semiconductor film is performed using a metal element that promotes crystallization, in addition to crystallization at low temperature and in a short period of time being possible, there is an advantage that directions of crystals are uniform. However, there is a disadvantage that because the metal element is left in the crystalline semiconductor layer, an off current rises, and a characteristic becomes unstable. Consequently, an amorphous semiconductor layer that serves as a gettering site may be formed over the crystalline semiconductor layer. Since it is necessary that an impurity element such as phosphorus (P) or argon (Ar) is included in the amorphous semiconductor layer that becomes the gettering site, it is favorable that the amorphous semiconductor layer is formed by a sputtering method by which argon can be made to be included at a high concentration. Thereafter, a heating treatment (by an RTA method, heat annealing using an annealing furnace, or the like) is performed, the metal element is diffused in the amorphous semiconductor layer, and then the amorphous semiconductor layer containing the metal element and an oxide film on a surface thereof are removed. Consequently, an amount of the metal element contained in the crystalline semiconductor layer can be reduced or the metal element can be eliminated.

Also, after crystallization, a passivation film may be formed with a silicon nitride film or a silicon oxynitride film, and a heat treatment may be performed in a nitrogen atmosphere at 450 to 800° C., for 1 to 24 hours. For example, by performing a heat treatment at 550° C. for 14 hours, an impurity region becomes a gettering site, and the metal element can be segregated to the impurity region from a channel forming region. In the impurity region, a donor or acceptor and the metal element coexist. In this manner, the metal element that promotes crystallization can be eliminated from the channel forming region.

Further, as the metal element that promotes crystallization, Ni, Fe, Ru, Rh, Pd, Os, Ir, Pt, Cu, Au, or the like can be used.

As described above, by the present invention, a location of nucleation of a crystal can be controlled. Therefore, a location of generating a crystal grain boundary, a direction of generation, and the number per unit area can be controlled.

By the present invention, directions of crystal growth can be controlled to be in one direction. Therefore, crystal grain boundaries can be reduced. Consequently, in a TFT including a polycrystalline semiconductor layer, mobility of the semiconductor layer can be drastically improved.

Further, by the present invention, since mobility of a semiconductor layer of a TFT improves, a TFT with a favorable electrical characteristic can be manufactured.

Since a TFT having a favorable electrical characteristic can be manufactured by the present invention, a circuit element with higher performance than before can be formed. Accordingly, a semiconductor device with more added value than before can be manufactured over a glass substrate.

Embodiment Mode 2

In this embodiment mode, an example of a manufacturing process of a TFT in a liquid crystal display device to which the present invention is applied is described with reference to FIGS. 7A to 10B. FIGS. 7A to 10B show TFTs (pixel TFTs) included in a pixel portion of a liquid crystal display device. In FIGS. 7A, 8A, 9A, and 10A, top views are shown, and FIGS. 7B, 8B, 9B, and 10B show cross-sectional diagrams along a line connecting $X_1$ to $X_3$ in FIGS. 7A, 8A, 9A, and 10A, respectively.

In this embodiment mode, a glass substrate 70 is used as a substrate. A base layer 71 is formed over the glass substrate 70. An amorphous silicon film is formed over the base layer 71. The base layer 71 may be formed of a silicon oxide based material or a silicon nitride based material. Alternatively, the base layer 71 may have a structure in which films made of such materials are stacked. Favorably, the base layer 71 may have a stacked layer structure of two layers in which a silicon oxide film is formed over a silicon nitride film. It is preferable that a layer that is in contact with a semiconductor layer is formed of silicon oxide. In particular, it is even more preferable when silicon oxide formed by thermal oxidation is used, since variation in interface state can be reduced. Here, the base layer 71 has a stacked layer structure in which a silicon oxide film 73 is formed over a silicon nitride film 72. Note that the present invention is not limited thereto, and similarly to Embodiment Mode 1, the base layer 71 does not have to be provided when it is not necessary.

Next, a dehydrogenation treatment is performed. The dehydrogenation treatment may be performed by heating the glass substrate 70. For example heating is performed for 1 hour at 500° C. Note that the present invention is not limited thereto, and the dehydrogenation treatment does not have to be performed when it is not necessary.

Next, channel doping is performed as necessary. Note that channel doping is a technique of adding an impurity of a predetermined concentration to a semiconductor layer to shift a threshold voltage of a TFT intentionally, to control the threshold of the TFT to a desired value. For example, when the threshold voltage is shifted to a negative side, a p-type impurity element is used as a dopant, and when the threshold voltage is shifted to a positive side, an n-type impurity is used as the dopant. Here, phosphorus (P) or arsenic (As) is given as the p-type impurity element, and boron (B), aluminum (Al), or the like is given as the n-type impurity element.

Here, the oxide film formed on the surface of an amorphous silicon film is removed as necessary.

Next, the amorphous silicon film is crystallized by applying the present invention. The method described in Embodiment Mode 1 may be used for crystallization of the amorphous silicon film. Consequently, the amorphous silicon film is crystallized, and becomes a polycrystalline silicon layer 75.

Figure 7A:
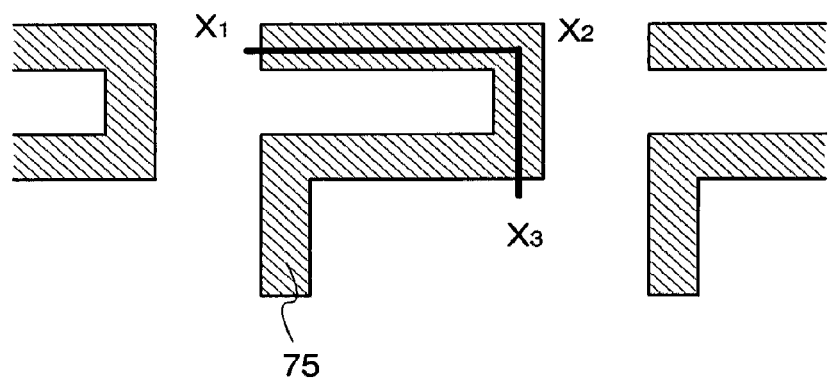
FIGS. 7A and 7B each describe a manufacturing method of a TFT to which the present invention is applied.
Figure 7B:
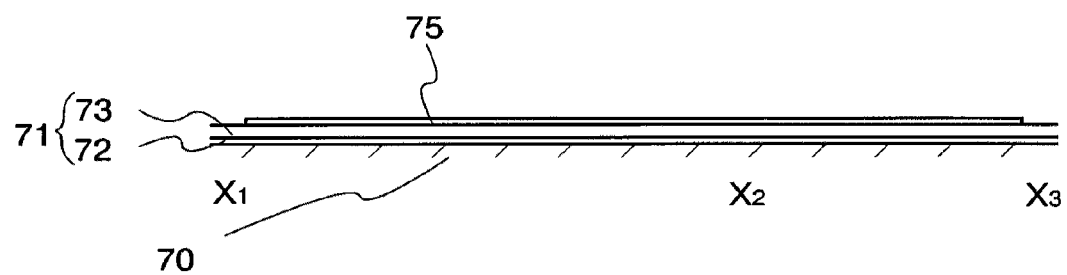

Then, the polycrystalline silicon layer 75 is patterned by etching (see FIGS. 7A and 7B). The etching may be dry etching or wet etching, and it is performed under a condition in which an etching rate of a layer that becomes a base (here, the silicon oxide film 73) is low and an etching rate of the polycrystalline silicon layer 75 is high; that is, a condition in which etching selectivity of the polycrystalline silicon layer 75 with respect to the layer that becomes the base is high. For an etching gas, a fluorine based gas such as $SF_6$, a chlorine based gas such as $CCl_4$ or $Cl_2$, or a gas such as $CBrF_3$ can be used. Note that in this specification, an etching rate means depth of etching per unit time. Also, in etching a film that is formed of stacked layers, etching selectivity is an etching rate of a film to be etched with respect to an etching rate of the layer that becomes the base.

Next, a silicon oxide film is formed as a cap film, and with a resist formed in a desired region, an impurity element is added at high concentration. Here, if a TFT to be formed is an N-type TFT, phosphorus (P), arsenic (As), or the like can be used. Alternatively, if the TFT to be formed is a P-type TFT, boron (B), aluminum (Al), or the like can be used. Here, an N-type TFT is formed using phosphorus (P) as the impurity element. Thereafter, the resist and the silicon oxide film formed as the cap film are removed. Note that the present invention is not limited thereto and the cap film may be formed of another material.

Then, a first insulating layer 77 is formed. The first insulating layer 77 may be formed of a silicon oxide based material or a silicon nitride based material in a similar manner to the base layer 71. Here, the first insulating layer 77 has a stacked layer structure in which a silicon nitride film 79 is formed over a silicon oxide film 78.

Figure 8A:
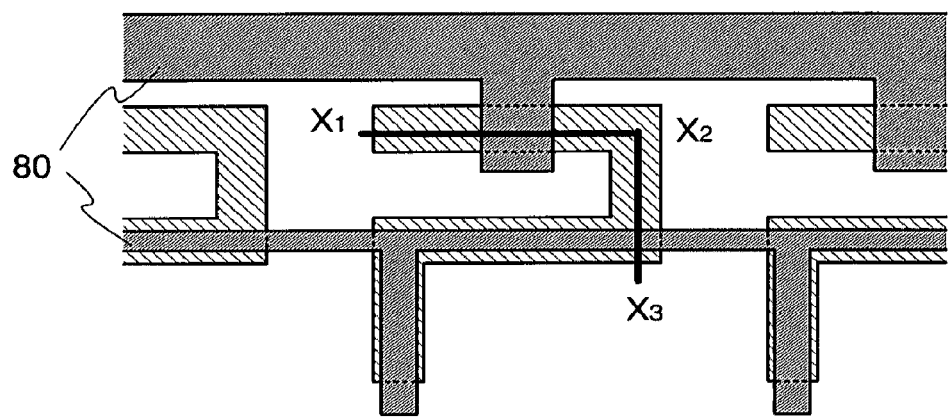
FIGS. 8A and 8B each describe a manufacturing method of a TFT to which the present invention is applied.
Figure 8B:
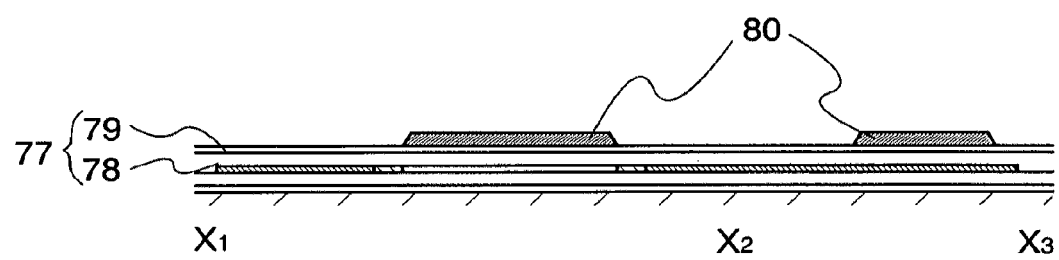
Figure 9A:
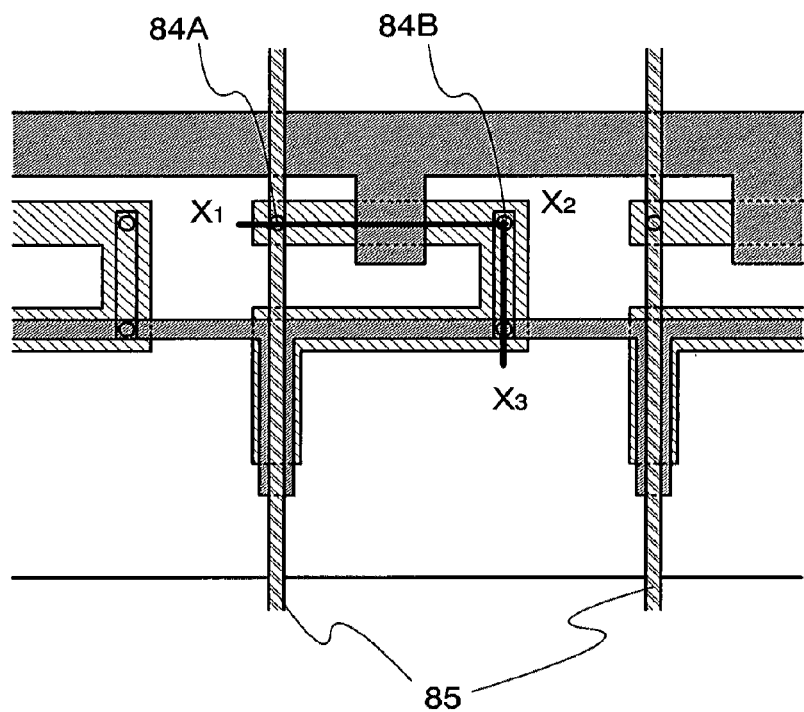
FIGS. 9A and 9B each describe a manufacturing method of a TFT to which the present invention is applied.
Figure 9B:
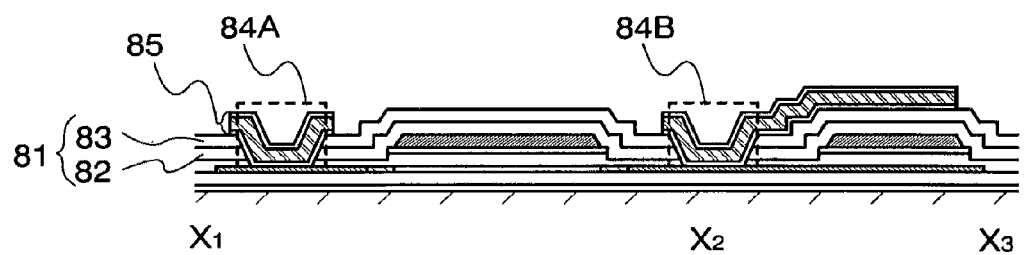

Next, a first electrode layer 80 is formed (see FIGS. 8A and 8B). The first electrode layer 80 can be formed using a CVD method, a sputtering method, a droplet discharging method, or the like. The first electrode layer 80 may be formed of an element selected from tantalum (Ta), tungsten (W), titanium (Ti), molybdenum (Mo), aluminum (Al), and copper (Cu), or an alloy material or compound material mainly containing the element. When aluminum (Al) is used for the first electrode layer 80, hillocks are suppressed by using an Al—Ta alloy in which aluminum is alloyed with tantalum (Ta) added thereto. Also, by using an Al—Nd alloy in which aluminum is alloyed with neodymium (Nd) added thereto, a wiring with low resistance can be formed in addition to suppressing hillocks.

Therefore, an Al—Ta alloy or an Al—Nd alloy is preferably used. Also, a semiconductor film typified by polycrystalline silicon doped with an impurity element such as phosphorus (P), or an AgPdCu alloy may be used. The first electrode layer 80 may be a single layer or stacked layers. For example, the first electrode layer 80 may have a two-layer stacked layer structure including a titanium nitride film and a molybdenum film, or a three-layer stacked layer structure in which a tungsten film with a film thickness of 50 nm, an alloy film of aluminum and silicon with a film thickness of 500 nm, and a titanium nitride film with a film thickness of 30 nm are stacked. Also, in a case of a three-layer stacked layer structure, a tungsten nitride film may be used as a first conductive film instead of the tungsten film, an alloy film of aluminum and titanium may be used as a second conductive film instead of the alloy film of aluminum and silicon, and a titanium film may be used as a third conductive film instead of the titanium nitride film. The first electrode layer 80 may be formed as a single layer or stacked layers. For example, the first electrode layer 80 may be formed of a film mainly containing molybdenum (Mo).

Here, a portion of the first insulating layer 77 formed in an earlier step is removed by etching. Here, a portion of the silicon nitride film 79 in an upper portion of the first insulating layer 77 is removed.

To form a semiconductor layer of one conductivity type, an impurity element is added at high concentration. With this step, an LDD (lightly doped drain) region is formed. Note that an LDD region is a region that is formed with a purpose of improving reliability, in a TFT in which a semiconductor layer is formed of a polycrystalline silicon film. In a TFT in which a semiconductor layer is made of polycrystalline silicon, it is important to suppress an off current, and it is particularly necessary that the off current is sufficiently low when the TFT is used for an analog switch such as a pixel circuit. However, by a reverse-bias intense electric field at a drain junction portion, there is a leak current through a defect even when the TFT is turned off. Since an electric field in a vicinity of a drain edge is relaxed by the LDD region, the off current can be reduced. Moreover, the reverse-bias electric field at the drain junction portion can be diffused to a junction portion between a channel forming region and the LDD region, and a junction portion between the LDD region and a drain region; consequently, the electric field is relaxed, and the leak current is reduced. By performing annealing thereafter, the impurity is activated.

Next, a second insulating layer 81 is formed. The second insulating layer 81 may be formed of a silicon oxide based material or a silicon nitride based material in a similar manner to the first insulating layer 77 or the base layer 71. Alternatively, the second insulating layer 81 may have a structure in which films made of such materials are stacked. Favorably, the second insulating layer 81 may have a two-layer structure in which a silicon oxide film 83 is formed over a silicon nitride film 82. After forming the second insulating layer 81, a hydrogenation treatment is performed.

Then, by etching a desired position of the second insulating layer 81, an opening portion 84A and an opening portion 84B are formed. With the opening portion 84A and the opening portion 84B formed, a second electrode layer 85 is pattern formed (see FIGS. 9A and 9B). The second electrode layer 85 can be formed in a similar manner to the first electrode layer 80. For example, the second electrode layer 85 may have a three-layer stacked layer structure in which a layer mainly containing aluminum (Al) is interposed between layers mainly containing molybdenum (Mo). Note that the present invention is not limited thereto. When it is not necessary to form an opening portion, as in a case where the second insulating layer 81 is formed by a droplet discharging method, etching for forming the opening portion does not have to be performed.

Next, a third insulating layer 86 is pattern formed. The third insulating layer 86 may be formed by a spin coating method or the like using a film made of an organic material typified by polyimide, acrylic, or the like. A pattern is formed so as to have an opening portion 87. Note that the opening portion 87 is formed so as to expose the second electrode layer 85 in a desired position. Also, when a droplet discharging method is used, a process is simplified since it is not necessary to perform pattern formation by photolithography. Here, a droplet discharging method corresponds to a method of forming a predetermined pattern by selectively discharging or the like droplets of a composition that is prepared for a specific purpose (depending of a method, it is also called an inkjet method). Alternatively, other methods by which a pattern can be transferred or depicted, for example, various printing methods (a method by which a pattern is formed such as screen printing, offset printing, relief printing, or gravure printing), or the like can be used. Note that the third insulating layer 86 may also have a stacked layer structure. For example, a film made of an organic material may be formed over a film made of an inorganic material such as a silicon oxide based material or a silicon nitride based material.

Figure 10A:
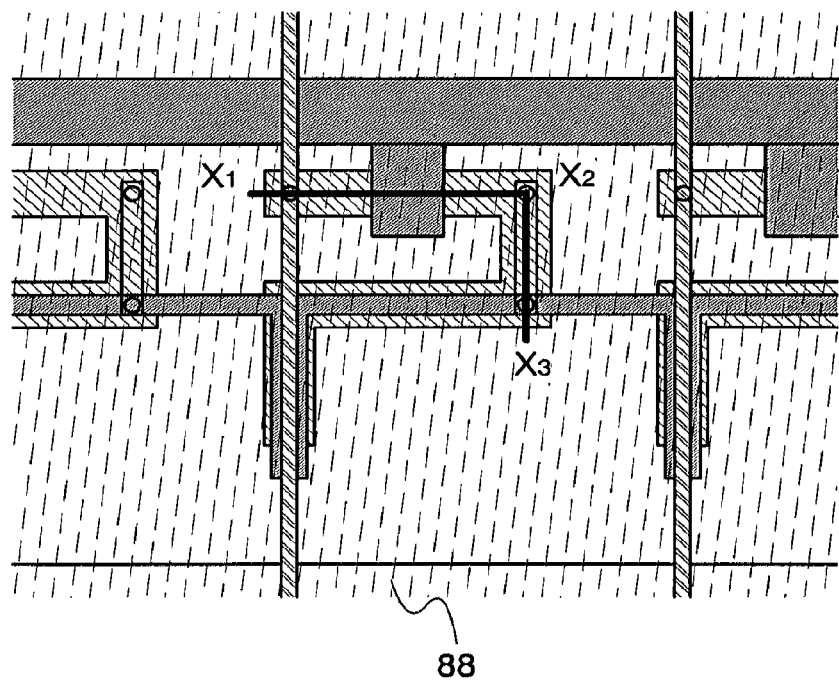
FIGS. 10A and 10B each describe a manufacturing method of a TFT to which the present invention is applied.
Figure 10B:
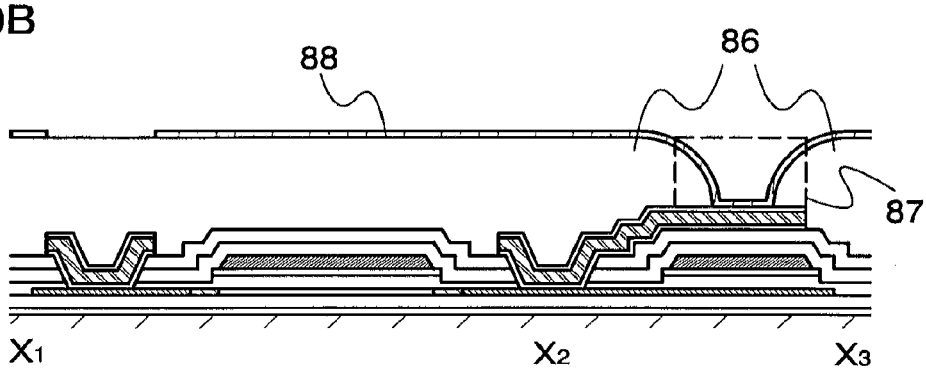

Then, a third electrode layer 88 is pattern formed (see FIGS. 10A and 10B). The third electrode layer 88 is formed of a transparent conductive film since it serves as a pixel electrode. For example, the third electrode layer may be formed by a sputtering method using ITO (indium tin oxide), zinc oxide, or the like. Also, ITSO, which is formed by a sputtering method using a target of ITO containing 2 to 10% silicon oxide, may be used. Alternatively, a conductive material of zinc oxide doped with gallium (Ga), or IZO which is an oxide conductive material of indium oxide mixed with 2 to 20% zinc oxide may be used. After the third electrode layer 88 is formed, a desired pattern may be formed by etching. Note that the present invention is not limited thereto. The third electrode layer 88 may be formed of another material that serves as transparent conductive film.

Further, a fourth electrode layer may be formed as necessary. As the fourth electrode layer, a reflecting electrode can be given for example, which is necessary for a semi-transmissive/semi-reflective display device or a reflective display device. By using a reflective electrode, display can be performed by effectively utilizing external light. Accordingly, power consumption of a display device can be reduced. In forming the fourth electrode layer, a material mainly containing aluminum (Al), silver (Ag), or the like is used. A material with high reflectivity of light may be used. Favorably, the fourth electrode layer has a stacked layer structure in which a layer mainly containing aluminum is formed over a layer mainly containing molybdenum. Further, in a reflective display device, the third electrode layer 88 may be formed using the material of the fourth electrode layer (the material with high reflectivity of light).

In the above manner, a TFT substrate used for a display device can be formed by applying the present invention. However, the present invention is not limited thereto. As a TFT to which the present invention can be applied, a different example is shown in FIG. 11.

Figure 11:
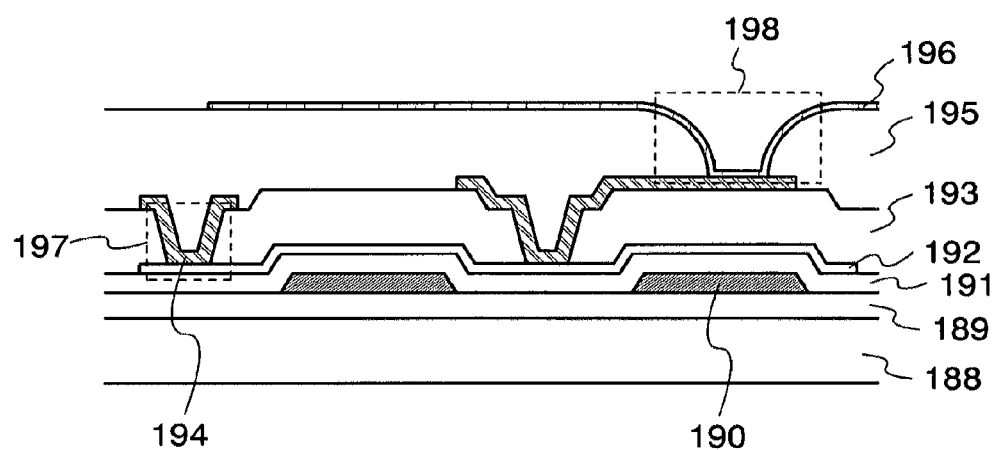
FIG. 11 describes a TFT manufactured by applying the present invention.

FIG. 11 is a side surface view of a TFT that can be used for a pixel portion of a liquid crystal display device in a similar manner to Embodiment Mode 2, and the TFT is called a bottom gate type TFT. Details of a formation method of the TFT are similar to those of Embodiment Mode 2. A base layer 189 is formed over a substrate 188, and a first electrode layer 190 is pattern formed over the base layer 189. A first insulating layer 191 is formed over the first electrode layer 190, and a polycrystalline semiconductor layer 192 is formed over the first insulating layer 191. Further, a second insulating layer 193 is formed over the polycrystalline semiconductor layer 192 so as to have an opening portion 197, and a second electrode layer 194 is pattern formed thereover. The polycrystalline semiconductor layer 192 and the second electrode layer 194 are electrically connected at the opening portion 197. A third insulating layer 195 is formed over the second electrode layer 194 so as to have an opening portion 198, a third electrode layer 196 is pattern formed over the third insulating layer 195. The second electrode layer 194 and the third electrode layer 196 are electrically connected at the opening portion 198.

Each layer of the TFT described above may be formed as stacked layers. Also, a material for formation is not particularly limited. Further, it is preferable to introduce an impurity into the polycrystalline semiconductor layer 192 so that an LDD region is formed.

Next, structures of pixels of display panels of a variety of modes are described with reference to equivalent circuit diagrams shown in FIGS. 25A to 25F.

Figure 25A:
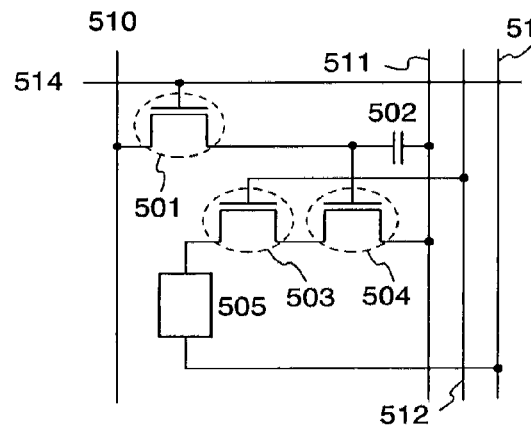
FIGS. 25A to 25F each describe a pixel circuit of a display device to which the present invention is applied.

In the pixel shown in FIG. 25A, a signal line 510, a power supply line 511, a power supply line 512, and a power supply line 513 are arranged in a column direction, and a scanning line 514 is arranged in a row direction. Also, the pixel includes a TFT 501 for switching, a TFT 503 for driving, a TFT 504 for current control, a capacitor 502, and a light-emitting element 505.

Figure 25B:
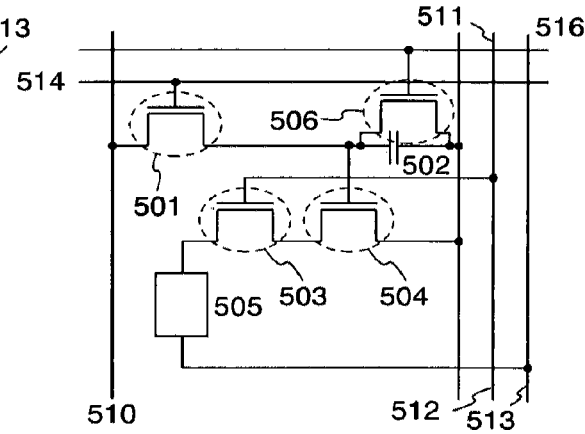
Figure 25C:
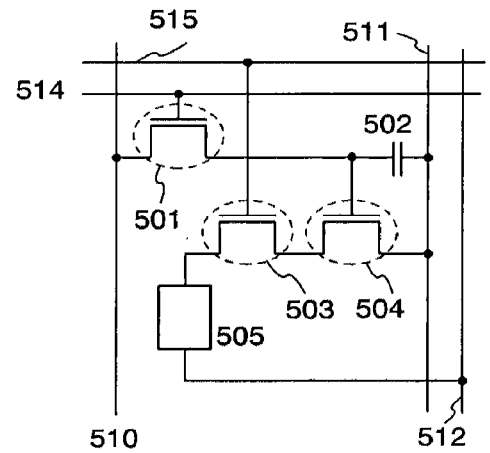
Figure 25D:
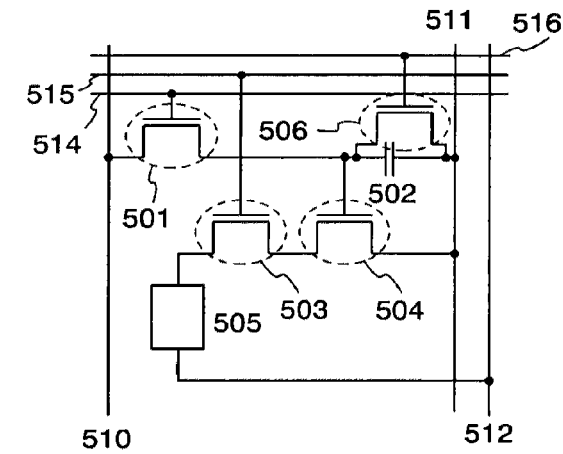

The pixel shown in FIG. 25C has the same structure as the pixel shown in FIG. 25A except that a gate electrode of the TFT 503 is connected to a power supply line 515 arranged in the row direction. That is, FIGS. 25A and 25C are equivalent circuit diagrams. However, in a case where the power supply line 512 is arranged in the column direction (FIG. 25A) and in a case where the power supply line 515 is arranged in the row direction, the power supply lines are formed of conductor layers of different layers. Here, wirings to which the gate electrodes of the TFTs 503 for driving are connected is given attention, and to show that layers from which these are manufactured are different, they are shown separately in FIGS. 25A and 25C.

As characteristics of the pixels shown in FIGS. 25A and 25C, the TFT 503 and the TFT 504 are serially connected in each of the pixels, and a channel length $L_3$ and a channel width $W_3$ of the TFT 503 and a channel length $L_4$ and a channel width $W_4$ of the TFT 504 are set to satisfy the following relationship: $L_3/W_3:L_4/W_4=5$ to $6000:1$. As an example of satisfying such a relationship, a case is considered where $L_3$ is 500 μm, $W_3$ is 3 μm, $L_4$ is 3 μm, and $W_4$ is 100 μm. Also, by using the present invention, many grain boundaries can be formed to be nearly parallel to a channel length direction; consequently, a TFT with high mobility can be formed, and a display panel with excellent display capability can be manufactured.

Note that the TFT 503 operates in a saturation region and has a role of controlling a current value that flows through the light-emitting element 505, and the TFT 504 operates in a linear region and has a role of controlling current supplied to the light-emitting element 505. It is preferable that the TFT 503 and the TFT 504 have the same conductivity type. Also, for the TFT 503, a depletion type TFT may be used instead of an enhancement type TFT. In the present invention having the above structure, the TFT 504 operates in the linear region; therefore, little fluctuation in $V_{GS}$ (potential difference between a gate electrode and a source electrode or drain electrode) of the TFT 504 does not affect a current value of the light-emitting element 505. That is, the current value of the light-emitting element 505 is determined by the TFT 503 that operates in the saturation region.

In each of the pixels shown in FIGS. 25A to 25D, The TFT 501 controls input of a video signal to the pixel, and when the TFT 501 is turned on and a video signal is input to the pixel, the video signal is held in the capacitor 502. Note that although a structure in which the capacitor 502 is provided is shown in FIGS. 25A to 25D, the present invention is not limited thereto, and the capacitor 502 does not have to be provided if enough capacity for holding the video signal can be provided by a gate capacitance or the like.

The light-emitting element 505 has a structure in which an electroluminescent layer is interposed between two electrodes. A potential difference is provided between a pixel electrode and a counter electrode (between an anode and a cathode) so that a forward bias voltage is applied. The electroluminescent layer is formed by a material selected from an organic material, an inorganic material, and the like. The luminescence in the electroluminescent layer includes light emission that is generated when returning from a singlet excited state to a ground state (fluorescence) and light emission that is generated when returning from a triplet exited state to a ground state (phosphorescence). Note that the present invention is not limited thereto and a liquid crystal element may be used instead of a light-emitting element.

The pixel shown in FIG. 25B has the same pixel structure as that shown in FIG. 25A, except that a TFT 506 and a scanning line 516 are additionally provided. In a similar manner, the pixel shown in FIG. 25D have the same pixel structure as that shown in FIG. 25C, except that the TFT 1506 and the scanning line 516 are additionally provided.

On/off of the TFT 506 is controlled by the scanning line 516 that is newly provided. When the TFT 506 is turned on, a charge that is held in the capacitor 502 is released, and the TFT 504 is turned on. That is, by placement of the TFT 506, a state where a current is not fed to the light-emitting element 505 can be forcefully made. Accordingly, in the structures in FIGS. 25B and 25D, since a lighting period can be started at the same time as or right after; the start of a writing period without waiting for signals to be written in all pixels, a duty ratio can be improved.

Figure 25E:
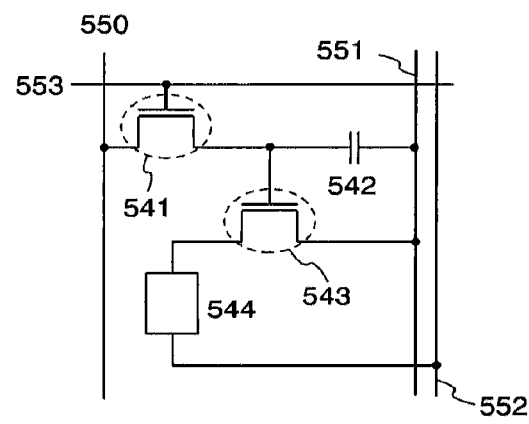
Figure 25F:
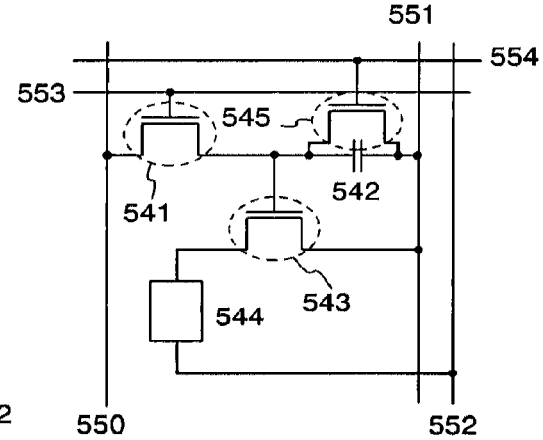

In the pixel shown in FIG. 25E, a signal line 550, a power supply line 551, and a power supply line 552 are arranged in a column direction, and a scanning line 553 is arranged in a row direction. Also, the pixel includes a TFT 541 for switching, a TFT 543 for driving, a capacitor 542, and a light-emitting element 544. The pixel shown in FIG. 25F has the same pixel structure as that shown in FIG. 25E except that a TFT 545 and a scanning line 554 are additionally provided. Note that in the structure in FIG. 25F also, a duty ratio can be improved by placement of the TFT 545.

In the above manner, size of crystal grains in a semiconductor layer can be made to be large, and positions where grain boundaries are formed can be controlled by applying the present invention; consequently, a polycrystalline semiconductor layer formed of large-sized crystal grains, with a small number of grain boundaries existing in a channel length direction, can be obtained. Accordingly, a TFT with high mobility in a semiconductor layer can be formed.

Further, by the present invention, since mobility of a semiconductor layer of a TFT improves, a TFT with a favorable electrical characteristic can be manufactured.

Since a TFT having a favorable electrical characteristic can be manufactured by the present invention, a circuit element with higher performance than before can be formed. Accordingly, a display device with more added value than before can be manufactured over a glass substrate.

Embodiment Mode 3

In this embodiment mode, a light-emitting element in Embodiment Mode 2 is described.

Figure 12A:
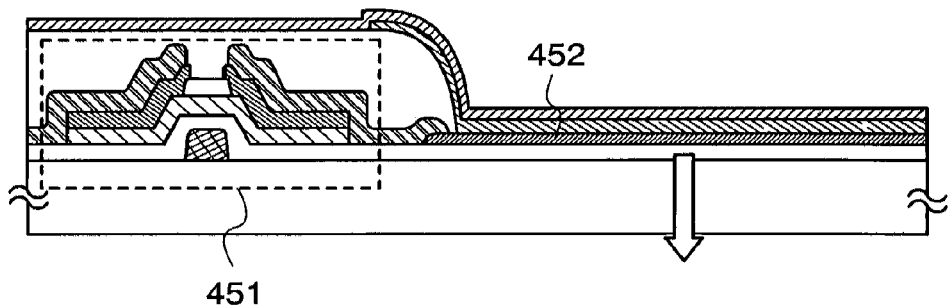
FIGS. 12A to 12C each describe a state in which a TFT manufactured by applying the present invention is applied to an EL element.
Figure 12B:
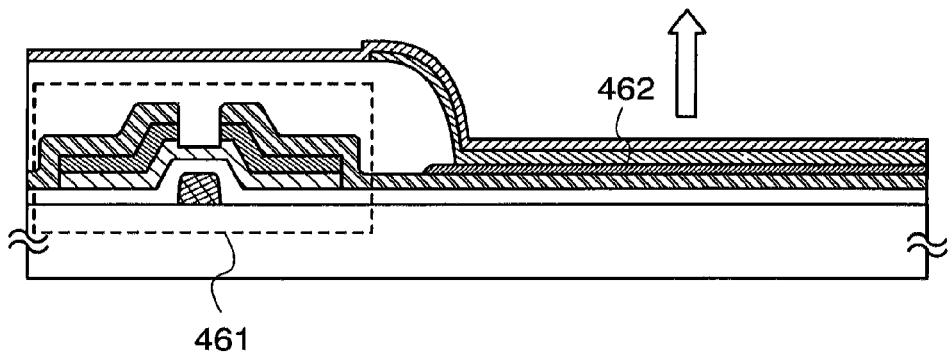
Figure 12C:
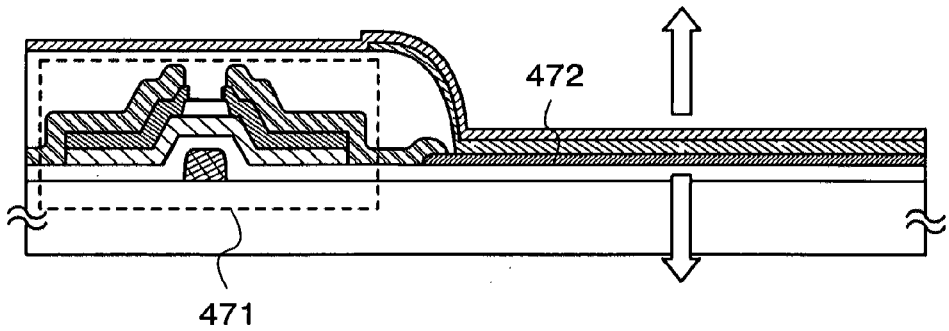

Next, an EL display device manufactured by applying the present invention is described with reference to FIGS. 12A to 12C. When an N-type transistor is used as a transistor that drives a light-emitting element, light emitted from the light-emitting element is emitted by any manner of bottom emission (see FIG. 12A), top emission (see FIG. 12B), or dual emission (FIG. 12C). By using a TFT 451, a TFT 461, and a TFT 471, an electric field to light-emitting layers connected to the TFTs are controlled. A light-emitting layer 452, a light-emitting layer 462, and a light-emitting layer 472 are electric field light-emitting layers, and an EL may be sued. Light-emitting elements using EL are categorized by whether a light-emitting material is an organic compound or an inorganic compound, and in general, the former is called an organic EL element and the latter is called an inorganic EL element. Hereinafter, a case of forming an inorganic EL element is described.

An inorganic EL element is classified into a dispersion-type inorganic EL element and a thin-film-type inorganic EL element, depending on its element structure. The former and the latter are different in that the former has an electric field light-emitting layer in which particles of a light-emitting material are dispersed in a binder, whereas the latter has an electric field light-emitting layer formed of a thin film of a light-emitting material. However, the former and the latter share a common feature that they need electrons accelerated by a high electric field. It is to be noted that, as a mechanism of light emission that is obtained, there are donor-acceptor recombination-type light emission that utilizes a donor level and an acceptor level, and localized-type light emission that utilizes inner-shell electron transition of a metal ion. In general, a dispersion-type inorganic EL element exhibits donor-acceptor recombination-type light emission and a thin-film-type inorganic EL element exhibits localized-type light emission.

A light-emitting material that can be used in the present invention includes a base material and an impurity element that becomes a luminescent center. By varying the impurity element that is contained, light emission of various colors can be obtained. Various methods such as a solid-phase method and a liquid-phase method (a coprecipitation method) can be used for forming the light-emitting material. In addition, an evaporative decomposition method, a double decomposition method, a method by heat decomposition reaction of a precursor, a reversed micelle method, a method in which such a method and high temperature baking are combined, a liquid-phase method such as a freeze-drying method, or the like can be used.

A solid-phase method is a method in which a base material and an impurity element or a compound containing an impurity element are weighed, mixed in a mortar, heated, and baked in an electronic furnace to be reacted, so that the impurity element is contained in the base material. The baking temperature is preferably 700° C. to 1500° C. This is because the solid reaction does not progress when the temperature is too low, whereas the base material is decomposed when the temperature is too high. It is to be noted that, although the baking may be carried out in a powder state, it is preferable that the baking be carried out in a pellet state. Although the solid-phase method needs baking at a relatively high temperature, the solid-phase method is simple; therefore, high productivity is obtained and the solid-phase method is suitable for mass production.

A liquid-phase method (a coprecipitation method) is a method in which a base material or a compound containing a base material and an impurity element or a compound containing an impurity element are reacted in a solution, dried, and then baked. Particles of a light-emitting material are distributed uniformly, and the reaction can progress even when size of crystal grains is small and the baking temperature is low.

As a base material used for a light-emitting material, a sulfide, an, oxide, or a nitride can be used. For the sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. For the oxide, for example, zinc oxide (ZnO), yttrium oxide ($Y_2O_3$), or the like can be used. For the nitride, for example, aluminum nitride (AlN), gallium nitride (GaN), indium nitride (InN), or the like can be used. Furthermore, as the base material used for the light-emitting material, zinc selenide (ZnSe), zinc telluride (ZnTe), or the like can also be used. Alternatively, a ternary mixed crystal such as calcium gallium sulfide ($CaGa_2S_4$), strontium gallium sulfide ($SrGa_2S_4$), or barium gallium sulfide ($BaGa_2S_4$) may also be used.

For a luminescent center of the localized-type light emission, manganese (Mn), copper (Cu), samarium (Sm), terbium (Th), erbium (Er), thulium (Tm), europium (Eu), cerium (Ce), praseodymium (Pr), or the like can be used. It is to be noted that a halogen element such as fluorine (F) or chlorine (Cl) may be added as charge compensation.

On the other hand, for a luminescent center of the donor-acceptor recombination-type light emission, a light-emitting material containing a first impurity element that forms a donor level and a second impurity element that forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case where the light-emitting material of the donor-acceptor recombination-type light emission is synthesized by a solid-phase method, each of a base material, a first impurity element or a compound containing a first impurity element, and a second impurity element or a compound containing a second impurity element is weighed and mixed in a mortar, and then heated and baked in an electronic furnace. The above-described base material can be used for the base material. As the first impurity element or the compound containing the first impurity element, for example, fluorine (F), chlorine (Cl), aluminum sulfide ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. The baking temperature is preferably 700° C. to 1500° C. This is because the solid reaction does not progress when the temperature is too low, whereas the base material is decomposed when the temperature is too high. It is to be noted that, although the baking may be carried out in a powder state, it is preferable that the baking be carried out in a pellet state.

As an impurity element in the case of utilizing solid-phase reaction, a compound including a first impurity element and a second impurity element may be used. In this case, the impurity element is easily diffused and solid-phase reaction easily progresses; thus, a uniform light-emitting material can be obtained. Moreover, since an unnecessary impurity element does not enter, a light-emitting material with high purity can be obtained. As the compound including the first impurity element and the second impurity element, for example, copper chloride (CuCl), silver chloride (AgCl), or the like can be used.

It is to be noted that these impurity elements may be contained at concentrations of 0.01 to 10 atom %, preferably, 0.05 to 5 atom % with respect to the base material.

In the case of the thin-film-type inorganic EL element, an electric field light-emitting layer, which contains the above-described light-emitting material, can be formed by a vacuum evaporation method such as a resistance heating evaporation method or an electron beam evaporation (EB evaporation) method; a physical vapor deposition method (PVD) such as a sputtering method; a chemical vapor deposition method (CVD) such as a metal organic CVD method or a low-pressure hydride transport CVD method; an atomic layer epitaxy method (ALE); or the like.

Figure 13A:
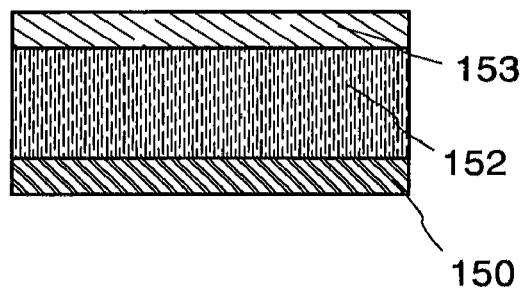
FIGS. 13A to 13C each describe an EL element to which the present invention is applied.
Figure 13B:
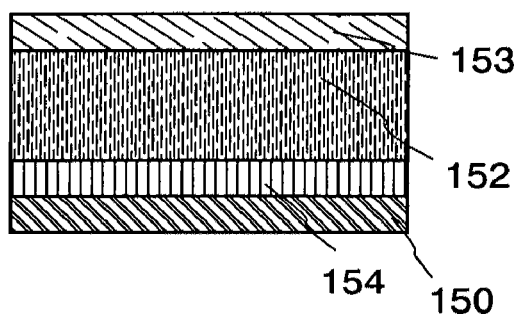
Figure 13C:
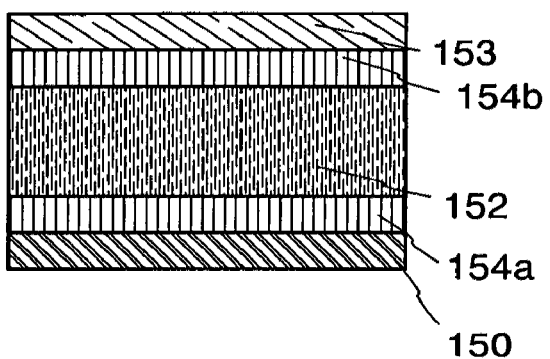

Examples of a thin-film-type inorganic EL element that can be used as a light-emitting element are shown in FIGS. 13A to 13C. In FIGS. 13A to 13C, each light-emitting element includes a first electrode layer 150, an electric field light-emitting layer 152, and a second electrode layer 153.

The light-emitting elements shown in FIGS. 13B and 13C have a structure in which an insulating layer is provided between an electrode layer and an electric field light-emitting layer in the light-emitting element of FIG. 13A. The light-emitting element shown in FIG. 13B has a structure in which an insulating layer 154 is provided between the first electrode layer 150 and the electric field light-emitting layer 152. The light-emitting element shown in FIG. 13C has a structure in which an insulating layer 154a is provided between the first electrode layer 150 and the electric field light-emitting layer 152 and an insulating layer 154b is provided between the second electrode layer 153 and the electric field light-emitting layer 152. As described above, an insulating layer may be provided between the electric field light-emitting layer and one of a pair of the electrode layers that sandwiches the electric field light-emitting layer. Alternatively, an insulating layer may be provided between the electric field light-emitting layer and one of a pair of electrode layers that sandwich the electric field light-emitting layer and another insulating layer may be provided between the electric field light-emitting layer and the other one of the pair of electrode layers. The insulating layer may be a single layer or stacked layers including a plurality of layers.

In FIG. 13B, the insulating layer 154 is provided to be in contact with the first electrode layer 150; however, the order of the insulating layer and the electric field light-emitting layer may be reversed so that the insulating layer 154 is provided to be in contact with the second electrode layer 153.

In the case of the dispersion-type inorganic EL, particulate light-emitting materials are dispersed in a binder, so that a film-shaped electric field light-emitting layer is formed. When particles having a desired size cannot be sufficiently obtained by a formation method of a light-emitting material, the light-emitting materials may be processed into particles by crushing in a mortar or the like. The binder is a substance for fixing the particulate light-emitting materials in a dispersion state and holding the light-emitting materials in a form of an electric field light-emitting layer. The light-emitting materials are uniformly dispersed in the electric field light-emitting layer by the binder and are fixed.

In the case of the dispersion-type inorganic EL, as a formation method of an electric field light-emitting layer, a droplet-discharging method capable of selectively forming a light-emitting layer; a printing method (such as screen printing or offset printing); or a coating method such as a spin coating method; a dipping method; a dispenser method; or the like can be used. Although there is no particular limitation on the thickness of the light-emitting layer, the thickness thereof is preferably in the range of 10 to 1000 nm. The ratio of the light-emitting material in the electric field light-emitting layer containing the light-emitting material to the binder may be greater than or equal to 50 wt % and less than or equal to 80 wt %.

Figure 14A:
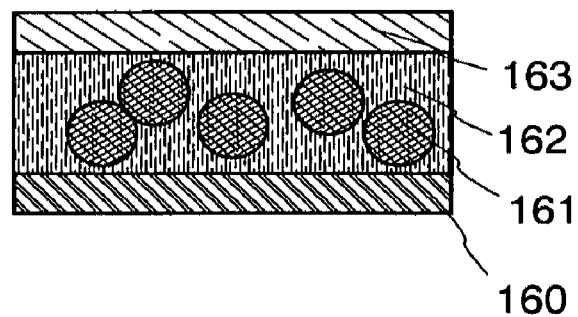
FIGS. 14A to 14C each describe an EL element to which the present invention is applied.
Figure 14B:
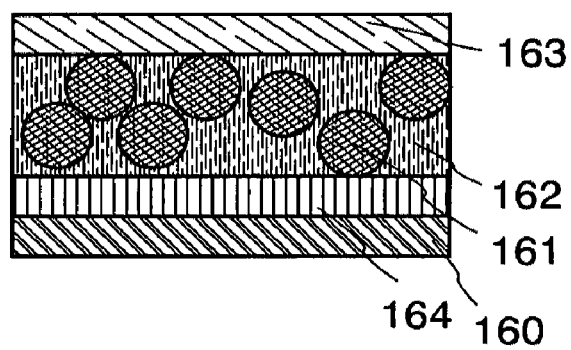
Figure 14C:
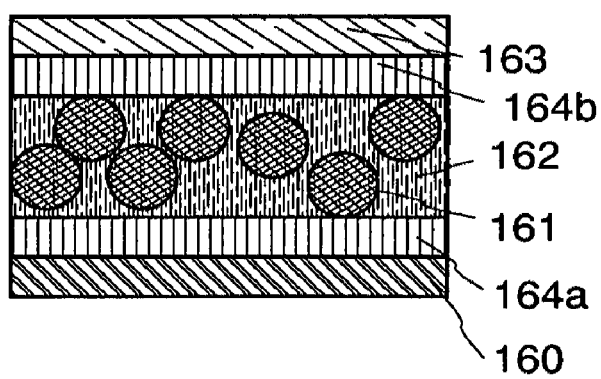

Examples of a dispersion-type inorganic EL element that can be used as a light-emitting element are shown in FIGS. 14A to 14C. The light-emitting element in FIG. 14A has a stacked-layer structure including a first electrode layer 160, an electric field light-emitting layer 162, and a second electrode layer 163, and the electric field light-emitting layer 162 includes a light-emitting material 161 that is held by a binder.

As a binder that can be used in this embodiment mode, an insulating material, an organic material, an inorganic material, or a mixture of an organic material and an inorganic material can be used. As an organic insulating material, polymer that has relatively high dielectric constant like a cyanoethyl cellulose-based resin; or a resin such as polyethylene, polypropylene, a polystyrene-based resin, a silicone resin, an epoxy resin, or vinylidene fluoride can be used. Alternatively, a heat-resistant high molecular material such as aromatic polyamide or polybenzoimidazole, or a siloxane resin may be used. It is to be noted that the siloxane resin corresponds to a resin having Si—O—Si bonds. Siloxane has a skeleton structure formed from a bond of silicon (Si) and oxygen (O) and has an organic group containing at least hydrogen (for example, an alkyl group or aromatic hydrocarbon) as a substituent. Alternatively, as the substituent, a fluoro group may be used. Further alternatively, as the substituent, an organic group containing at least hydrogen, and a fluoro group may be used. A vinyl resin such as polyvinyl alcohol or polyvinyl butyral, or another resin material such as a phenol resin, a novolac resin, an acrylic resin, a melamine resin, a urethane resin, or an oxazole resin (polybenzoxazole) may also be used. A dielectric constant can also be controlled by mixing these resins with microparticles having a high dielectric constant such as barium titanate ($BaTiO_3$) or strontium titanate ($SrTiO_3$) as appropriate.

As the inorganic insulating material contained in the binder, the following can be used: materials such as silicon oxide (SiOx), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, and other substances containing an inorganic insulating material. When an inorganic material having a high dielectric constant is mixed with an organic material (by addition or the like), a dielectric constant of an electric field light-emitting layer including a light-emitting material and a binder can be further controlled and increased.

In the manufacturing process, the light-emitting materials are dispersed in a solution containing a binder. As a solvent of the solution containing a binder that can be used in this embodiment, it is acceptable as long as a solvent dissolves a binder material and can make a solution with the viscosity which is appropriate for a method of forming an electric field light-emitting layer (various wet processes) and for a desired thickness. An organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements shown in FIGS. 14B and 14C have a structure in which an insulating layer is provided between an electrode layer and an electric field light-emitting layer in the light-emitting element of FIG. 14A. The light-emitting element shown in FIG. 14B has a structure in which an insulating layer 164 is provided between the first electrode layer 160 and the electric field light-emitting layer 162. The light-emitting element shown in FIG. 14C has a structure in which an insulating layer 164a is provided between the first electrode layer 160 and the electric field light-emitting layer 162 and an insulating layer 164b is provided between the second electrode layer 163 and the electric field light-emitting layer 162. As described above, an insulating layer may be provided between the electric field light-emitting layer and one of a pair of the electrode layers that sandwiches the electric field light-emitting layer. Alternatively, an insulating layer may be provided between the electric field light-emitting layer and one of a pair of electrode layers that sandwich the electric field light-emitting layer and another insulating layer may be provided between the electric field light-emitting layer and the other one of the pair of electrode layers. The insulating layer may be a single layer or stacked layers including a plurality of layers.

In FIG. 14B, the insulating layer 164 is provided to be in contact with the first electrode layer 160; however, the order of the insulating layer and the electric field light-emitting layer may be reversed so that the insulating layer 164 is provided to be in contact with the second electrode layer 163.

Figure 15A:
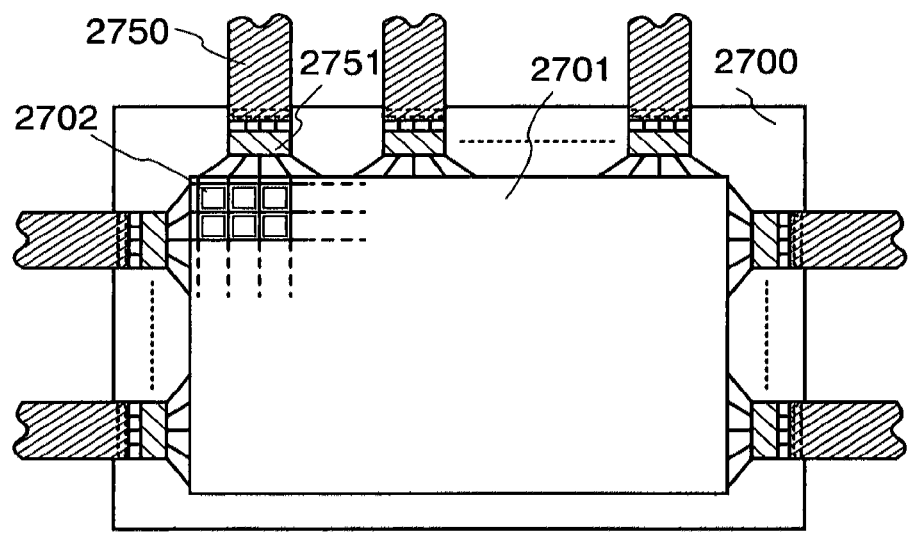
FIGS. 15A and 15B each describe a liquid crystal panel to which the present invention is applied.
Figure 15B:
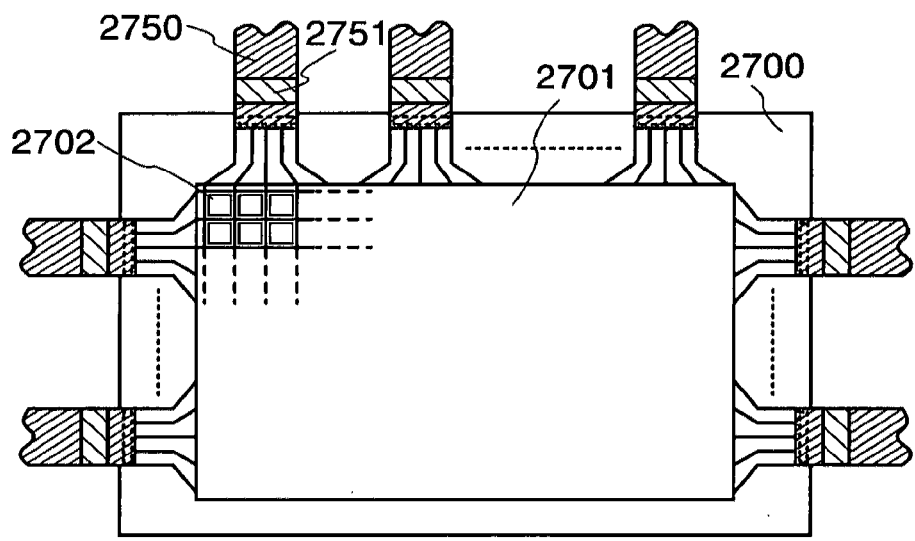

Insulating layers such as the insulating layer 154 in FIG. 13B and the insulating layer 164 in FIG. 15B are not particularly limited; however, it is preferable that the insulating layer has high withstand voltage, be a dense film, and furthermore have a high dielectric constant. For example, the insulating layer can be formed using silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like; a mixed film thereof; or a stacked-layer film containing two or more kinds of these. These insulating films can be formed by a sputtering method, an evaporating method, a CVD method, or the like. Alternatively, the insulating layer may be formed in such a manner that particles of these insulating materials are dispersed in a binder. A binder material may be formed of a material that is similar to a binder contained in an electric field light-emitting layer and may be formed by a similar method. Although there is no particular limitation on a thickness of the insulating layer, the thickness thereof is preferably in the range of 10 to 1000 nm.

The light-emitting elements shown in this embodiment mode can obtain light emission by applying a voltage between a pair of electrode layers that sandwich the electric field light-emitting layer; however, the light-emitting element can also operate by either DC driving or AC driving.

As described above, a light-emitting element can be formed. By forming a TFT substrate used in a display device by applying the present invention, size of crystal grains in a semiconductor layer can be made to be large and positions where grain boundaries are formed can be controlled. Consequently, a polycrystalline semiconductor layer formed of large-sized crystal grains, with a small number of grain boundaries existing in a channel length direction, can be obtained. Accordingly, a TFT with high mobility in a semiconductor layer can be formed, and display performance of a light-emitting device can be improved. In particular, the light-emitting device of the present invention is preferably used for a driver circuit.

Further, by the present invention, since mobility of a semiconductor layer of a TFT improves, a TFT with a favorable electrical characteristic can be manufactured.

Since a TFT having a favorable electrical characteristic can be manufactured by the present invention, a circuit element with higher performance than before can be formed. Accordingly, a display device with more added value than before can be manufactured over a glass substrate.

Embodiment Mode 4

Next, a mode in which a driver circuit for driving is mounted to a display panel manufactured in Embodiment Modes 2 and 3 is described.

A general mode of a display device provided with a driver circuit is described below.

Figure 16A:
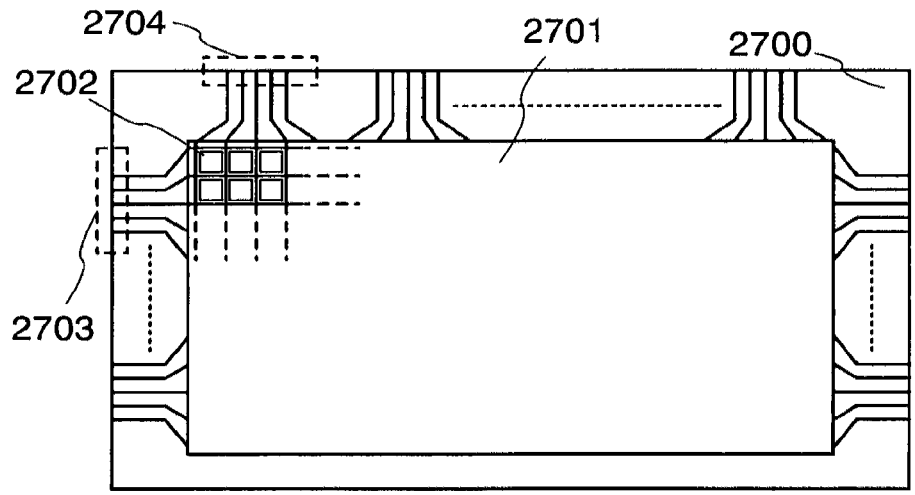
FIGS. 16A to 16C each describe a liquid crystal panel to which the present invention is applied.

First, a display device employing a COG method will be described with reference to FIG. 16A. A pixel portion 2701 for displaying information of characters, images, or the like is provided over a substrate 2700. The pixel portion 2701 includes a plurality of pixels 2702 arranged in matrix. A substrate provided with a plurality of driver circuits is divided into rectangles to manufacture driver ICs, and the manufactured driver ICs are mounted to the substrate 2700. FIG. 15A shows a mode of mounting a plurality of driver ICs 2751 and FPCs 2750 mounted on the ends of the driver ICs 2751. Alternatively, the size of division may be made almost equal to the length of a side of the pixel portion on a signal line side, and a tape may be mounted on the end of the single driver IC.

Alternatively, a TAB method may be employed. In that case, a plurality of tapes may be attached and driver ICs may be mounted on the tapes as shown in FIG. 15B. Similarly to the case of a COG method, a single driver IC may be mounted on a single tape. In this case, a metal piece or the like for fixing the driver IC may be attached together in terms of intensity.

A plurality of driver ICs to be mounted on a display panel are preferably formed over a rectangular substrate having a size of 300 mm to 1000 mm, or a side longer than 1000 mm for the sake of improvement in productivity.

In other words, a plurality of circuit patterns each including a driver circuit portion and an input-output terminal as a unit may be formed over the substrate and may be lastly divided to be used. In consideration of the side length of the pixel portion or the pixel pitch, the driver IC may be formed to be a rectangle having a long side of 15 mm to 80 mm and a short side of 1 mm to 6 mm. Alternatively, the driver IC may be formed to have the same side length as that of the pixel portion, or a length obtained by adding a side length of the pixel portion to a side length of each driver circuit.

An advantage in the external dimension of the driver IC over an IC chip is the length of the long side. When the driver IC having a long side length of 15 mm to 80 mm is used, the number of the driver ICs necessary for being mounted in accordance with the pixel portion is less than that in the case of using an IC chip. Therefore, yield in manufacturing can be improved. Also, in the present invention, a driver IC can be formed over a glass substrate, and in this case, productivity is not decreased because there is no limitation on the shape of a substrate used as a base. This is a great advantage compared to the case of taking IC chips out of a circular silicon wafer.

Figure 16B:
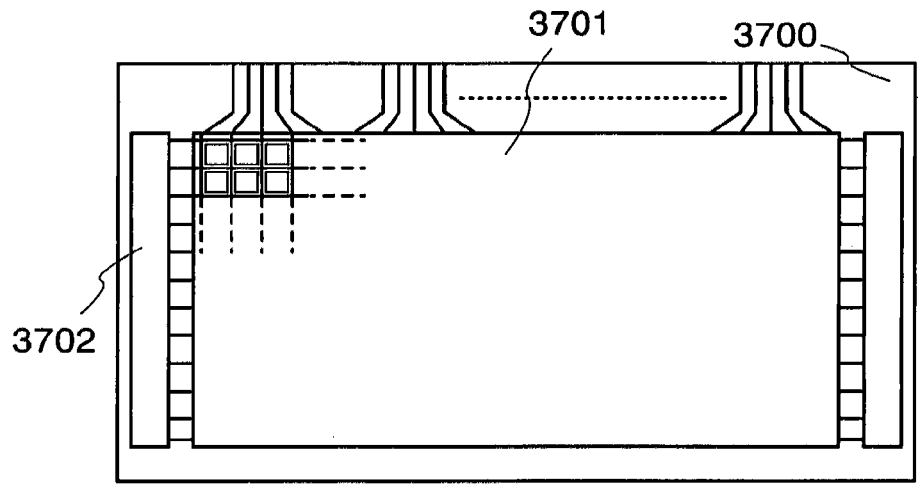

When a scanning line driver circuit 3702 is formed in an integrated manner over a substrate 3700 as shown in FIG. 16B, a driver IC provided with a signal line driver circuit is mounted on a region outside a pixel portion 3701. The driver IC is a signal line driver circuit. In order to form a pixel region corresponding to RGB full color, 3072 signal lines are required for an XGA class and 4800 signal lines are required for a UXGA class. The signal lines formed in such a number are divided into several blocks at the end of the pixel portion 3701, and lead lines are formed. The signal lines are gathered corresponding to the pitch of output terminals of the driver ICs.

In the present invention, the driver IC is formed of a crystalline semiconductor film formed over a substrate. By applying the present invention, the crystalline semiconductor film may be formed by irradiation with CW laser light or pseudo CW laser light. By applying the present invention, it is possible to form a TFT using a polycrystalline semiconductor layer with little crystal defects and large crystal grain size. In addition, high-speed driving is possible because mobility or response speed is high, and it is possible to further improve an operating frequency of an element, compared to the conventional element. This is because by applying the present invention, crystal grains extend in a channel length direction, and the number of crystal boundaries that exist in a channel length direction of a transistor is small. It is to be noted that the channel length direction corresponds to a current flowing direction, in other words, a direction in which electric charge moves in a channel formation region.

Further, in order to perform laser crystallization, it is preferable to significantly narrow down laser light. In the present invention, since the shape of laser light is linear, enough and effective energy density for an object to be irradiated can be secured. The term "linear" used herein refers to not a line in a strict sense but a rectangle or an oblong with a large aspect ratio, and there may be a certain width in a minor axis direction.

Figure 16C:
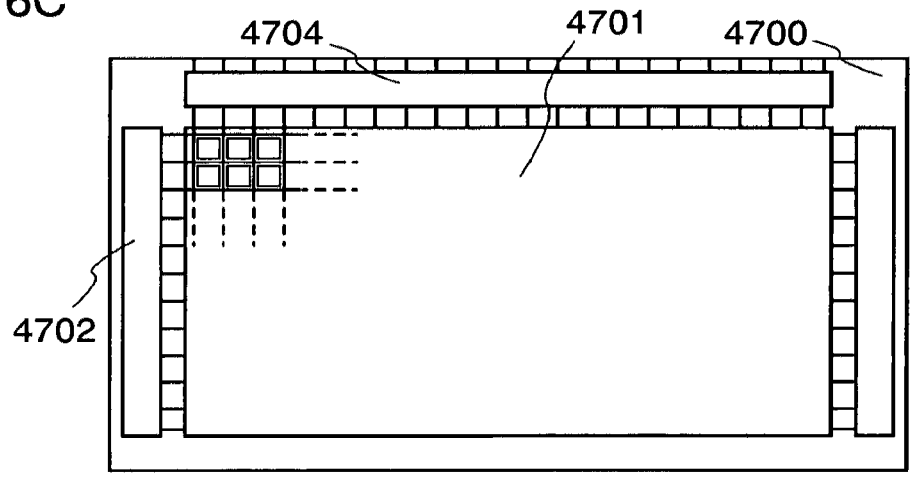

In the present invention, as shown in FIG. 16C, a pixel portion 4701 is formed over a substrate 4700 and a signal line driver circuit 4702 and a scanning line driver circuit 4703 are formed in an integrated manner over the substrate 4700.

In the pixel region, the signal line and the scanning line intersect to form a matrix, and transistors are arranged corresponding to each intersection. One feature of the present invention is that a TFT having a crystalline semiconductor film as a channel forming portion is used as the transistor arranged in the pixel region. In the present invention, since mobility in a semiconductor layer of the TFT is high, a display panel in which system-on-panel is realized can be manufactured.

When the thicknesses of the driver IC and the counter substrate are set equal to each other, a distance therebetween is almost constant, which contributes to thinning of a display device as a whole. When both substrates are formed of the same material, thermal stress is not generated and characteristics of a circuit formed of a TFT are not damaged even when a temperature change is caused in the display device. Furthermore, the number of the driver ICs to be mounted on one pixel region can be reduced by mounting longer driver ICs than IC chips as driver circuits as described in this embodiment mode.

In the above manner, a driver circuit can be incorporated into a display panel. By the present invention, since a semiconductor film with high mobility can be formed, a higher performance display device can be provided.

Embodiment Mode 5

Figure 20A:
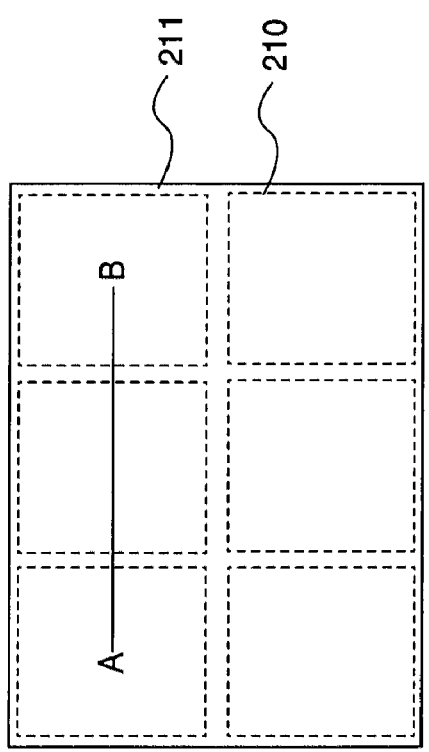
FIGS. 20A and 20B each describe a manufacturing method of a semiconductor device of the present invention.
Figure 20B:
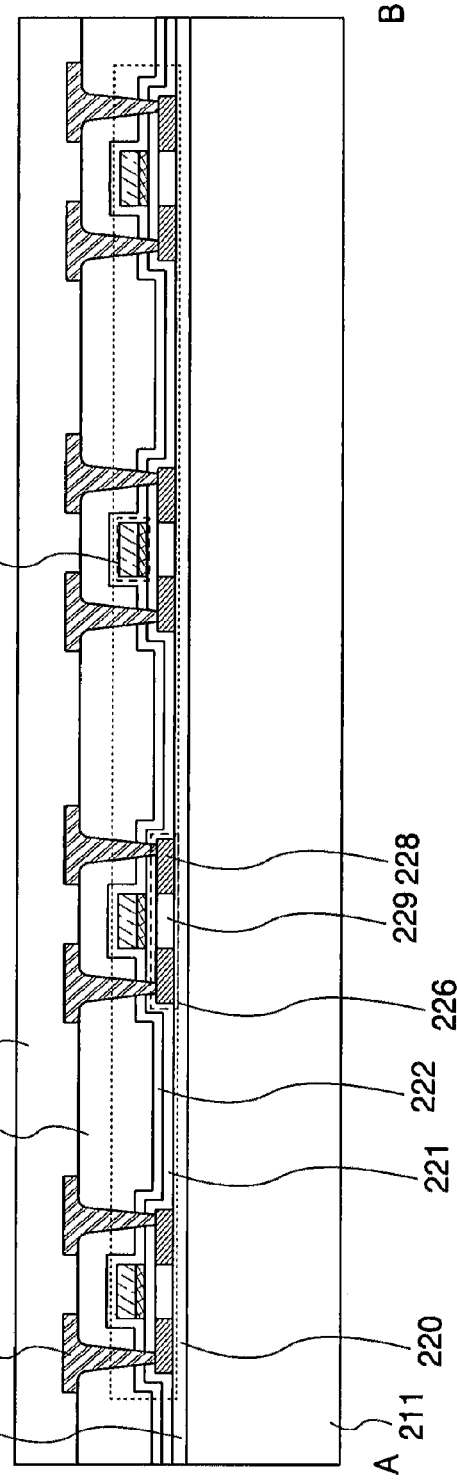
Figure 21A:
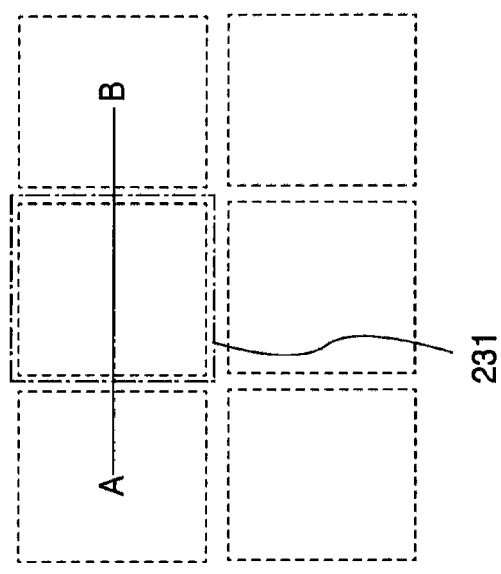
FIGS. 21A and 21B each describe a manufacturing method of a semiconductor device of the present invention.
Figure 21B:
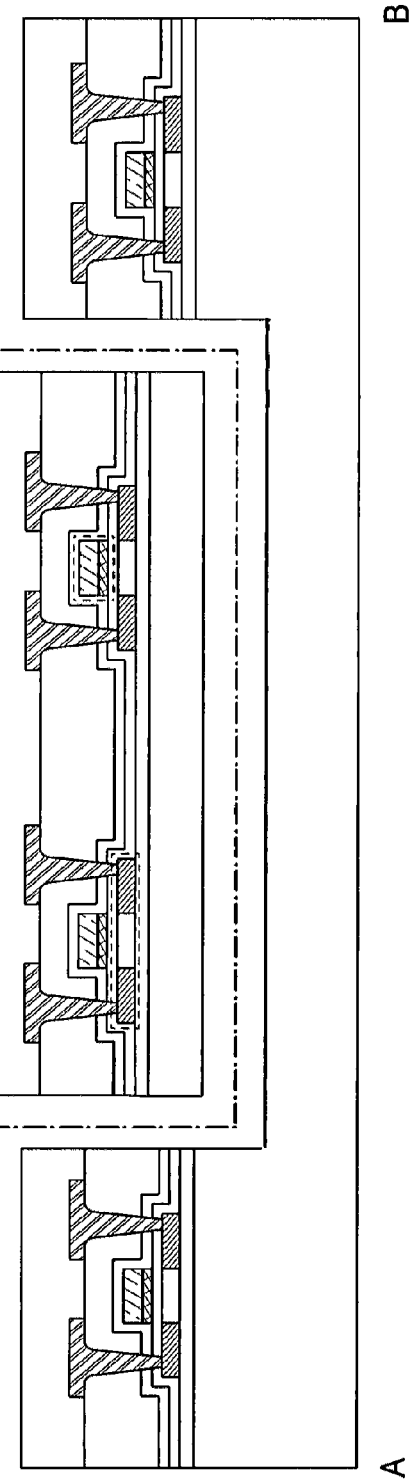
Figure 22A:
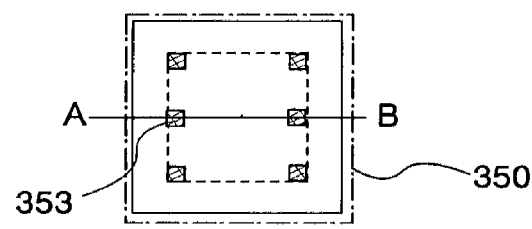
FIGS. 22A and 22B each describe a semiconductor device to which the present invention is applied.
Figure 22B:
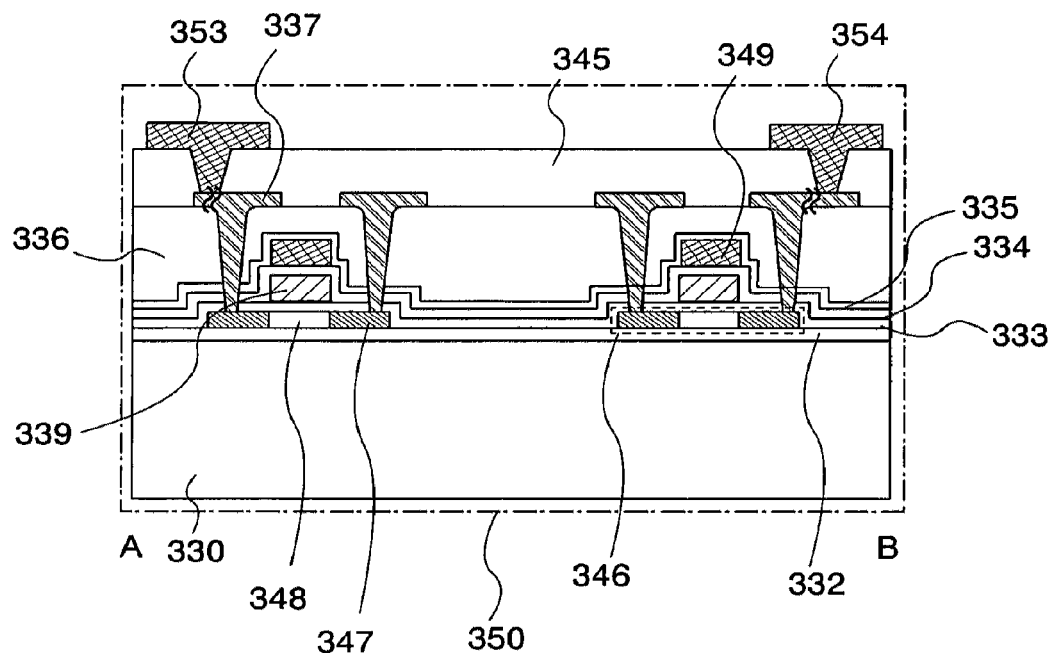

A mode other than a display device of a semiconductor device to which the present invention is applied is described with reference to FIGS. 20A to 22B. Specifically, a semiconductor device capable of wireless communication is described. In this embodiment mode, a case where six semiconductor devices are manufactured over a substrate 211 is described. Note that in FIGS. 20A, 21A, and 22A, a region in which one semiconductor device is provided corresponds to a region 210 that is surrounded by a dotted line. FIGS. 20B, 21B, and 22B correspond to cross-sectional views of FIGS. 20A, 21A, and 22A, respectively, along a line connecting point A and point B.

First, an insulating layer 219 is formed over the substrate 211 (see FIG. 20B). Next, a layer including a plurality of transistors 220 is formed over the insulating layer 219. Then, an insulating layer 222 and an insulating layer 223 are formed over the layer including a plurality of transistors 220. Subsequently, through opening portions provided in the insulating layer 222 and the insulating layer 223, conductive layers 224 each connecting to a source region or drain region of each of the plurality of transistors 220 are formed. Next, an insulating layer 225 is formed so as to cover the conductive layers 224.

As the substrate 211, a glass substrate, a plastic substrate, a quartz substrate, or the like may be used. Preferably, a glass substrate or a plastic substrate is used. It is acceptable as long as the substrate has an insulating property, and has necessary heat resistance and the like. When a glass substrate or a plastic substrate is used as the substrate 211, it is easy to manufacture a semiconductor device with a side of 1 m or longer, as well as to manufacture a semiconductor device with a desired shape.

The insulating layer 219 serves as a barrier against a contaminant (such as an impurity contained in the substrate) from the outside. The insulating layer 219 is formed as a single layer or stacked layers, by a sputtering method, a plasma CVD method, or the like using a silicon oxide based material or a silicon nitride based material. Note that the insulating layer 219 does not have to be provided if it is not necessary.

Each of the plurality of transistors 220 includes a polycrystalline semiconductor layer 226, an insulating layer 221, and a conductive layer 227. For crystallization of the polycrystalline semiconductor layer 226, a method described in Embodiment Mode 1 may be used. The polycrystalline semiconductor layer 226 includes an impurity region 228 that serves as a source region or drain region, and a channel forming region 229. An impurity element imparting N-type or P-type conductivity is added to the impurity region 228. Specifically, an impurity element imparting N-type conductivity (an element belonging to Group 15 of the periodic table, for example, phosphorus (P) or arsenic (As)), or an impurity element imparting P-type conductivity (for example, boron (B)) is added. Also, although not particularly shown in the figure, an LDD region is preferably formed.

Note that in the structure shown in the figure, although only the plurality of transistors 220 are formed, the present invention is not limited thereto. For example, an element provided over the substrate 211 may be appropriately adjusted according to use of a semiconductor device. For example, in a case of forming a semiconductor device with a function of transmitting and receiving electromagnetic waves, the structure may be that only the plurality of transistors are provided over the substrate 211, or the plurality of transistor and a conductive layer serving as an antenna may be formed over the substrate 211. Note that the conductive layer serving as an antenna may be formed as stacked layers of a plurality of layers, instead of a single layer. Also, in a case of forming a semiconductor device with a function of storing data, a storage element (such as a transistor, a memory transistor) may also be formed over the substrate 211. Also, a semiconductor device (such as a CPU or a signal generating circuit) with a function of controlling a circuit, a function of generating a signal, or the like may be formed. Further, in addition to the foregoing, a resistor, a capacitor, or the like may be formed as necessary.

The insulating layer 222 and the insulating layer 223 are each formed as a single layer or stacked layers by an SOG (spin on glass) method, a droplet discharging method, a screen printing method, or the like using an inorganic material or an organic material. For example, the insulating layer 222 may be formed of a silicon nitride based material and the insulating layer 223 may be formed of a silicon oxide based material.

When a release layer is included, a laminated body 231 including the plurality of transistors 220 may be peeled off of the substrate 211. A semiconductor device including a TFT made of the laminated body 231 can be manufactured. Also, by transferring the peeled laminated body 231 to a flexible substrate, a bendable semiconductor device can be manufactured.

Here, an example of a structure of a semiconductor device of the present invention is described with reference to FIG. 17. A semiconductor device 100 of the present invention has an arithmetic processing circuit 101, a memory circuit 103, an antenna 104, a power source circuit 108, a demodulation circuit 110, and a modulation circuit 111. The antenna 104 and the power source circuit 108 are essential component parts of the semiconductor device 100, and the other parts are appropriately provided in accordance with the use of the semiconductor device 100.

The arithmetic processing circuit 101 analyzes an order, controls the memory circuit 103, outputs data which is transmitted to an exterior portion to the modulation circuit 111, and the like, on the basis of a signal which is inputted from the demodulation circuit 110.

The memory circuit 103 has a circuit including a memory element and a control circuit which writes and reads data. The memory circuit 103 stores at least an identification number of the semiconductor device itself. The semiconductor device is distinguished from another semiconductor device by the identification number. In addition, the memory circuit 103 has one or a plurality of an organic memory, a DRAM (Dynamic Random Access Memory), a SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a structure in which a layer containing an organic compound is interposed between a pair of conductive layers. The organic memory has a simple structure, and therefore, has at least two advantages. One advantage is that a manufacturing process can be simplified and the cost can be reduced. The other advantage is that an area of a stacked-layer body can be easily reduced and an organic memory with large capacity can be easily realized. Further, since an organic memory is a nonvolatile memory, a battery may or may not be incorporated. Accordingly, it is preferable to use an organic memory as the memory circuit 103.

The antenna 104 converts a carrier wave which is supplied from a reader/writer 112 into an AC electrical signal. In addition, load modulation is applied by the modulation circuit 111 to a signal transmitted from the semiconductor device 100. The power source circuit 108 generates a power source voltage by using the AC electric signal from the antenna 104 and supplies the power source voltage to the circuits.

The demodulation circuit 110 demodulates the AC electric signal from the antenna 104 and supplies the demodulated signal to the arithmetic processing circuit 101. The modulating circuit 111 applies load modulation to the antenna 104 based on the signal supplied from the arithmetic processing circuit 101.

The reader/writer 112 receives the load modulation applied to the antenna 104 as a carrier wave. The reader/writer 112 transmits the carrier wave to the semiconductor device 100. Note that the carrier wave refers to an electromagnetic wave received or transmitted by the reader/writer 112, and the reader/writer 112 receives the carrier wave which is modulated by the modulating circuit 111.

A semiconductor device of the present invention having a function of transmitting and receiving electromagnetic waves wirelessly, which is described above, is referred to as an RFID (Radio Frequency Identification) tag, an RF chip, an RF tag, an IC chip, an IC tag, an IC label, a wireless chip, a wireless tag, an electronic chip, an electronic tag, a wireless processor, a wireless memory, or the like. This embodiment mode can be freely combined with another embodiment mode.

As described above, a TFT substrate used for a semiconductor device such as an RFID tag can be formed by applying the present invention. By applying the present invention, size of crystal grains in a semiconductor layer can be made to be large, and positions where grain boundaries are formed can be controlled; consequently, a polycrystalline semiconductor layer formed of large-sized crystal grains, with a small number of grain boundaries existing in a channel length direction, can be obtained. Accordingly, a TFT with high mobility in a semiconductor layer can be formed.

Further, by the present invention, since mobility of a semiconductor layer of a TFT improves, a TFT with a favorable electrical characteristic can be manufactured.

Since a TFT having a favorable electrical characteristic can be manufactured by the present invention, a circuit element with higher performance than before can be formed. Accordingly, a semiconductor device with more added value than before can be manufactured over a glass substrate.

Embodiment Mode 6

The present invention can also be applied to a storage element including a crystalline semiconductor layer. As an example thereof, a NOR-type flash memory manufactured by applying the present invention is described with reference to FIGS. 22A to 23. A NOR-type flash memory is attached to for example a motherboard (also called "main board"), and is used for recording a BIOS (basic input output system). Note that a motherboard is a part of a computer, and is a substrate to which a variety of modules such as a CPU is attached.

In manufacturing a flash memory, many steps in a manufacturing method of a TFT is similar to those of the RFID tag described in Embodiment Mode 5. A structure of a memory element 350 is described below. First, an insulating layer 332 is formed over one surface of a substrate 330. Next, a layer including a plurality of transistors that is formed of semiconductor layers 346 is formed over the insulating layer 332. The semiconductor layer 346 includes an impurity region 347 and a channel forming region 348. Subsequently, an insulating layer 333, a floating gate layer 339, and an insulating layer 334 are formed over the layer including a plurality of transistors. Next, a conductive layer 349 is formed, and then an insulating layer 335 and an insulating layer 336 are formed. Subsequently, through opening portions provided in the insulating layer 333, the insulating layer 334, the insulating layer 335, and the insulating layer 336 in the plurality of transistors, conductive layers 337 each connecting to a source region or drain region of each of the plurality of transistors are formed. Then, an insulating layer 345 is formed so as to cover the conductive layers 337.

For the substrate 330, a glass substrate, a plastic substrate, a quartz substrate, or the like may be used. Preferably, a glass substrate or a plastic substrate is used. When a glass substrate or a plastic substrate is used as the substrate 330, it is easy to manufacture a semiconductor device with a side of 1 m or longer, as well as to manufacture a semiconductor device with a desired shape.

The insulating layer 332 has a role of preventing entrance of an impurity from the substrate 330. The insulating layer 332 is formed as a single layer or stacked layers by a sputtering method, a plasma CVD method, or the like using a silicon oxide based film or a silicon nitride based film. Note that the insulating layer 332 does not have to be provided when it is not necessary. Silicon is used for the semiconductor layer 346. A method of forming the semiconductor layer 346 is similar to that of Embodiment Mode 5.

For the semiconductor layer 346, a crystalline semiconductor film obtained by crystallizing an amorphous semiconductor film is used. For the crystallization, the method described in Embodiment Mode 1 may be used. The semiconductor layer 346 includes the impurity region 347 serving as a source region or drain region, and the channel forming region 348. An impurity element imparting N-type conductivity (an element belonging to Group 15 of the periodic table, for example, phosphorus or arsenic), or an impurity element imparting P-type conductivity (for example, boron or aluminum) is added to the impurity region 347. In introducing the impurity, a method using a diffusion source, an ion implantation method, or the like may be used. Although not shown in the figure, an LDD region is preferably formed between the impurity region 347 and the channel forming region 348. The insulating layer 333 and the insulating layer 334 can be formed similarly to the insulating layer 332.

The insulating layer 335 and the insulating layer 336 are each formed as a single layer or as stacked layers by an SOG (spin on glass) method, a droplet discharging method, a screen printing method, or the like, using an inorganic material or an organic material. For example, the insulating layer 335 may be formed of silicon oxynitride and the insulating layer 336 may be formed of silicon nitride oxide. Also, the insulating layer 335 and the insulating layer 336 may be formed by a sputtering method, a plasma CVD method, or the like similarly to the insulating layer 332, the insulating layer 333, and the insulating layer 334.

The floating gate layer 339, the conductive layers 337, and the conductive layer 349 are each formed of a substance having a conductive property. For the formation, a CVD method, a sputtering method, a droplet discharging method, or the like may be used. Also, the floating gate layer 339, the conductive layers 337, and the conductive layer 349 may each be formed as a single layer or as stacked layers.

The insulating layer 345 is formed as a single layer or stacked layers by an SOG (spin on glass) method, a droplet discharging method, a screen printing method, or the like, using an inorganic material or an organic material, similarly to the insulating layer 335 and the insulating layer 336. The insulating layer 345 may be formed by a sputtering method, a plasma CVD method, or the like similarly to the insulating layer 332, the insulating layer 333, and the insulating layer 334.

In a similar manner to Embodiment Mode 2, an electrode layer 353 and an electrode layer 354 are formed in regions of the conductive layers 337 that are exposed, by a screen printing method. After the electrode layers are formed, elements are separated from each other.

Note that although only a transistor is formed in the structure shown in the figure, the present invention is not limited to this structure. An element provided over the substrate 330 may be appropriately adjusted according to use of a semiconductor device. For example, an erasing voltage control circuit may be mounted. Another element such as a resistor or a capacitor may be formed as necessary.

Figure 23:
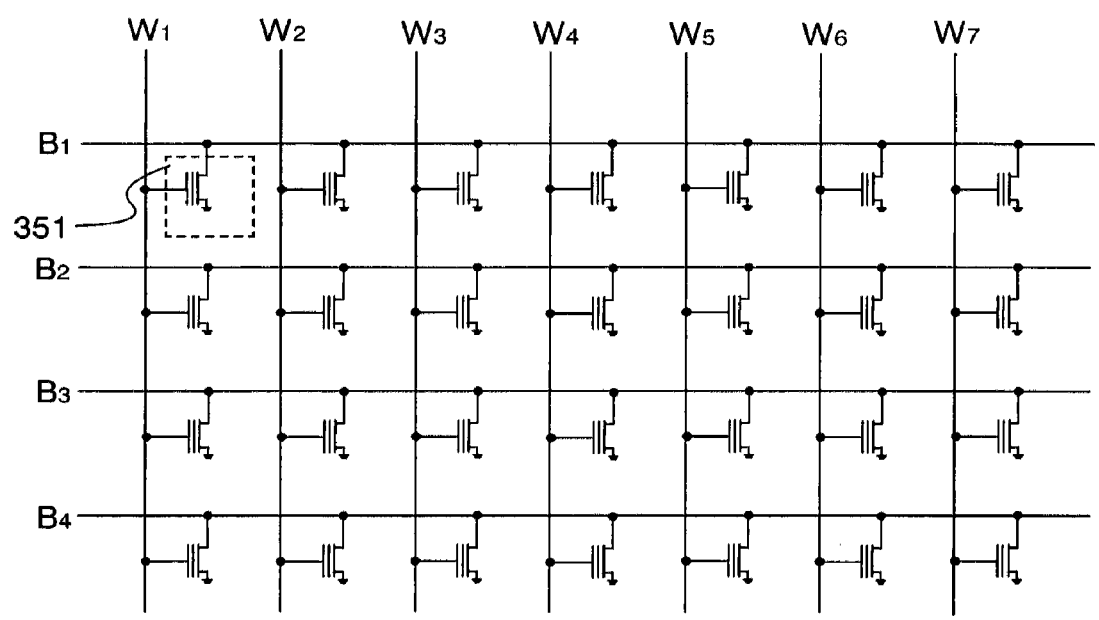
FIG. 23 describes a semiconductor device to which the present invention is applied.

An example of a circuit diagram of the above-mentioned flash memory is shown in FIG. 23. Writing and reading operations are performed using word lines $W_1$ to $W_7$ and bit lines $B_1$ to $B_4$. The word lines and the bit lines are connected to their respective circuits that control their operations. Alternatively, in a later step, the word lines and the bit lines may be connected to wirings that extend to circuits that control their operations. Also, each word line is connected to a gate electrode in a memory element, and each bit line is connected to a source electrode or drain electrode in the memory element. Further, a region 351 that is surrounded by a dotted line corresponds to a unit memory element.

Although not shown in the figure, by employing a multi-layer wiring structure, mounting a device with a more complicated circuit structure in a small size is also possible.

Note that although only a NOR-type flash memory is described herein, it is needless to say that the present invention can also be applied to a NAND-type flash memory.

As described above, a TFT substrate used for a semiconductor device such as a flash memory can be formed by applying the present invention. By applying the present invention, size of crystal grains in a semiconductor layer can be made to be large, and positions where grain boundaries are formed can be controlled; consequently, a polycrystalline semiconductor layer formed of large-sized crystal grains, with a small number of grain boundaries existing in a channel length direction, can be obtained. Accordingly, a TFT with high mobility in a semiconductor layer can be formed.

Further, by the present invention, since mobility of a semiconductor layer of a TFT improves, a TFT with a favorable electrical characteristic can be manufactured.

Since a TFT having a favorable electrical characteristic can be manufactured by applying the present invention, a circuit element with higher performance than before can be formed. Accordingly, a semiconductor device with more added value than before can be manufactured over a glass substrate.

Embodiment Mode 7

The present invention can also be applied to a photoelectric conversion device including a crystalline semiconductor layer. An example thereof is described with reference to FIG. 24.

Note that a photoelectric conversion element refers to an independent laminated body of thin films including one photoelectric conversion layer, and a photoelectric conversion device refers to one photoelectric conversion element or an aggregation of a plurality of photoelectric conversion elements, or a semiconductor including one or a plurality of photoelectric conversion elements and another element. For example, photoelectric conversion devices having sensitivity to light of ultraviolet light to infrared light are collectively called light sensors. The photoelectric conversion element is mounted to, for example, a display device, and is used to detect brightness of the periphery and to adjust display luminance. Also, in addition to brightness of the periphery, by detecting luminance of the display device by a light sensor, adjustment of the luminance of a display portion is also possible. Specifically, luminance of a backlight of a liquid crystal display device is detected by a light sensor, and luminance of a display screen is adjusted.

A photoelectric conversion device is also called a photo diode. Photodiodes are largely classified into four types: a pn type, a pin type, a Schottky type, and an avalanche type. A pn photodiode is formed of a photoelectric conversion element obtained by bonding a p-type semiconductor and an n-type semiconductor, and the pin photodiode has a structure in which an intrinsic semiconductor is interposed between a p-type semiconductor and an n-type semiconductor in a pn photodiode. The pn-type has a small dark current, but response speed is slow. The pin type has fast response speed, but has a large dark current. Note that, here, a p-type semiconductor is a semiconductor that mainly uses holes as carriers for transporting charge due to lack of electrons, an n-type semiconductor is a semiconductor that mainly uses electrons as carriers for transporting charge due to excess of electrons, and an intrinsic semiconductor is a semiconductor that is made of a semiconductor material of high purity. A Schottky-type photodiode is a photoelectric conversion element obtained by forming a thin film layer of gold instead of a p-type semiconductor layer, and bonding the thin film layer of gold with an n layer. An avalanche-type photodiode is a high-speed and high-sensitivity photoelectric conversion element by which photoelectric current is doubled by applying a reverse bias voltage. In this embodiment mode, the pin type is described.

Figure 24:
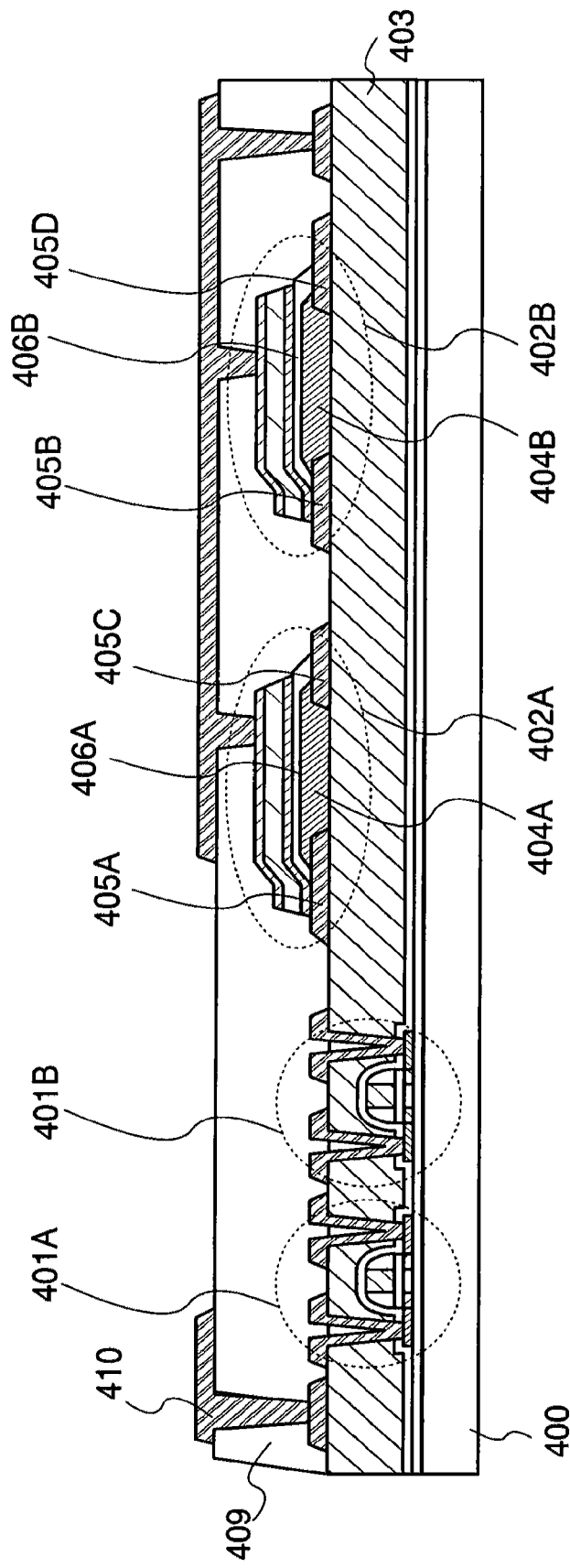
FIG. 24 describes a semiconductor device to which the present invention is applied.

FIG. 24 shows a cross-sectional diagram of a photoelectric conversion device including a TFT 401A and a TFT 401B formed over a substrate 400; a color filter layer 404A and a color filter layer 404B in a photoelectric conversion element portion 402A and a photoelectric conversion element portion 402B, respectively, formed over an interlayer insulating layer 403; and a light-blocking layer 405C and a light-blocking layer 405D made of the same material as that of a first conductive layer 405A and a first conductive layer 405B in the photoelectric conversion element portion 402A and the photoelectric conversion element portion 402B. By the first conductive layer 405A and the light-blocking layer 405C blocking light, light can be blocked from entering a photoelectric conversion layer of the photoelectric conversion element portion 402A from an end portion thereof, and only light that passes through the color filter layer 404A enters the photoelectric conversion layer. Also, by the first conductive layer 405B and the light-blocking layer 405D blocking light, light can be blocked from entering a photoelectric conversion layer of the photoelectric conversion element portion 402B from an end portion thereof, and only light that passes through the color filter layer 404B enters the photoelectric conversion layer. Therefore, the photoelectric conversion element portion 402A and the photoelectric conversion element portion 402B serve as color sensors. Also, the color filter layer 404A and the color filter layer 404B, and an overcoat layer 406A and an overcoat layer 406B serve as protection layers. The overcoat layer 406A serves to protect the photoelectric conversion layer of the photoelectric conversion element portion 402A so that various impurity elements contained in the color filter layer 404A do not diffuse into the photoelectric conversion layer, and the overcoat layer 406B serves to protect the photoelectric conversion layer of the photoelectric conversion element portion 402B so that various impurity elements contained in the color filter layer 404B do not diffuse into the photoelectric conversion layer. Further, a second conductive layer 410 over an insulating layer 409 is connected to a contact electrode that is electrically connected to an external circuit.

By applying the present invention to such a photoelectric conversion device, a photoelectric conversion device with high conversion efficiency can be manufactured.

In the above manner, a photoelectric conversion device can be formed by applying the present invention. By applying the present invention, size of crystal grains in a semiconductor layer can be made to be large, and positions where grain boundaries are formed can be controlled; consequently, a polycrystalline semiconductor layer formed of large-sized crystal grains, with a small number of grain boundaries existing in a channel length direction, can be obtained. Accordingly, a TFT with high carrier mobility can be formed.

Further, by the present invention, since mobility of a semiconductor layer of a TFT improves, a TFT with a favorable electrical characteristic can be manufactured.

Since a TFT having a favorable electrical characteristic can be manufactured, a circuit element with higher performance than before can be formed. Accordingly, a semiconductor device with more added value than before can be manufactured over a glass substrate.

Embodiment Mode 8

By applying the present invention, a CPU (central processing unit) can be formed over an insulating substrate.

Figure 29:
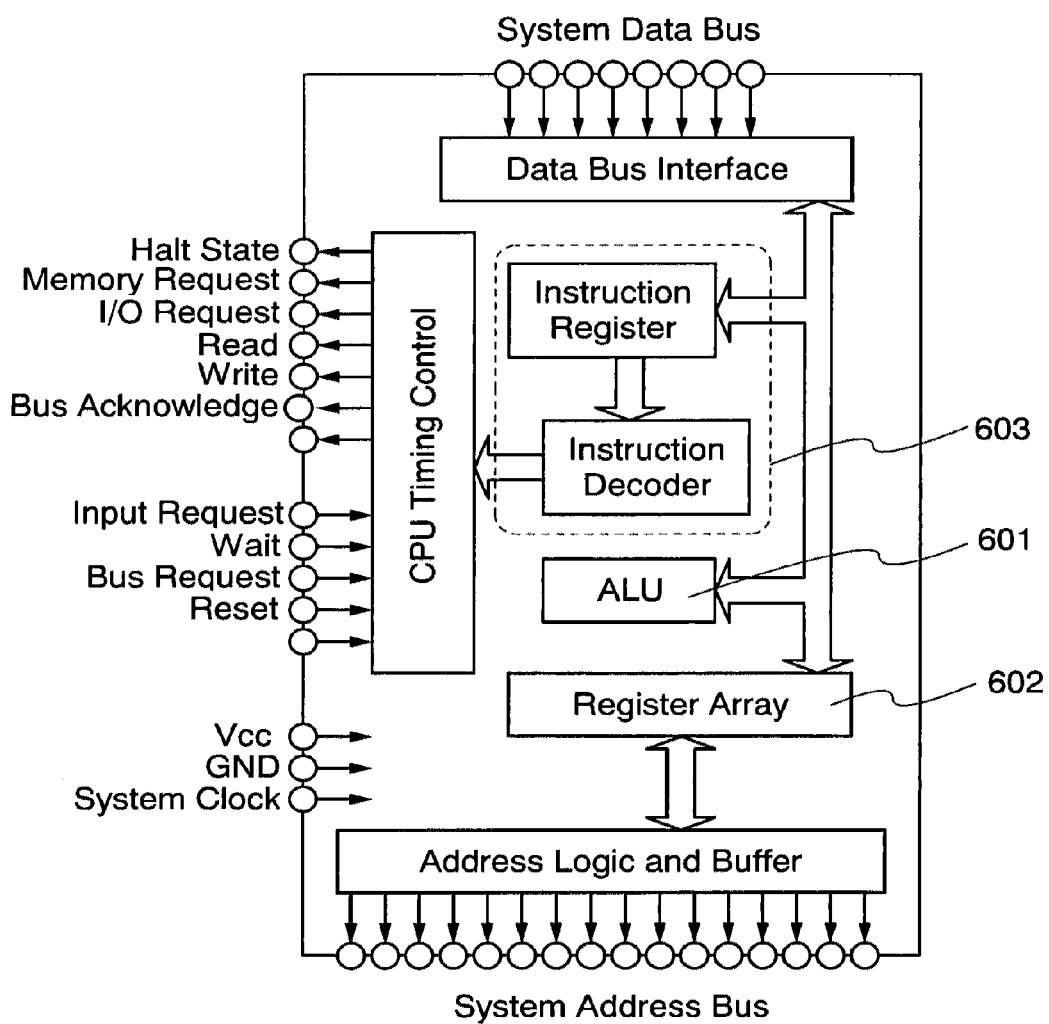
FIG. 29 describes a semiconductor device to which the present invention is applied.

A block diagram of a CPU of this embodiment mode is shown in FIG. 29. This CPU is a CISC (complex instruction set computer) of a standard structure including an arithmetic device (ALU: arithmetic and logic unit) 601, a universal register 602, an instruction decoder portion 603, and the like.

In particular, by forming a highly integrated circuit such as a CPU over a flexible substrate such as a plastic substrate, a light-weight semiconductor device with excellent shock resistance and flexibility can be manufactured.

In the above manner, a CPU can be formed by applying the present invention. By applying the present invention, size of crystal grains in a semiconductor layer can be made to be large, and positions where grain boundaries are formed can be controlled; consequently, a polycrystalline semiconductor layer formed of large-sized crystal grains, with a small number of grain boundaries existing in a channel length direction, can be obtained. Accordingly, a TFT with high mobility in the semiconductor layer can be formed.

Further, by the present invention, since carrier mobility of a TFT improves, a TFT with a favorable electrical characteristic can be manufactured.

Since a TFT having a favorable electrical characteristic can be manufactured by applying the present invention, a circuit element with higher performance than before can be formed. Accordingly, a semiconductor device with more added value than before can be manufactured over a glass substrate.

Embodiment Mode 9

By applying the present invention, a variety of display devices can be manufactured. That is, the present invention can be applied to a variety of electronic appliances in which such display devices are incorporated in display portions thereof.

Such electronic appliances correspond to a camera such as a video camera or a digital camera, a projector, a head mount display (goggle type display), a car navigation system, a car stereo, a personal computer, a game machine, a portable information terminal (such as a mobile computer, a portable phone, or an electronic book), an image reproducing device equipped with a recording medium (specifically, a device which reproduces a recording medium such as a digital versatile disk (DVD) and which has a display for displaying the image), and the like. Examples of those are shown in FIGS. 18A to 18D.

Figure 18A:
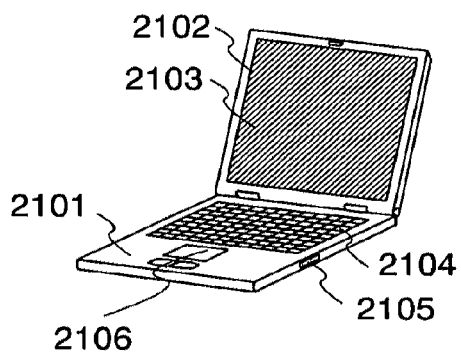
FIGS. 18A to 18D each describe a semiconductor device to which the present invention is applied.

FIG. 18A shows a computer including a main body 2101, a housing 2102, a display portion 2103, a keyboard 2104, an external connection port 2105, a pointing mouse 2106, and the like. Since a semiconductor film with high mobility can be formed by the present invention, a higher performance computer that displays high quality images can be completed.

Figure 18B:
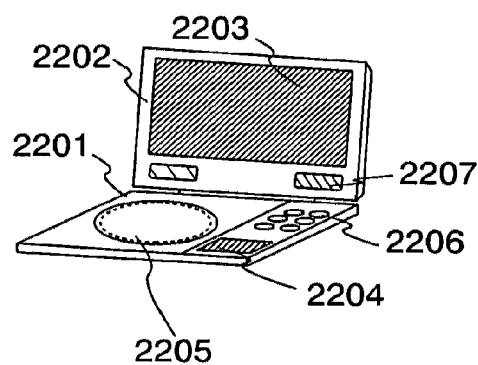

FIG. 18B shows an image reproducing device provided with a recording medium (specifically a DVD reproducing device), including a main body 2201, a housing 2202, a first display portion 2203, a second display portion 2204, a recording medium (such as a DVD) reading portion 2205, an operation key 2206, a speaker portion 2207, and the like. The first display portion 2203 mainly displays image information and the second display portion 2204 mainly displays literal information. Since a semiconductor film with high mobility can be formed by the present invention, a higher performance image reproducing device that displays high quality images can be completed.

Figure 18C:
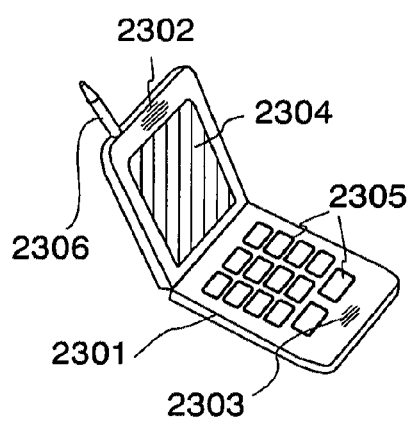

FIG. 18C shows a portable phone including a main body 2301, an audio output portion 2302, an audio input portion 2303, a display portion 2304, operation switches 2305, an antenna 2306, and the like. Since a semiconductor film with high mobility can be formed by the present invention, a higher performance portable phone that displays high quality images can be completed.

Figure 18D:
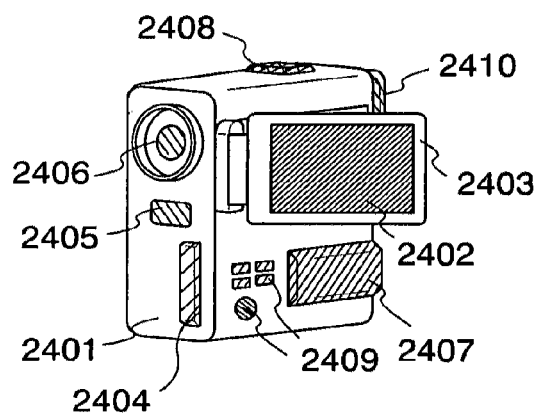

FIG. 18D shows a video camera including a main body 2401, a display portion 2402, a housing 2403, an external connection port 2404, a remote controlling portion 2405, an image receiving portion 2406, a battery 2407, an audio input portion 2408, operation keys 2409, an eye piece portion 2410, and the like. Since a semiconductor film with high mobility can be formed by the present invention, a higher performance video camera that displays high quality images can be completed. This embodiment mode can be freely combined with the foregoing embodiment modes.

Embodiment Mode 10

Figure 19A:
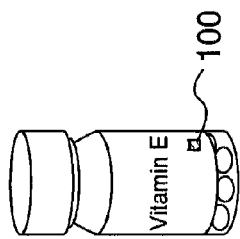
FIGS. 19A to 19F each describe a semiconductor device to which the present invention is applied.
Figure 19C:
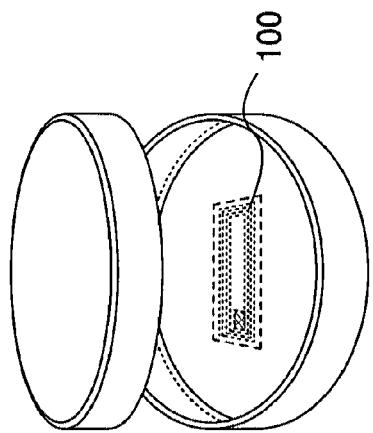
Figure 19E:
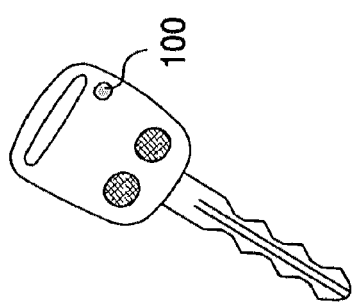
Figure 19B:
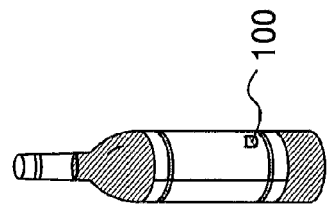
Figure 19D:
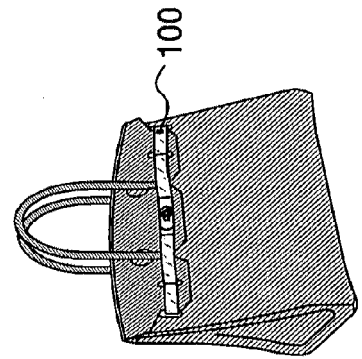
Figure 19F:
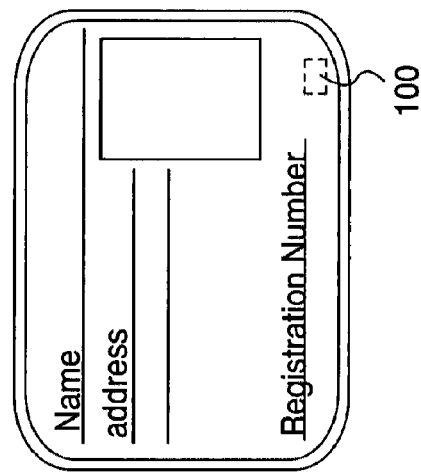

The semiconductor device 100 to which the present invention is applied can be used for a variety of items and systems by utilizing a function of transmitting and receiving an electromagnetic wave. As the items, the following are given: keys (see FIG. 19A), paper money, coins, securities, bearer bonds, certificates (such as a driver's license or a resident's card, see FIG. 19B), books, containers (such as a Petri dish, see FIG. 19C), packaging containers (such as wrapping paper or bottles, see FIGS. 19E and 19F), recording media (such as a disk or video tape), vehicles (such as a bicycle), personal accessories (such as shoes or eyeglasses, see FIG. 19D), food, clothing, livingware, electronic appliances (such as a liquid crystal display device, an EL display device, a television device, or a portable terminal), or the like. The semiconductor device of the present invention is fixed or mounted to items of a variety of forms such as those above by being attached or embedded on a surface. Further, a system refers to a goods management system, an authentication function system, a distribution system, or the like, and by using the semiconductor device of the present invention, the system can be more sophisticated, multifunctional, and high-value added. This embodiment mode can be freely combined with the other embodiment modes.

Embodiment 1

A polycrystalline semiconductor film formed by applying the present invention and using the method described in Embodiment Mode 1 is described below.

As a substrate, a glass substrate was used. First, a base film was formed over the glass substrate. The base film had a stacked layer structure, which was formed by stacking a silicon nitride oxide film formed with a film thickness of 50 nm over a silicon oxynitride film formed with a film thickness of 100 nm. A CVD method was used to form the base film.

Next, an amorphous silicon film was formed. The amorphous silicon film was formed by a CVD method using silane ($SiH_4$). A film thickness of the amorphous silicon film was 66 nm.

Then, before the amorphous silicon film was crystallized, a dehydrogenation step was performed. In the dehydrogenation step, heating was performed in a nitrogen atmosphere for one hour at 500° C., and then for four hours at 550° C. Thereafter, an oxide film on a surface was removed with diluted hydrofluoric acid.

Next, crystallization of the amorphous silicon film was performed. In this embodiment, laser light was used for crystallizing the amorphous silicon film.

Laser light used in this embodiment had oscillation frequency of 80 MHz (error range of ±1 MHz), wavelength of 532 nm, and output power of a laser device was 18.41 W. Also, a scanning speed of laser light was 210 mm per second. Further, power was made to be variable using an attenuator. Laser light that was emitted was made to be a linear laser, and a minor axis direction was 10 μm to 15 μm and a major axis direction was 500 μm.

Further, in this embodiment, laser irradiation was performed through the phase-shift mask having a stripe pattern shown in FIGS. 2A and 2B. A phase-shift mask used in this embodiment is shown in FIGS. 2A and 2B. A stripe pattern is formed by alternate appearance of a region of a concave portion with a width k1 and a region of a convex portion with a width k2. A quartz substrate was used. When laser light passed through the phase-shift mask, phase of laser light that passed through the convex portions 15 was not inverted, and phase of laser light that passed through the concave portions 16 was inverted 180°. Consequently, laser light with an intensity distribution that reflects the pattern of the phase-shift mask was obtained.

In this embodiment, laser light irradiation was performed using an optical system apparatus with a positional relationship as shown in the schematic diagram of FIGS. 3A and 3B. By using the optical system apparatus as shown in FIGS. 3A and 3B, it was possible to shape a beam to be linear.

The linear laser light obtained in the above manner reaches an irradiation surface through the foregoing phase-shift mask. Accordingly, intensity distribution of the laser light has a pattern that corresponds to the stripe pattern of the phase-shift mask. In this embodiment, k1 and k2 were each 3 μm.

As described in Embodiment Mode 1, as for a scanning direction of laser light, a scanning direction of a linear beam (minor axis direction) was not parallel to a stripe pattern of the phase-shift mask, and was tilted by an angle θ. This is to secure sufficient energy for completely melting an amorphous semiconductor film in a position where luminance of laser light that is emitted is the minimum. In this embodiment, since it was not possible to exactly adjust θ, it was adjusted to be in an appropriate angle range. Note that distance d between the phase-shift mask and the amorphous semiconductor film was 800 μm.

Figure 26A:
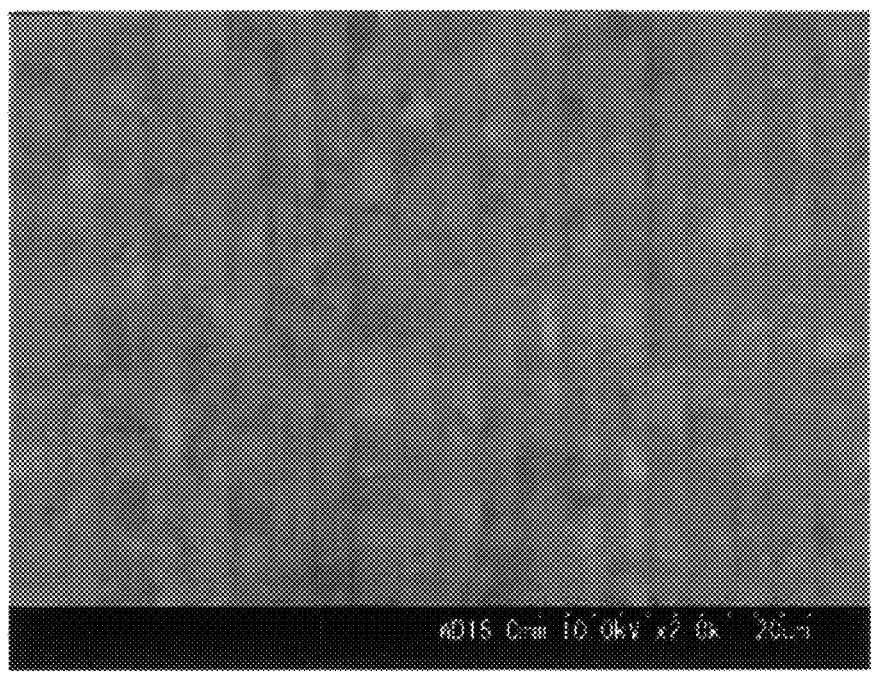
FIGS. 26A and 26B are each an observation result of a semiconductor device formed by applying the present invention.
Figure 26B:
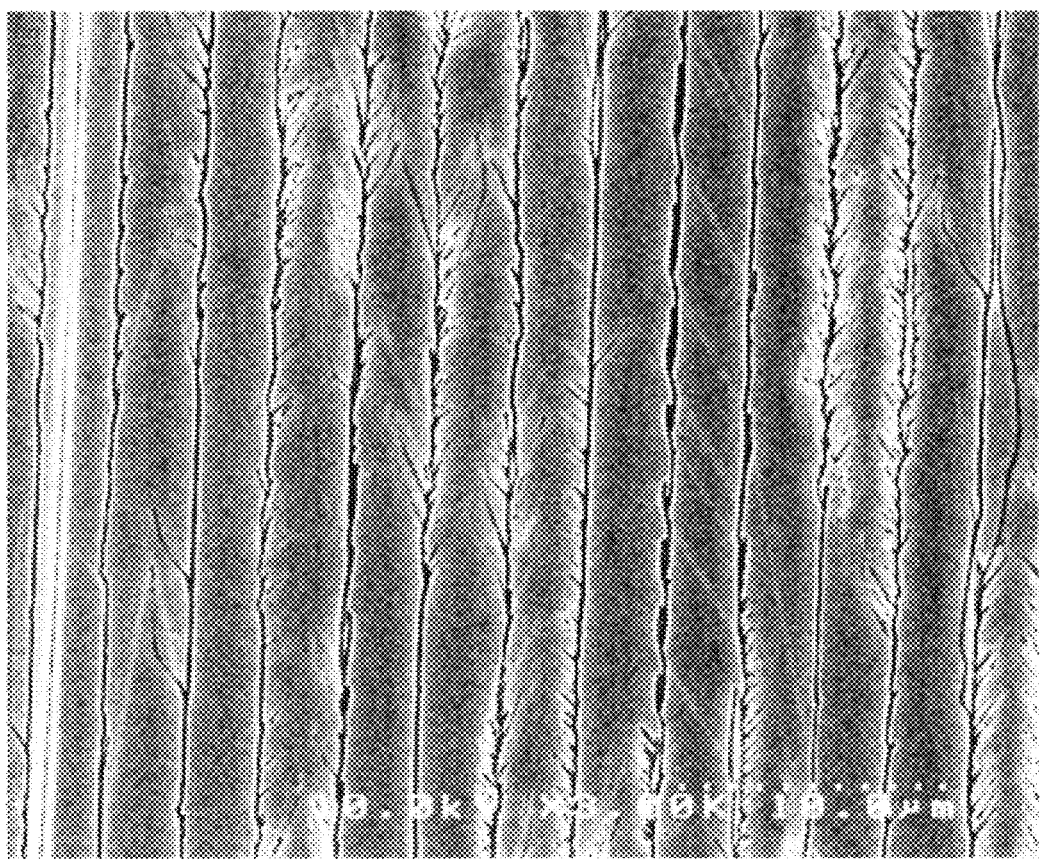

For the semiconductor film crystallized in the above manner, observation and measurement of crystal orientation of a surface of the sample were performed using an SEM (scanning electron microscope) method and an EBSP (electron back scatter diffraction pattern) method. Results thereof are shown in FIGS. 26A to 27B. FIG. 26A shows an SEM image of the semiconductor film crystallized by applying the present invention and using the phase-shift mask. FIG. 26B shows an SEM image (etching SEM image) obtained after etching the semiconductor film with a predetermined chemical solution. FIG. 27A shows a measurement result obtained by the EBSP method, of the semiconductor film crystallized by applying the present invention and using the phase-shift mask, and FIG. 27B shows a measurement result obtained by the EBSP method, of a semiconductor film crystallized without using the phase-shift mask. When FIG. 27A and FIG. 27B are compared to each other, a countless number of small-sized crystal grains exist in irregular directions in FIG. 27B. On the other hand, with the semiconductor film crystallized by applying the present invention shown in FIG. 27A, it is apparent that a region with a plurality of long and thin crystal grains occupies a large portion of the semiconductor film. Also, long axis directions of the crystal grains are basically all in one direction. Crystals with a large grain diameter that exist in the semiconductor film are about 20 μm to 50 μm in a major axis direction. In this manner, crystals come to have large grain diameters and form a crystal band. Also, it is apparent that crystal grain boundaries (boundaries between crystal bands) that run in a major axis direction of crystals are all in one direction, and that there is a constant interval of about 3 μm in a minor axis direction of the crystal grains. It is clear that such crystal grains occupy at least 90% of the area of the semiconductor film.

As described above, by applying the present invention, a polycrystalline semiconductor film formed of crystal bands including large-sized crystal grains, in which location of nucleation of crystals is controlled and the number of grain boundaries existing in one direction is small, can be obtained. By manufacturing such a crystalline semiconductor film, a semiconductor device with high mobility that has little grain boundaries in a channel length direction can be obtained.

Also, by using a region 200 including grain boundaries only in one direction, or a region 201 with no grain boundaries as a semiconductor layer of a thin film transistor, which are shown in FIG. 27A, a thin film transistor with a favorable electrical characteristic can be manufactured. Note that, the region 200 is a rectangular region with a length of 10 μm in a major axis direction and a length of 5 μm in a minor axis direction.

By manufacturing a thin film transistor using the region 200, the thin film transistor includes a plurality of crystal bands, and a line that is drawn in a direction Y through an arbitrary point (point Q) reaches from one end of the region 200 to another end without ever crossing a grain boundary or a boundary between crystal bands. By using such a region as the region 200 for a semiconductor layer of a thin film transistor, a thin film transistor with a favorable electrical characteristic can be manufactured.

Also, the region 201 is made of one crystal band, and crystal grain boundaries and boundaries between crystal bands do not exist in a region thereof. By using such a region as the region 201 for a semiconductor layer of a thin film transistor, a thin film transistor with an extremely favorable electrical characteristic can be manufactured in a similar manner to when a monocrystalline semiconductor is used.

Among crystalline semiconductor layers with large crystal size which are manufactured by applying the present invention, by manufacturing a thin film transistor using one crystal grain in particular, a thin film transistor with dramatically improved electrical characteristic compared to a conventional thin film transistor can be manufactured. According to FIGS. 27A and 27B, a width of a crystal band is about 3 μm, a length of a crystal grain in the crystal band is longer than its width, and size of the crystal grain is about 3 μm in width and about 20 μm in length; therefore, a thin film transistor of such a size can be manufactured.

Accordingly, by applying the present invention, a high performance and high-value added semiconductor device can be manufactured over a glass substrate.

Note that the mode of a sample and condition for crystallization described in this embodiment are one example in implementing the present invention, and the present invention is not limited to the condition of this embodiment.

This application is based on Japanese Patent Application serial No. 2006-236105 filed in Japan Patent Office on Aug. 31, 2006, the entire contents of which are hereby incorporated by reference.

What is claimed is:

1. A manufacturing method of a thin film transistor by using a CW laser light or a pseudo CW laser light, comprising:
    forming an amorphous semiconductor film over a substrate having an insulating surface;
    spatially modulating a light intensity of a linear-shaped laser light with an optical intensity modulator that periodically modulates in a major axis direction of the laser light; and
    irradiating the amorphous semiconductor film with the laser light to form a polycrystalline semiconductor film including a crystal band that grows in a scanning direction of the laser light by completely melting the amorphous semiconductor film,
    wherein the optical intensity modulator is a phase-shift mask having a trench in a direction that tilts off a direction parallel to a scanning direction of the laser light by a certain angle,
    wherein a value of light intensity that is periodically modulated in the major axis direction of the laser light has a maximum value and a minimum value in the major axis direction, and
    wherein the certain angle is adjusted so that the minimum value is more than or equal to 80% of the maximum value.

2. A manufacturing method of a thin film transistor by using a CW laser light or a pseudo CW laser light, comprising:
    forming an amorphous semiconductor film over a substrate having an insulating surface;
    spatially modulating a light intensity of a linear-shaped laser light with an optical intensity modulator that periodically modulates in a major axis direction of the laser light;
    irradiating the amorphous semiconductor film with the laser light to form a polycrystalline semiconductor film including a crystal band that grows in a scanning direction of the laser light by completely melting the amorphous semiconductor film; and
    introducing an impurity into a portion of the polycrystalline semiconductor film to form a source region and a drain region,
    wherein at least one of crystal bands included in the polycrystalline semiconductor film has the source region, a channel forming region, and the drain region in the crystal band,
    wherein a channel length direction of the channel forming region is basically parallel to a major axis direction of the crystal band, and a line that extends from the source region to the drain region can be drawn without crossing a boundary line of the crystal band, wherein the optical intensity modulator is a phase-shift mask having a trench in a direction that tilts off a direction parallel to a scanning direction of the laser light by a certain angle, wherein a value of light intensity that is periodically modulated in the major axis direction of the laser light has a maximum value and a minimum value in the major axis direction, and wherein the certain angle is adjusted so that the minimum value is more than or equal to 80% of the maximum value.

3. The manufacturing method of the thin film transistor according to claim 1 or 2, wherein the optical intensity modulator is a phase-shift mask having a trench in a direction that basically matches a major axis direction of the laser light.

4. The manufacturing method of the thin film transistor according to claim 3, wherein the phase-shift mask is a light transmitting substrate with a stripe pattern in which grooves are formed with a certain interval.

5. The manufacturing method of a thin film transistor according to claim 4, wherein the light transmitting substrate is a quartz substrate.

6. The manufacturing method of a thin film transistor according to claim 4, wherein the certain interval between the grooves has the same length as a width of the grooves.

7. The manufacturing method of the thin film transistor according to claim 1 or 2, wherein the phase-shift mask is a light transmitting substrate with a stripe pattern in which grooves are formed with a certain interval.

8. The manufacturing method of a thin film transistor according to claim 7, wherein the light transmitting substrate is a quartz substrate.

9. The manufacturing method of a thin film transistor according to claim 7, wherein the certain interval between the grooves has the same length as a width of the grooves.

10. The manufacturing method of a thin film transistor according to claim 1 or 2, wherein the amorphous semiconductor film and the polycrystalline semiconductor film are made of silicon.

11. The manufacturing method of a thin film transistor according to claim 1 or 2, wherein the crystallization is performed by using an element that promotes the crystallization.

12. The manufacturing method according to claim 1 or 2, wherein the thin film transistor is incorporated in a liquid crystal display device or an EL display device.

13. The manufacturing method according to claim 1 or 2, wherein the thin film transistor is incorporated in one selected from the group consisting of a computer, an image reproducing device, a mobile phone and a camera.

14. The manufacturing method according to claim 1 or 2, wherein the thin film transistor is incorporated in one selected from the group consisting of an RFID tag, a photoelectric conversion device, and a CPU.

15. The manufacturing method according to claim 1 or 2, wherein the crystal band grows longest in the scanning direction of the laser light.

* * * * *